United States Patent
Lee et al.

(10) Patent No.: US 12,419,175 B2
(45) Date of Patent: *Sep. 16, 2025

(54) DISPLAY DEVICE, MASK ASSEMBLY, AND APPARATUS FOR MANUFACTURING DISPLAY DEVICE

(71) Applicant: Samsung Display Co., Ltd., Yongin-si (KR)

(72) Inventors: Sangshin Lee, Yongin-si (KR); Jongsung Park, Yongin-si (KR); Seungjin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 808 days.

This patent is subject to a terminal disclaimer.

(21) Appl. No.: 17/117,653

(22) Filed: Dec. 10, 2020

(65) Prior Publication Data

US 2021/0175299 A1      Jun. 10, 2021

(30) Foreign Application Priority Data

Dec. 10, 2019 (KR) .................. 10-2019-0163773
Nov. 9, 2020 (KR) .................. 10-2020-0148894

(51) Int. Cl.
*H10K 59/35*    (2023.01)
*H10K 71/16*    (2023.01)

(52) U.S. Cl.
CPC ......... *H10K 59/353* (2023.02); *H10K 71/166* (2023.02)

(58) Field of Classification Search
CPC ............................... H10K 59/351–353
See application file for complete search history.

(56) References Cited

U.S. PATENT DOCUMENTS

| | | |
|---|---|---|
| 6,950,115 B2 | 9/2005 | Brown Elliott |
| 7,755,652 B2 | 7/2010 | Credelle et al. |
| 9,013,098 B1 | 4/2015 | Kim et al. |
| 9,459,747 B2 | 10/2016 | Donnelly et al. |

(Continued)

FOREIGN PATENT DOCUMENTS

| | | |
|---|---|---|
| CN | 102262854 A | 11/2011 |
| CN | 206076238 U | 4/2017 |

(Continued)

OTHER PUBLICATIONS

Search Report issued in related European Application No. 20212999.5, dated Jul. 6, 2021, 18 pages.

(Continued)

*Primary Examiner* — Eric K Ashbahian
(74) *Attorney, Agent, or Firm* — Womble Bond Dickinson (US) LLP

(57) ABSTRACT

A display device includes a first sub-pixel having a quadrangular shape; a second sub-pixel arranged to face a side of the first sub-pixel, the second sub-pixel having a quadrangular shape; and a third sub-pixel arranged to face a side of the first sub-pixel and spaced apart from the second sub-pixel, the third sub-pixel having a quadrangular shape, wherein a distance from the second sub-pixel to the side of the first sub-pixel that the second sub-pixel faces and a distance from the third sub-pixel to the side of the first sub-pixel that the third sub-pixel faces are different from each other.

45 Claims, 44 Drawing Sheets

(56) References Cited

U.S. PATENT DOCUMENTS

| | | |
|---|---|---|
| 9,508,778 B2 | 11/2016 | Kim et al. |
| 9,697,760 B2 | 7/2017 | Wang |
| 9,818,803 B2 | 11/2017 | Lee |
| 9,935,155 B2 | 4/2018 | Huangfu et al. |
| 9,993,335 B2 | 6/2018 | Deering et al. |
| 10,007,968 B2 | 6/2018 | Jo et al. |
| 10,043,433 B2 | 8/2018 | Sun |
| 10,104,324 B2 | 10/2018 | Hirota |
| 10,418,428 B2 | 9/2019 | Jung |
| 10,563,301 B2 | 2/2020 | Hong |
| 10,680,042 B2 | 6/2020 | Zhang |
| 10,694,129 B2 | 6/2020 | Cote et al. |
| 11,081,531 B2 | 8/2021 | Cho |
| 11,257,869 B2 | 2/2022 | Luo et al. |
| 11,302,750 B2 | 4/2022 | Feng et al. |
| 11,329,103 B2 | 5/2022 | Kim et al. |
| 11,342,384 B2 | 5/2022 | Wang et al. |
| 11,417,714 B2 | 8/2022 | Lee et al. |
| 11,557,635 B2 * | 1/2023 | Lee .................. H10K 50/84 |
| 2005/0231447 A1 | 10/2005 | Hu et al. |
| 2008/0231554 A1 | 9/2008 | Lee |
| 2009/0121983 A1 | 5/2009 | Sung et al. |
| 2011/0260952 A1 | 10/2011 | Hwang et al. |
| 2011/0291549 A1 | 12/2011 | Kim et al. |
| 2012/0056531 A1 * | 3/2012 | Park .................. H10K 50/125 |
| | | 313/506 |
| 2012/0193515 A1 | 8/2012 | Agranov et al. |
| 2013/0057521 A1 | 3/2013 | Kim |
| 2014/0065293 A1 | 3/2014 | Kim et al. |
| 2014/0071030 A1 | 3/2014 | Lee |
| 2014/0197385 A1 | 7/2014 | Madigan |
| 2014/0197396 A1 | 7/2014 | Madigan |
| 2014/0198479 A1 | 7/2014 | Chao et al. |
| 2014/0284570 A1 | 9/2014 | Jinta et al. |
| 2014/0292622 A1 | 10/2014 | Lee |
| 2015/0011033 A1 | 1/2015 | Ko |
| 2015/0015465 A1 | 1/2015 | Gong |
| 2015/0048322 A1 | 2/2015 | So et al. |
| 2015/0070374 A1 | 3/2015 | Gong |
| 2015/0076455 A1 | 3/2015 | Mizusaki et al. |
| 2015/0102297 A1 | 4/2015 | Lee |
| 2015/0138463 A1 | 5/2015 | Jinta et al. |
| 2015/0179713 A1 | 6/2015 | Lee et al. |
| 2015/0214280 A1 | 7/2015 | Furuie |
| 2015/0270317 A1 | 9/2015 | Lee et al. |
| 2015/0311265 A1 * | 10/2015 | Matsueda .......... H10K 59/353 |
| | | 257/89 |
| 2015/0311268 A1 | 10/2015 | Cheng |
| 2015/0380471 A1 | 12/2015 | Guo et al. |
| 2016/0078807 A1 | 3/2016 | Sun et al. |
| 2016/0126295 A1 | 5/2016 | Sato |
| 2016/0141351 A1 | 5/2016 | You |
| 2016/0155777 A1 | 6/2016 | Kabe et al. |
| 2016/0203748 A1 | 7/2016 | Matsueda et al. |
| 2016/0225833 A1 | 8/2016 | Kim |
| 2016/0225834 A1 | 8/2016 | Kim et al. |
| 2016/0247441 A1 | 8/2016 | Matsueda et al. |
| 2016/0253972 A1 | 9/2016 | Bai et al. |
| 2016/0254327 A1 | 9/2016 | Bai et al. |
| 2016/0276615 A1 | 9/2016 | Kitabayashi |
| 2016/0284290 A1 | 9/2016 | Tamaki et al. |
| 2016/0284769 A1 | 9/2016 | Chien et al. |
| 2016/0293678 A1 | 10/2016 | Wang |
| 2016/0293899 A1 | 10/2016 | Hong |
| 2016/0322432 A1 | 11/2016 | Yang et al. |
| 2016/0322433 A1 * | 11/2016 | Kim .................. H10K 59/353 |
| 2016/0323566 A1 | 11/2016 | Vdovin et al. |
| 2016/0329385 A1 | 11/2016 | Qiu et al. |
| 2016/0351116 A1 | 12/2016 | Sun |
| 2017/0003495 A1 | 1/2017 | De Greef et al. |
| 2017/0003496 A1 | 1/2017 | De Greef et al. |
| 2017/0004780 A1 | 1/2017 | De Greef et al. |
| 2017/0009971 A1 | 1/2017 | Chan et al. |
| 2017/0052643 A1 | 2/2017 | Iwami |
| 2017/0104040 A1 | 4/2017 | Huangfu et al. |
| 2017/0125486 A1 | 5/2017 | Chen |
| 2017/0133440 A1 | 5/2017 | Wang et al. |
| 2017/0134650 A1 | 5/2017 | Seger |
| 2017/0148990 A1 | 5/2017 | Ha |
| 2017/0170200 A1 | 6/2017 | Ikeda et al. |
| 2017/0179202 A1 | 6/2017 | Choi et al. |
| 2017/0200778 A1 | 7/2017 | Jeon et al. |
| 2017/0207285 A1 | 7/2017 | You et al. |
| 2017/0250208 A1 | 8/2017 | Kim |
| 2017/0269413 A1 | 9/2017 | Tamaki et al. |
| 2017/0317150 A1 | 11/2017 | Chung et al. |
| 2017/0324917 A1 | 11/2017 | Mlinar et al. |
| 2017/0369983 A1 | 12/2017 | Yi |
| 2018/0005561 A1 | 1/2018 | Moon et al. |
| 2018/0007324 A1 | 1/2018 | Chen et al. |
| 2018/0018047 A1 | 1/2018 | Iwami |
| 2018/0045968 A1 | 2/2018 | Wu |
| 2018/0045971 A1 | 2/2018 | Wu |
| 2018/0062079 A1 | 3/2018 | Ko et al. |
| 2018/0097038 A1 | 4/2018 | Lee et al. |
| 2018/0122332 A1 | 5/2018 | Ikeda et al. |
| 2018/0143358 A1 | 5/2018 | Kawashita et al. |
| 2018/0158882 A1 | 6/2018 | Kim et al. |
| 2018/0158889 A1 | 6/2018 | Kim |
| 2018/0166512 A1 | 6/2018 | Hack et al. |
| 2018/0190731 A1 | 7/2018 | Park et al. |
| 2018/0205040 A1 | 7/2018 | Kim et al. |
| 2018/0210277 A1 | 7/2018 | Wang et al. |
| 2018/0247984 A1 | 8/2018 | Wang et al. |
| 2018/0261797 A1 | 9/2018 | Lee |
| 2018/0269245 A1 | 9/2018 | Mlinar et al. |
| 2018/0302597 A1 | 10/2018 | Honda |
| 2018/0308915 A1 | 10/2018 | Motoyama et al. |
| 2018/0312957 A1 | 11/2018 | Zhang |
| 2019/0074329 A1 | 3/2019 | Kim et al. |
| 2019/0084986 A1 | 3/2019 | Ye et al. |
| 2019/0131333 A1 | 5/2019 | Borthakur et al. |
| 2019/0140030 A1 * | 5/2019 | Huangfu ............. H10K 59/122 |
| 2019/0206313 A1 | 7/2019 | Xia et al. |
| 2019/0206950 A1 | 7/2019 | Chen |
| 2019/0206951 A1 | 7/2019 | Xin et al. |
| 2019/0237520 A1 | 8/2019 | Tian |
| 2019/0252469 A1 | 8/2019 | Xiao et al. |
| 2019/0271878 A1 | 9/2019 | Tsuruda et al. |
| 2019/0296093 A1 | 9/2019 | Liu et al. |
| 2019/0299336 A1 | 10/2019 | Nashner |
| 2019/0302336 A1 | 10/2019 | Fattal et al. |
| 2019/0302919 A1 | 10/2019 | Clark et al. |
| 2019/0333418 A1 | 10/2019 | Kawashita |
| 2019/0339452 A1 | 11/2019 | Fattal et al. |
| 2019/0340970 A1 | 11/2019 | Kirisken |
| 2019/0355794 A1 | 11/2019 | Dai et al. |
| 2019/0355795 A1 | 11/2019 | Liu et al. |
| 2019/0378882 A1 * | 12/2019 | Zhang ................. H10K 59/351 |
| 2020/0020676 A1 | 1/2020 | Cok et al. |
| 2020/0043989 A1 | 2/2020 | Liu et al. |
| 2020/0043990 A1 | 2/2020 | Huangfu et al. |
| 2020/0045953 A1 | 2/2020 | Serrat et al. |
| 2020/0058713 A1 | 2/2020 | Zhang |
| 2020/0135123 A1 | 4/2020 | Hu et al. |
| 2020/0161352 A1 | 5/2020 | Takahashi et al. |
| 2020/0168674 A1 | 5/2020 | Tan et al. |
| 2020/0219967 A1 | 7/2020 | Lou et al. |
| 2020/0227489 A1 | 7/2020 | Kim et al. |
| 2020/0235173 A1 | 7/2020 | Nakamura |
| 2020/0235174 A1 | 7/2020 | Nakamura et al. |
| 2020/0251532 A1 * | 8/2020 | Zhao .................. H10K 59/352 |
| 2020/0258441 A1 | 8/2020 | Zhang et al. |
| 2020/0270739 A1 | 8/2020 | Jin et al. |
| 2020/0273924 A1 | 8/2020 | Xiao et al. |
| 2020/0279894 A1 | 9/2020 | Madigan |
| 2020/0286963 A1 | 9/2020 | Lee et al. |
| 2020/0321407 A1 | 10/2020 | Tang et al. |
| 2020/0335717 A1 | 10/2020 | Kim et al. |
| 2020/0350375 A1 | 11/2020 | Zhu et al. |
| 2020/0357322 A1 | 11/2020 | Wu et al. |
| 2020/0357861 A1 | 11/2020 | Wang et al. |
| 2020/0357862 A1 | 11/2020 | Wang et al. |
| 2020/0363905 A1 | 11/2020 | Jo et al. |

(56) References Cited

U.S. PATENT DOCUMENTS

| | | |
|---|---|---|
| 2020/0381492 A1 | 12/2020 | Ryu et al. |
| 2021/0026209 A1 | 1/2021 | Shin et al. |
| 2021/0036066 A1 | 2/2021 | Luo et al. |
| 2021/0050388 A1 | 2/2021 | Song |
| 2021/0066648 A1 | 3/2021 | Chung et al. |
| 2021/0067703 A1 | 3/2021 | Kadambala et al. |
| 2021/0080637 A1 | 3/2021 | Brick et al. |
| 2021/0083025 A1 | 3/2021 | Nakao et al. |
| 2021/0091151 A1 | 3/2021 | Lee et al. |
| 2021/0104578 A1 | 4/2021 | Jo et al. |
| 2021/0116801 A1 | 4/2021 | Ji |
| 2021/0134769 A1 | 5/2021 | Kam et al. |
| 2021/0135149 A1 | 5/2021 | Xin et al. |
| 2021/0143201 A1 | 5/2021 | Woehler |
| 2021/0143222 A1 | 5/2021 | Song et al. |
| 2021/0143230 A1 | 5/2021 | Wang et al. |
| 2021/0176492 A1 | 6/2021 | Kim |
| 2021/0191549 A1 | 6/2021 | Kim et al. |
| 2021/0200386 A1 | 7/2021 | Park |
| 2021/0202653 A1 | 7/2021 | Cho et al. |
| 2021/0225953 A1 | 7/2021 | Luo et al. |
| 2021/0241671 A1 | 8/2021 | Lee et al. |
| 2021/0255476 A1 | 8/2021 | Fattal |
| 2021/0264823 A1 | 8/2021 | Heo et al. |
| 2022/0262871 A1 | 8/2022 | Kim et al. |

FOREIGN PATENT DOCUMENTS

| | | |
|---|---|---|
| CN | 206322697 U | 7/2017 |
| CN | 104992959 B | 2/2018 |
| CN | 207966982 U | 10/2018 |
| EP | 2940752 A1 | 4/2015 |
| EP | 3706177 A1 | 9/2020 |
| KR | 10-2013-0044993 A | 5/2013 |
| KR | 10-2014-0035239 A | 3/2014 |
| KR | 10-2015-0053161 A | 5/2015 |
| KR | 10-2015-0124360 A | 11/2015 |
| KR | 10-2016-0117846 A | 10/2016 |
| KR | 10-2017-0038294 A | 4/2017 |
| KR | 10-2018-0084975 A | 7/2018 |
| KR | 10-1898366 B1 | 9/2018 |
| KR | 10-2020-0083620 A | 7/2020 |
| KR | 10-2020-0106589 A | 9/2020 |
| WO | 2019/134515 A1 | 7/2019 |

OTHER PUBLICATIONS

Corrected Notice of Allowability for U.S. Appl. No. 16/899,394 dated Feb. 18, 2022, 9 pages.
European Search Report for EP Application No. 20212999.5 dated Jul. 6, 2021, 18 pages.
European Search Report for European Patent Application No. 20159722.6 dated Aug. 7, 2020, 15 pages.
Notice of Allowance for U.S. Appl. No. 16/737,637 dated Apr. 20, 2022, 12 pages.
Notice of Allowance for U.S. Appl. No. 16/737,637 dated May 28, 2021, 12 pages.
Notice of Allowance for U.S. Appl. No. 16/737,637 dated Oct. 24, 2022, 14 pages.
Notice of Allowance for U.S. Appl. No. 16/899,394 dated Sep. 14, 2022, 13 pages.
Notice of Allowance for U.S. Appl. No. 16/899,394 dated Feb. 1, 2022, 11 pages.
Notice of Allowance for U.S. Appl. No. 16/899,394 dated May 16, 2022, 12 pages.
Notice of Allowance for U.S. Appl. No. 17/492,183 dated Aug. 9, 2022, 11 pages.
Notice of Allowance for U.S. Appl. No. 17/492,183 dated Nov. 23, 2022, 8 pages.
Office Action for U.S. Appl. No. 16/737,637 dated Dec. 16, 2020, 28 pages.
Office Action for U.S. Appl. No. 16/737,637 dated Jun. 1, 2022, 13 pages.
Office Action for U.S. Appl. No. 16/737,637 dated Oct. 15, 2021, 21 pages.
Office Action for U.S. Appl. No. 16/899,394 dated Sep. 16, 2021, 46 pages.
Search Opinion for EP Application No. 20212999.5 dated Jul. 6, 2021, 6 pages.

* cited by examiner

DISPLAY DEVICE, MASK ASSEMBLY, AND APPARATUS FOR MANUFACTURING DISPLAY DEVICE

CROSS-REFERENCE TO RELATED APPLICATIONS

This application claims priority to and the benefit of each of Korean Patent Application Nos. 10-2019-0163773, filed on Dec. 10, 2019, and 10-2020-0148894, filed on Nov. 9, 2020, the entire contents of both which are hereby incorporated by reference.

BACKGROUND

1. Field

One or more embodiments of the present disclosure relate to a display device, and more particularly, to a display device, a mask assembly, and an apparatus for manufacturing the display device.

2. Description of Related Art

Mobile electronic devices have a wide range of uses. Tablet personal computers (PCs) have been recently used as mobile electronic devices, in addition to small electronic devices such as mobile phones.

A mobile electronic device includes a display device for providing visual information such as images and/or moving images to users in order to support and/or provide various suitable functions. As components for driving a display device have recently become smaller, a portion occupied by a display device in an electronic device has increased in size, and display devices including a structure that may be bent (e.g., may be bendable) to have a certain angle different from a flat state has been developed.

SUMMARY

When the existing display device (e.g., a display device of the related art) is arranged in a vehicle or the like, glare may occur due to external light reflection and/or the like in the display device. In addition, in the existing mask assembly (e.g., a mask assembly of the related art) and an apparatus for manufacturing the existing display device, a deposition material is deposited on a substrate differently from a designed pattern because deformation of a mask sheet is out of an expected range when the mask sheet is under tension according to a pattern of an opening portion. As such, one or more aspects of one or more embodiments of the present disclosure are directed towards a display device having a precise pattern while reducing external light reflection, a mask assembly for manufacturing the display device, and an apparatus for manufacturing the display device. However, these aspects are merely examples and the scope of the present disclosure is not limited thereto.

Additional aspects will be set forth in part in the description which follows and, in part, will be apparent from the description, or may be learned by practice of the presented embodiments of the disclosure.

According to one or more embodiments, a display device includes a first sub-pixel having a quadrangular shape, a second sub-pixel arranged to face a first side and a second side of the first sub-pixel, the second sub-pixel having a quadrangular shape, and a third sub-pixel arranged to face a side of the first sub-pixel and spaced apart from the second sub-pixel, a third sub-pixel arranged to face a side of the first sub-pixel and spaced apart from the second sub-pixel, the third sub-pixel having a quadrangular shape, wherein a distance from one side (e.g., the first side) of the first sub-pixel to the second sub-pixel and a distance from one side (e.g., the first side) of the first sub-pixel to the third sub-pixel are different from each other.

At least a portion of the second sub-pixel and at least a portion of the third sub-pixel may be arranged within a length range of one of the first side and the second side.

A short side of the second sub-pixel may be parallel to the first side or the second side.

A short side of the third sub-pixel may be parallel to the first side or the second side.

A plurality of first sub-pixels, comprising the first sub-pixel, may be provided, and centers of a first set of the plurality of first sub-pixels may be arranged with each other on a straight line in a first direction and centers of a second set of the plurality of first sub-pixels may be arranged with each other in a serpentine shape in a second direction.

Each of the plurality of first sub-pixels may emit green light.

The first direction may be a direction parallel to a long side of the display device.

A plurality of second sub-pixels, comprising the second sub-pixel, may be provided and a plurality of third sub-pixels, comprising the third sub-pixel, may be provided, wherein centers of some of the plurality of second sub-pixels and/or some of the plurality of third sub-pixels may be arranged with each other on a straight line in one direction.

A plurality of second sub-pixels, comprising the second sub-pixel, may be provided and a plurality of third sub-pixels, comprising the third sub-pixel, may be provided, wherein centers of some of the plurality of second sub-pixels and/or some of the plurality of third sub-pixels may be arranged with each other in a serpentine shape in one direction.

A plurality of first sub-pixels, comprising the first sub-pixel, may be provided and may be arranged with each other in a first direction, wherein the second sub-pixel facing the first side and the second sub-pixel or the third sub-pixel facing the second side may be arranged to be symmetrical to each other with respect to a straight line connecting centers of the plurality of first sub-pixels arranged with each other in the first direction.

A length of a long side of the second sub-pixel and a length of a long side of the third sub-pixel may be equal to each other.

The display device may further include a spacer arranged between the first sub-pixel and the second sub-pixel and/or between the first sub-pixel and the third sub-pixel.

A shortest distance from the second sub-pixel to the spacer may be different from a shortest distance from the third sub-pixel to the spacer.

A short side of the second sub-pixel and/or a short side of the third sub-pixel may overlap an extension line of one side of the first sub-pixel and may be arranged on a straight line extending from one side of the first sub-pixel.

A plurality of first sub-pixels, comprising the first sub-pixel, may be provided and may be arranged with each other in a first direction, wherein a long side of the second sub-pixel or a long side of the third sub-pixel may form an angle of 45 degrees with respect to a straight line connecting centers of the plurality of first sub-pixels arranged with each other in the first direction.

An area of the first sub-pixel may be greater than at least one selected from an area of the second sub-pixel and an area of the third sub-pixel.

An area of the second sub-pixel and an area of the third sub-pixel may be different from each other.

An outline connecting a portion of an edge of the second sub-pixel to a portion of an edge of the third sub-pixel may be square.

A vertex of at least one selected from the first sub-pixel, the second sub-pixel, and the third sub-pixel may be chamfered.

The first sub-pixel may emit blue color light, one selected from the second sub-pixel and the third sub-pixel may emit red color light, and the other one selected from the second sub-pixel and the third sub-pixel may emit green color light.

According to one or more embodiments, a display device includes a plurality of first intermediate layers having quadrangular shapes and spaced apart from each other, a plurality of second intermediate layers having quadrangular shapes and spaced apart from each other, the plurality of second intermediate layers facing the plurality of first intermediate layers, respectively, and a plurality of third intermediate layers having quadrangular shapes and spaced apart from each other, the plurality of third intermediate layers facing the plurality of first intermediate layers, respectively, and being spaced apart from the plurality of second intermediate layers, wherein a distance from a side of each of the first intermediate layers to a respective one of the second intermediate layers and a distance from a side of each of the first intermediate layers to a respective one of the third intermediate layers are different from each other.

Each of the first intermediate layers, a respective one of the second intermediate layers, and a respective one of the third intermediate layers may include (e.g., be) materials that are to emit light of different colors when power is applied thereto.

Each of the second intermediate layers and a respective one of the third intermediate layers may be arranged in parallel with each other.

Centers of some of the plurality of second intermediate layers and centers of some of the plurality of third intermediate layers may be arranged with each other on a straight line.

A length of a long side of each of the second intermediate layers and a length of a long side of a respective one of the third intermediate layers may be equal to each other.

The display device may further include a spacer arranged between each of the first intermediate layers and a respective one of the second intermediate layers and/or between each of the first intermediate layers and a respective one of the third intermediate layers.

Shortest distances between second intermediate layers, which face a same first intermediate layer of the first intermediate layers from among the plurality of second intermediate layers, and the same first intermediate layer, or shortest distances between third intermediate layers, which face a same first intermediate layer of the first intermediate layers from among the plurality of third intermediate layers, and the same first intermediate layer may be different from each other.

According to one or more embodiments, a mask assembly includes a mask frame, and a plurality of mask sheets arranged on the mask frame under tension and sequentially arranged with each other along a side of the mask frame, wherein each of the plurality of mask sheets has a plurality of openings, wherein some of the plurality of openings are tilted in one direction with respect to a tensile direction of the mask sheet, the other ones of the plurality of openings are tilted in a different direction from the some of the plurality of openings, and centers of at least three of the plurality of openings are arranged in a serpentine shape in one direction.

Each of the plurality of openings may be arranged at an angle of 45 degrees with respect to the tensile direction of the mask sheet.

Centers of openings arranged with each other in the tensile direction of the mask sheet or in a direction normal to the tensile direction of the mask sheet from among the plurality of openings may be arranged in a line.

Centers of openings arranged with each other in the tensile direction of the mask sheet or in a direction normal to the tensile direction of the mask sheet from among the plurality of openings may be arranged in a serpentine shape.

Each of the plurality of openings may be square or rectangular.

A vertex of each of the plurality of openings may be chamfered.

According to one or more embodiments, an apparatus for manufacturing a display device includes a chamber in which a display substrate is arranged, a deposition source arranged in the chamber to supply a deposition material into the chamber, and a mask assembly arranged to face the deposition source to pass the deposition material to the display substrate in a pattern form, wherein the mask assembly includes: a mask frame, and a plurality of mask sheets arranged on the mask frame under tension and sequentially arranged with each other along a side of the mask frame, wherein each of the plurality of mask sheets has a plurality of openings, wherein some of the plurality of openings are tilted in one direction with respect to a tensile direction of the mask sheet, the other ones of the plurality of openings are tilted in a different direction from the some of the plurality of openings, and centers of at least three of the plurality of openings are arranged in a serpentine shape along one direction.

Each of the plurality of openings may be arranged at an angle of 45 degrees with respect to the tensile direction.

Centers of openings arranged with each other in the tensile direction of the mask sheet or in a direction normal to the tensile direction of the mask sheet from among the plurality of openings may be arranged with each other in a line.

Centers of openings arranged with each other in the tensile direction of the mask sheet or in a direction normal to the tensile direction of the mask sheet from among the plurality of openings may be arranged in a serpentine shape.

Each of the plurality of openings may be square or rectangular.

A vertex of each of the plurality of openings may be chamfered.

According to one or more embodiments, a display device includes a first sub-pixel, a second sub-pixel arranged to face the first sub-pixel, a third sub-pixel arranged to face the first sub-pixel and spaced apart from the second sub-pixel, and a spacer arranged between the first sub-pixel and the second sub-pixel and/or between the first sub-pixel and the third sub-pixel, wherein a distance from one side of the first sub-pixel facing the second sub-pixel and the third sub-pixel to the second sub-pixel is different from a distance from one side of the first sub-pixel to the third sub-pixel.

An area of the second sub-pixel may be equal to an area of the third sub-pixel.

An area of the second sub-pixel may be different from an area of the third sub-pixel.

The second sub-pixel and the third sub-pixel may be each rectangular, wherein a length of a long side of the second sub-pixel and a length of a long side of the third sub-pixel may be equal to each other.

A shortest distance from an edge of the spacer to the second sub-pixel and a shortest distance from the edge of the spacer to the third sub-pixel may be equal to each other.

A shortest distance between one at least one selected from the second sub-pixel and the third sub-pixel and an edge of the spacer may be equal to a shortest distance between the first sub-pixel and an edge of the spacer.

The second sub-pixel and the third sub-pixel may each be rectangular, wherein a distance between long sides of the first sub-pixel and the second sub-pixel facing each other, a distance between a long side of the second sub-pixel and a long side of the third sub-pixel facing each other, and a distance between a long side of the third sub-pixel and a long side of another first sub-pixel facing each other may all be equal to one another.

According to one or more embodiments, a display device includes a first sub-pixel, a second sub-pixel arranged to face one side of the first sub-pixel, and a third sub-pixel arranged to face one side of the first sub-pixel and spaced apart from the second sub-pixel, wherein one side of at least one selected from the first sub-pixel, the second sub-pixel, and the third sub-pixel is convex or concave, and the second sub-pixel and the third sub-pixel are adjacent to each other and are arranged to face the same side of the first sub-pixel.

One side of the second sub-pixel and one side of the third sub-pixel, which face each other, may be straight.

At least one selected from one side of the second sub-pixel and one side of the third sub-pixel, which face each other, may protrude from a respective center of at least one selected from the second sub-pixel and the third sub-pixel.

A plurality of first sub-pixels, comprising the first sub-pixel, may be provided, and wherein a tangent line to a point on one convex or concave side of the first sub-pixel may intersect or cross a branch line at an angle ranging from about 20 degrees to about 70 degrees, the branch line passing through or being parallel to a line passing through centers of first sub-pixels arranged with each other in a first direction from among the plurality of first sub-pixels.

At least one selected from a distance between one side of the first sub-pixel and one side of the second sub-pixel facing each other, a distance between one side of the second sub-pixel and one side of the third sub-pixel facing each other, and a distance between one side of the first sub-pixel and one side of the third sub-pixel facing each other may be constant along a length direction of each side.

One selected from one side of the first sub-pixel, one side of the second sub-pixel, and one side of the third sub-pixel may be convex, and another one selected from the one side of the first sub-pixel, the one side of the second sub-pixel, and the one side of the third sub-pixel, the other one side facing the one selected from the one side of the first sub-pixel, the one side of the second sub-pixel, and the one side of the third sub-pixel may be concave.

At least one selected from the second sub-pixel and the third sub-pixel may have a long side and a short side, and the long side may be convex or concave.

A corner of at least one selected from the first sub-pixel, the second sub-pixel, and the third sub-pixel may be chamfered.

A planar area of one selected from the first sub-pixel, the second sub-pixel, and the third sub-pixel may be different from a planar area of another one selected from the first sub-pixel, the second sub-pixel, and the third sub-pixel.

One side of at least one selected from the first sub-pixel, the second sub-pixel, and the third sub-pixel may be curved.

At least one selected from the first sub-pixel, the second sub-pixel, and the third sub-pixel may be arranged to be tilted in one direction.

The above and other aspects and features of certain embodiments of the disclosure will be more apparent from the following description, the accompanying drawings, and claims.

This general and specific aspects may be implemented by a system, a method, a computer program, or a certain combination of a system, a method, and a computer program.

BRIEF DESCRIPTION OF THE DRAWINGS

The above and other aspects and features of certain embodiments of the disclosure will become more apparent from the following description taken in conjunction with the accompanying drawings, in which.

DETAILED DESCRIPTION

Figure 1A:
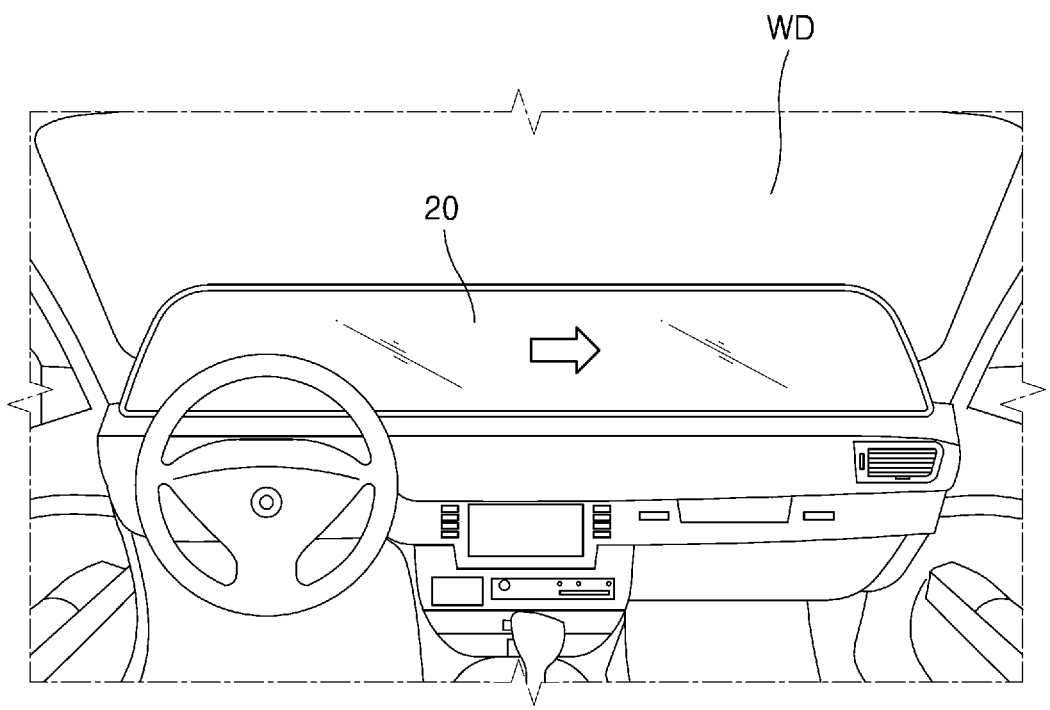
FIG. 1A is a perspective view illustrating a case where a display device according to an embodiment is arranged in a vehicle.
Figure 1A:
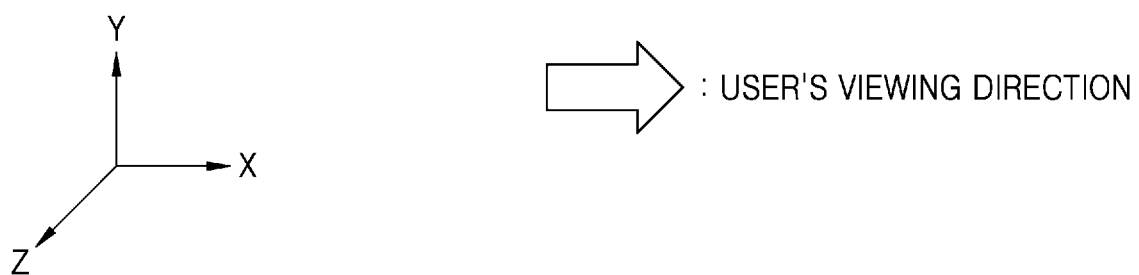

Reference will now be made in more detail to some embodiments of the present disclosure, examples of which are illustrated in the accompanying drawings, wherein like reference numerals refer to like elements throughout. In this regard, the present embodiments may have different suitable forms and should not be construed as being limited to the descriptions set forth herein. Accordingly, the embodiments are merely described below, by referring to the drawings, to explain aspects and features of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. As used herein, the use of the term "may," when describing embodiments of the present disclosure, refers to "one or more embodiments of the present disclosure."

As the present description allows for various suitable changes and numerous embodiments, certain embodiments will be illustrated in the drawings and described in the written description. Aspects and features of one or more embodiments and methods of accomplishing the same will become more apparent from the following detailed description of the one or more embodiments, taken in conjunction with the accompanying drawings. However, the present embodiments may have different suitable forms and the present disclosure should not be construed as being limited to the descriptions set forth herein.

Hereinafter, the present embodiments are described in more detail with reference to the accompanying drawings. In the drawings, the same reference numerals are given to the same or corresponding elements, and a repeated description thereof may not be provided.

It will be understood that although terms such as "first" and "second" may be used herein to describe various components, these components should not be limited by these terms, and these terms are only used to distinguish one component from another component.

Also, as used herein, the singular forms "a," "an," and "the" are intended to include the plural forms as well, unless the context clearly indicates otherwise.

Also, it will be understood that the terms "comprise," "include," and "have" used herein specify the presence of stated features and/or components, but do not preclude the presence or addition of one or more other features and/or components.

Also, it will be understood that when a layer, region, or component is referred to as being "on" another layer, region, or component, it may be "directly" or "indirectly" on the other layer, region, or component. For example, one or more intervening layers, regions, or components may be located therebetween.

Sizes of components in the drawings may be exaggerated for convenience of description. For example, because the sizes and thicknesses of components in the drawings may be exaggerated for convenience of description, the present disclosure is not limited thereto. As used herein, and except as otherwise defined, the term "substantially," "about,"

"approximately," and similar terms are used as terms of approximation and not as terms of degree, and are intended to account for the inherent deviations in measured or calculated values that would be recognized by those of ordinary skill in the art.

The X-axis, the Y-axis, and the Z-axis are not limited to three axes of a rectangular coordinate system and may be interpreted in a broader sense. For example, the X-axis, the Y-axis, and the Z-axis may be perpendicular to each other, or may represent different directions that are not perpendicular to each other.

When a certain embodiment may be implemented differently, a disclosed process order may be performed differently from the described order. For example, two consecutively described processes (e.g., two processes described as being consecutively performed) may be performed substantially at the same time or performed in an order opposite to the described order.

Figure 1B:
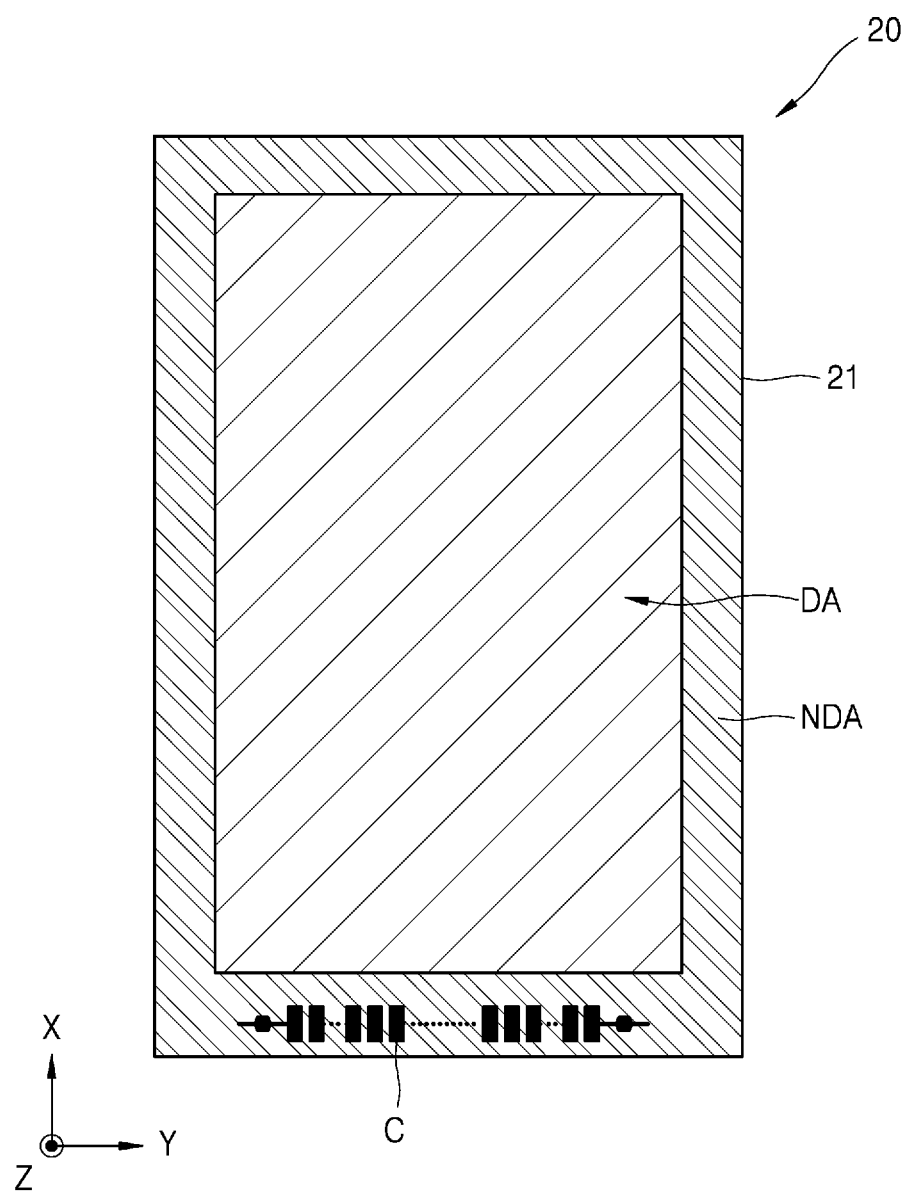
FIG. 1B is a plan view of a display device according to an embodiment.
Figure 2:
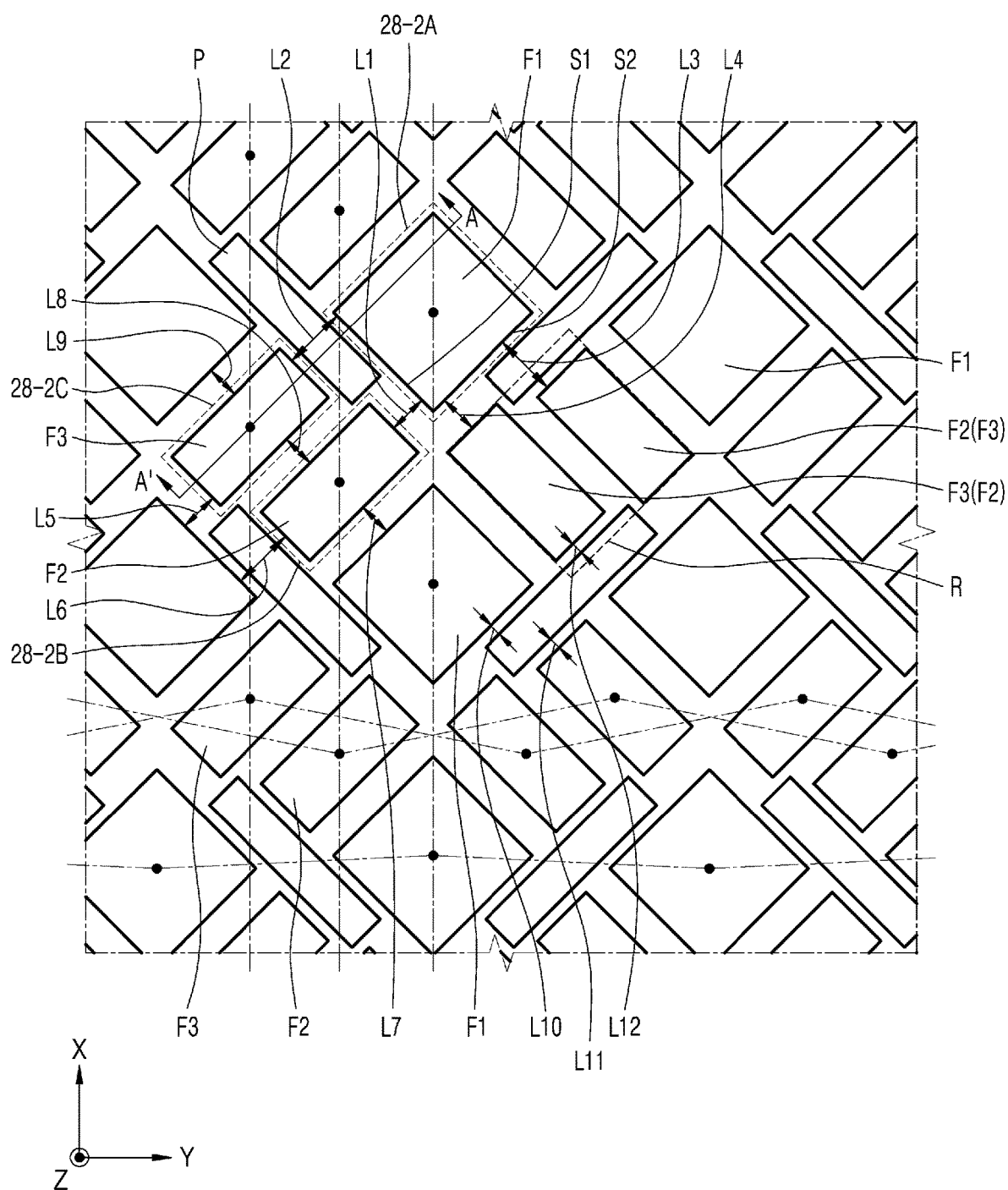
FIG. 2 is a plan view illustrating a first sub-pixel, a second sub-pixel, and a third sub-pixel of the display device shown in FIG. 1B.
Figure 3:
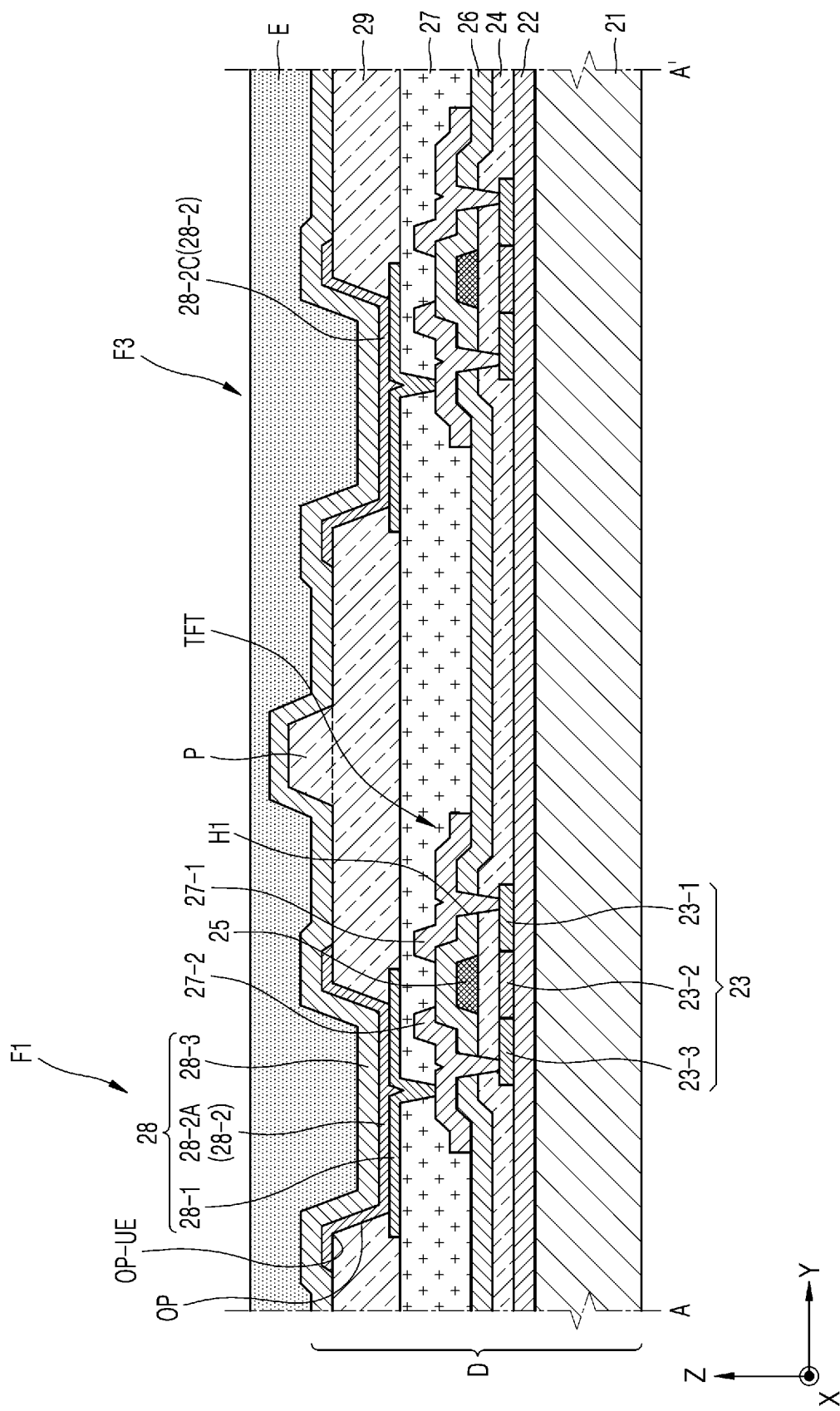
FIG. 3 is a cross-sectional view of the display device taken along line A-A' of FIG. 2.

FIG. 1A is a perspective view illustrating a case where a display device according to an embodiment is arranged in a vehicle. FIG. 1B is a plan view of a display device according to an embodiment. FIG. 2 is a plan view illustrating a first sub-pixel, a second sub-pixel, and a third sub-pixel of the display device shown in FIG. 1B. FIG. 3 is a cross-sectional view of the display device taken along line A-A' of FIG. 2.

Referring to FIGS. 1A to 3, a display device 20 may include a display area DA and a non-display area NDA defined on a substrate 21, the non-display area NDA being around (e.g., partially or entirely surrounding) the display area DA. A light-emitting portion may be arranged in the display area DA, and a power line and the like may be arranged in the non-display area NDA. Furthermore, a pad portion C may be arranged in the non-display area NDA.

The display area DA may have various suitable shapes. For example, the display area DA may have a shape such as a rectangle, a square, a polygon, or a circle. However, the display area DA may have any suitable shape, such as, for example, an irregular shape other than a rectangle, a square, a polygon, a circle, and the like. However, for convenience of description, a case where the display area DA has a rectangular shape will be described in more detail later below.

The display device 20 may be arranged inside a vehicle, an airplane, or the like. In this case, the display device 20 may display various suitable types (e.g., kinds) of images, characters, and/or the like. Hereinafter, for convenience of description, a case where the display device 20 is arranged inside a vehicle will be described in more detail.

In general, the display device 20 may be arranged at an angle to an interior material of a vehicle. In this case, the display device 20 may have various suitable shapes. For example, the display device 20 may have a round outer surface. As another embodiment, the display device 20 may have a circular or polygonal shape. Hereinafter, for convenience of description, a case in which the display device 20 has a rectangular shape will be described in more detail.

The display device 20 as described above may have a rectangular or square shape. In this case, the display device 20 may have a short side and a long side. The long side of the display device 20 or the short side of the display device 20 may be arranged to be adjacent to a window WD of the vehicle.

The display device 20 may include a display substrate D and a thin-film encapsulation layer E. The display substrate D may include the substrate 21, a thin-film transistor (TFT), a passivation film 27, and a pixel electrode 28-1. In another embodiment, the display substrate D may include some of the substrate 21, the thin-film transistor TFT, the passivation film 27, the pixel electrode 28-1, and an intermediate layer 28-2.

The substrate 21 may include (e.g., be) a plastic material, and/or a metal material such as stainless steel (SUS) and/or titanium. The substrate 21 may include (e.g., be) a high molecular resin, such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 21 may have a single layer or multilayer structure including (e.g., being) the material (e.g., one or more of the above-describe materials). In the case of the multilayer structure, the substrate 21 may further include an inorganic layer. For convenience of description, a case where the substrate 21 includes (e.g., is) polyimide will be mainly described in more detail later below.

The thin-film transistor TFT may be formed on the substrate 21, the passivation film 27 may be formed to cover the thin-film transistor TFT, and an organic light-emitting device 28 may be formed on the passivation film 27.

A buffer layer 22 may be further formed on a top surface of the substrate 21, the buffer layer 22 including (e.g., being) an organic compound and/or an inorganic compound (e.g., SiOx ($SiO_x$) ($x \geq 1$) and/or SiNx ($SiN_x$) ($x \geq 1$)).

After an active layer 23 is formed on the buffer layer 22 in a certain pattern, the active layer 23 may be covered by a gate insulating layer 24. The active layer 23 includes a source region 23-1 and a drain region 23-3, and further includes a channel region 23-2 therebetween.

The active layer 23 may include (e.g., be) various suitable materials. For example, the active layer 23 may include (e.g., be) an inorganic semiconductor material such as amorphous silicon and/or crystalline silicon. As another example, the active layer 23 may include (e.g., be) an oxide semiconductor. As another example, the active layer 23 may include (e.g., be) an organic semiconductor material. However, for convenience of description, a case where the active layer 23 includes (e.g., is) amorphous silicon will be described in more detail later below.

The active layer 23 may be formed by forming an amorphous silicon film on the buffer layer 22, crystallizing the amorphous silicon film into a polycrystalline silicon film, and patterning the polycrystalline silicon film. The source region 23-1 and the drain region 23-3 of the active layer 23 may be doped with impurities according to a type (e.g., kind) of the thin-film transistor TFT, such as a driving thin-film transistor or a switching thin-film transistor.

A gate electrode 25 that corresponds to the active layer 23 (e.g., overlaps the active layer 23, for example, the channel region 23-2 of the active layer 23) and an interlayer insulating layer 26 that covers the gate electrode 25 may be formed on a top surface of the gate insulating layer 24.

After a contact hole H1 is formed in the interlayer insulating layer 26 and the gate insulating layer 24, a source electrode 27-1 and a drain electrode 27-2 may be formed on the interlayer insulating layer 26 to respectively contact the source region 23-1 and the drain region 23-3. In some embodiments, the source electrode 27-1 and the drain electrode 27-2 may respectively contact the source region 23-1 and the drain region 23-3 through respective contact holes in the interlayer insulating layer 26 and the gate insulating layer 24.

The passivation film 27 may be formed on the thin-film transistor TFT, and a pixel electrode 28-1 of the organic light-emitting device 28 may be formed on the passivation film 27. The pixel electrode 28-1 may contact the drain electrode 27-2 of the thin-film transistor TFT through a via hole H2 formed in the passivation film 27. The passivation film 27 may include (e.g., be) an inorganic material and/or an organic material and have a single-layer structure or a multi-layer structure. The passivation film 27 may be formed as a planarization film having a flat top surface regardless of a curved shape of a lower film below the passivation film 27 or may be curved along the curved shape of the lower film. The passivation film 27 may include (e.g., be) a transparent insulator to achieve a resonance effect.

After the pixel electrode 28-1 is formed on the passivation film 27, a pixel-defining layer 29 may be formed of an organic material and/or an inorganic material to cover the pixel electrode 28-1 and the passivation film 27, and the pixel-defining layer 29 may be opened to expose the pixel electrode 28-1 to the outside through an opening OP of the pixel-defining layer 29. For example, the pixel-defining layer 29 may cover a portion (e.g., an edge) of the pixel electrode 28-1 and the opening OP may expose another portion (e.g., a center portion) of the pixel electrode 28-1.

The intermediate layer 28-2 and an opposite electrode 28-3 may be formed on at least the pixel electrode 28-1. In some embodiments, the opposite electrode 28-3 may be formed on the entire surface of the display substrate D. For example, the opposite electrode 28-3 may be a common electrode. The opposite electrode 28-3 may be formed on the intermediate layer 28-2 and the pixel-defining layer 29. Hereinafter, for convenience of description, a case where the opposite electrode 28-3 is formed on the intermediate layer 28-2 and the pixel-defining layer 29 will be mainly described in more detail.

The pixel electrode 28-1 may function as an anode, and the opposite electrode 28-3 may function as a cathode. Polarities of the pixel electrode 28-1 and the opposite electrode 28-3 may be switched.

The pixel electrode 28-1 and the opposite electrode 28-3 may be insulated from each other by the intermediate layer 28-2, and voltages of different polarities may be applied to the intermediate layer 28-2 such that an organic emission layer emits light.

The intermediate layer 28-2 may include an organic emission layer. In some embodiments, the intermediate layer 28-2 may include an organic emission layer and may further include at least one selected from a hole injection layer (HIL), a hole transport layer (HTL), an electron transport layer (ETL), and an electron injection layer (EIL), which, together with the organic emission layer, may be arranged with each other in any suitable stacking sequence. However, the present disclosure is not limited thereto. For example, the intermediate layer 28-2 may include an organic emission layer and may further include various suitable functional layers.

A plurality of intermediate layers 28-2 may be provided, and the plurality of intermediate layers 28-2 may form the display area DA. The plurality of intermediate layers 28-2 may be arranged to be spaced apart from each other in the display area DA.

One unit pixel may include a plurality of sub-pixels. The plurality of sub-pixels may emit light of various suitable colors. In an embodiment, one sub-pixel may be defined as a region in which light having one color is emitted. In another embodiment, one sub-pixel may be defined as a portion of the pixel electrode 28-1 that is exposed to the outside through an opened area of the pixel-defining layer 29. In this case, adjusting the size of one sub-pixel may be achieved by adjusting the area of the portion of the pixel electrode 28-1 that is exposed to the outside by adjusting the size of the opened area of the pixel-defining layer 29. Hereinafter, for convenience of description, a case where one sub-pixel is a region in which light having one color is emitted will be mainly described in more detail.

The plurality of sub-pixels may include sub-pixels to emit red, green, and blue light, respectively. In another embodiment, the plurality of sub-pixels may include sub-pixels to emit red, green, blue, and white light, respectively. In another embodiment, the plurality of sub-pixels may include sub-pixels to emit red, yellow, and blue light, respectively. The plurality of sub-pixels are not limited to those described above, and may include all suitable cases including sub-pixels to emit light of different colors. Hereinafter, for convenience of description, a case where a plurality of sub-pixels include sub-pixels to emit blue light, red light, and green light, respectively will be mainly described in more detail.

The plurality of sub-pixels may include a first sub-pixel F1, a second sub-pixel F2, and a third sub-pixel F3. Each of the first sub-pixel F1, the second sub-pixel F2, and the third sub-pixel F3 may have a quadrangular shape. In this case, one selected from the first sub-pixel F1, the second sub-pixel F2, and the third sub-pixel F3 may have a quadrangle shape having four sides having substantially the same length, and the other two selected from the first sub-pixel F1, the second sub-pixel F2, and the third sub-pixel F3 may have quadrangle shapes, each having two pairs of sides having substantially the same length. For example, one selected from the first sub-pixel F1, the second sub-pixel F2, and the third sub-pixel F3 may be substantially square or rhombus-shaped, and the other two selected from the first sub-pixel F1, the second sub-pixel F2, and the third sub-pixel F3 may be substantially rectangular. In this case, substantially a square (or a rhombus) may refer to a quadrangle having a shape in which the remaining sides other than one reference side of all sides of the quadrangle have lengths within a certain error range from the one reference side. In addition, substantially a rectangle may refer to a quadrangle having a shape in which one side of a pair of sides facing oppositely away from each other (e.g., parallel to each other) has a length within a certain error range based on the other side of the pair of sides facing oppositely away from each other. For example, the first sub-pixel F1, the second sub-pixel F2, and the third sub-pixel F3 may be formed in a substantially square or rectangular shape as described above through a deposition process to be described in more detail later below. In this case, the first sub-pixel F1, the second sub-pixel F2, and/or the third sub-pixel F3 may be substantially square (or rhombus) or rectangular in shape and may have rounded and/or chamfered corners. In addition, in the first sub-pixel F1, the second sub-pixel F2, and/or the third sub-pixel F3, the angles of corners formed by the sides connected to (e.g., meeting) each other may not be equal to 90 degrees and may be within a certain error range. Hereinafter, for convenience of description, the terms "square" and "rectangle" are used, but these terms should be understood as concepts that respectively include both a case "substantially square" and a case "substantially rectangle".

Hereinafter, for convenience of description, a case where the first sub-pixel F1 is square and the second sub-pixel F2 and the third sub-pixel F3 are rectangular will be mainly described in more detail.

One selected from the first sub-pixel F1, the second sub-pixel F2, and the third sub-pixel F3 is to emit blue light, another one selected from the first sub-pixel F1, the second sub-pixel F2, and the third sub-pixel F3 is to emit red light, and the remaining one selected from the first sub-pixel F1, the second sub-pixel F2, and the third sub-pixel F3 is to emit green light. In this case, depending on the shape of each of the first sub-pixel F1, the second sub-pixel F2, and the third sub-pixel F3, one selected from the blue light, the red light, and the green light may be square, and the other two selected from the blue light, the red light, and the green light may be rectangular. Hereinafter, for convenience of description, a case where the first sub-pixel F1 is to emit blue light, the second sub-pixel F2 is to emit red light, and the third sub-pixel F3 is to emit green light will be mainly described in more detail. Embodiments of the present disclosure are not limited to the above. For example, the first sub-pixel F1 may emit green light.

The area of each of the first sub-pixel F1, the second sub-pixel F2, and the third sub-pixel F3 may suitably vary. In this case, because an aperture ratio of each of the sub-pixels may be suitably adjusted, the display device 20 may be realized to perform various suitable operations in various suitable forms.

The first sub-pixel F1, the second sub-pixel F2, and the third sub-pixel F3 may include a first intermediate layer 28-2A, a second intermediate layer 28-2B, and a third intermediate layer 28-2C, respectively. In this case, the first intermediate layer 28-2A, the second intermediate layer 28-2B, and the third intermediate layer 28-2C may include (e.g., be) materials (e.g., organic emission layers) that are to emit different pieces (e.g., different colors) of light when external power is applied thereto.

The first intermediate layer 28-2A, the second intermediate layer 28-2B, and the third intermediate layer 28-2C may correspond to the shapes (e.g., planar shapes) of the first sub-pixel F1, the second sub-pixel F2, and the third sub-pixel F3, respectively. For example, the first intermediate layer 28-2A may have a square shape corresponding to a square shape of the first sub-pixel F1. Furthermore, the second intermediate layer 28-2B and the third intermediate layer 28-2C may have rectangular shapes corresponding to the rectangular shapes of the second sub-pixel F2 and the third sub-pixel F3, respectively. In this case, the planar area of each of the intermediate layers may be the same as or different from the planar area of each of the respective sub-pixels. For example, in an embodiment, the planar area of the first intermediate layer 28-2A may be different from the planar area of the first sub-pixel F1, the planar area of the second intermediate layer 28-2B may be the same as the planar area of the second sub-pixel F2, and the planar area of the third intermediate layer 28-2C may be the same as the planar area of the third sub-pixel F3. In another embodiment, the planar area of the second intermediate layer 28-2B may be different from the planar area of the second sub-pixel F2, the planar area of the first intermediate layer 28-2A may be the same as the planar area of the first sub-pixel F1, and the planar area of the third intermediate layer 28-2C may be the same as the planar area of the third sub-pixel F3. In another embodiment, the planar area of the third intermediate layer 28-2C may be different from the planar area of the third sub-pixel F3, the planar area of the second intermediate layer 28-2B may be the same as the planar area of the second sub-pixel F2, and the planar area of the first intermediate layer 28-2A may be the same as the planar area of the first sub-pixel F1. In another embodiment, the planar area of the first intermediate layer 28-2A may be the same as the planar area of the first sub-pixel F1, the planar area of the second intermediate layer 28-2B may be different from the planar area of the second sub-pixel F2, and the planar area of the third intermediate layer 28-2C may be different from the planar area of the third sub-pixel F3. In another embodiment, the planar area of the second intermediate layer 28-2B may be the same as the planar area of the second sub-pixel F2, the planar area of the first intermediate layer 28-2A may be different from the planar area of the first sub-pixel F1, and the planar area of the third intermediate layer 28-2C may be different from the planar area of the third sub-pixel F3. In another embodiment, the planar area of the third intermediate layer 28-2C may be the same as the planar area of the third sub-pixel F3, the planar area of the first intermediate layer 28-2A may be different from the planar area of the first sub-pixel F1, and the planar area of the second intermediate layer 28-2B may be different from the planar area of the second sub-pixel F2. In another embodiment, the planar area of the first intermediate layer 28-2A may be different from the planar area of the first sub-pixel F1, the planar area of the second intermediate layer 28-2B may be different from the planar area of the second sub-pixel F2, and the planar area of the third intermediate layer 28-2C may be different from the planar area of the third sub-pixel F3. In another embodiment, the planar area of the first intermediate layer 28-2A may be the same as the planar area of the first sub-pixel F1, the planar area of the second intermediate layer 28-2B may be the same as the planar area of the second sub-pixel F2, and the planar area of the third intermediate layer 28-2C may be the same as the planar area of the third sub-pixel F3. Here, the planar area may be an area on a plane formed by the display area DA of the display device 20. In some embodiments, the planar area may be an area on a plane on which an image is to be implemented (e.g. displayed) when the image is implemented (e.g., generated). Hereinafter, for convenience of description, a case where the planar area of each intermediate layer is different from the planar area of a respective sub-pixel will be mainly described in more detail.

In such a case, the planar area of each sub-pixel may be less than the planar area of the respective intermediate layer. For example, because each intermediate layer may be formed by deposition on the display substrate D to have sufficient margin for the respective sub-pixel, light having an accurate shape may be emitted from each sub-pixel.

Because a relationship between the sub-pixels and a relationship between the intermediate layers are the same or similar to each other, the following description will be made mainly on the relationship between the sub-pixels for convenience of description. However, the description may also be applicable to the relationship between the intermediate layers.

A plurality of first sub-pixels F1, a plurality of second sub-pixels F2, and a plurality of third sub-pixels F3 may be provided. In this case, the plurality of first sub-pixels F1 may be spaced apart from each other in at least one selected from a first direction and a second direction. For example, some of the plurality of first sub-pixels F1 may be arranged with each other to be spaced apart from each other in a first direction (e.g., one selected from an X-axis direction and a Y-axis direction in FIG. 1B), and the other ones of the plurality of first sub-pixels F1 may be arranged with each other to be spaced apart from each other in a second direction (e.g., the other one selected from the X-axis direction and the Y-axis direction in FIG. 1B). For example, the plurality of first sub-pixels F1 may be arranged with each other in rows extending along the second direction and in columns extending along the first direction (e.g., the plurality of first sub-pixels F1 may be arranged with each other in a matrix pattern). Hereinafter, for convenience of description, a case where the first direction refers to the X-axis direction of FIG. 1B and the second direction refers to the Y-axis direction of FIG. 1B will be mainly described in more detail.

The centers of first sub-pixels F1 that are arranged with each other in the first direction from among the plurality of first sub-pixels F1 may be arranged with each other on one straight line. In this case, the first sub-pixels F1 arranged with each other in the first direction from among the plurality of first sub-pixels F1 may be arranged with each other in a line (e.g., a straight line) in the first direction. The first direction may be a direction perpendicular or normal to a direction in which a user on the side of the display device 20 views the display device 20. For example, the first direction may be a direction parallel to a long side of the display device 20 or a short side of the display device 20. For example, when the long side of the display device 20 is parallel to a window of a vehicle, the first direction may be parallel to the short side of the display device 20. In this case, the long sides of the display device 20 may be arranged (e.g., may extend) up and down inside the vehicle. In another embodiment, when the short side of the display device 20 is parallel to a window of a vehicle, the first direction may be parallel to the long side of the display device 20. In this case, the short sides of the display device 20 may be arranged (e.g., may extend) up and down inside the vehicle. Hereinafter, for convenience of description, a case where the first direction is parallel to the long side of the display device 20 will be mainly described in more detail.

In the above case, in an embodiment, the first sub-pixel F1 may emit green light having high visibility. For example, when the first sub-pixel F1 is to emit green light, the visibility of letters in an image implemented in (e.g., displayed by) the display device 20 may be improved. In addition, the centers of first sub-pixels F1 arranged with each other in the second direction from among the plurality of first sub-pixels F1 may not be arranged with each other on one straight line and may be arranged with each other in a serpentine (or zigzag) shape.

A first side S1 and a second side S2 of each of the first sub-pixels F1 may form a set angle with each other. For example, the first side S1 and the second side S2 of the first sub-pixel F1 may form a right angle with each other. In this case, the first side S1 and the second side S2 may be arranged tilted in different directions with respect to at least one selected from the first direction and the second direction, respectively. Accordingly, each of the first sub-pixels F1 may be arranged in a rhombic form (e.g., may have a rhombic shape) with respect to one selected from the first direction and the second direction, and an angle formed by the two sides S1 and S2 adjacent to each of the vertexes of each of the first sub-pixels F1 may be 90 degrees. For example, each of the first sub-pixels F1 may have a square shape.

In this case, one second sub-pixel F2 and one third sub-pixel F3 may be arranged at (e.g., on) the first side S1 or the second side S2 of one first sub-pixel F1 to face the first sub-pixel F1. In this case, the second sub-pixel F2 and the third sub-pixel F3 may be arranged to be tilted with respect to one selected from the first direction and the second direction. For example, the second sub-pixel F2 and the third sub-pixel F3 may be tilted to form an angle of 45 degrees with respect to one selected from the first direction and the second direction. For example, at least one selected from the short side and a long side of at least one selected from the second sub-pixel F2 and the third sub-pixel F3 may form an angle of 45 degrees with respect to a straight line connecting the centers of a plurality of first sub-pixels F1 arranged with each other in the first direction.

The second sub-pixel F2 and the third sub-pixel F3 may have rectangular shapes. In this case, the area (e.g., planar area) of at least one selected from the second sub-pixel F2 and the third sub-pixel F3 may be less than the area of the first sub-pixel F1. Furthermore, at least one selected from the second sub-pixel F2 and the third sub-pixel F3 facing the first sub-pixel F1 (e.g., facing a side of the first sub-pixel F1) may be arranged to overlap one side (e.g., the first side S1 or the second side S2) of the first sub-pixel F1 facing the second sub-pixel F2 and the third sub-pixel F3 or an extension line of the one side of the first sub-pixel F1. For example, at least a portion of the second sub-pixel F2 and at least a portion of the third sub-pixel F3, which are adjacent to each other, may be arranged within a length range of one selected from the first side S1 and the second side S2.

A short side or a long side of at least one selected from the second sub-pixel F2 and the third sub-pixel F3 facing the first sub-pixel F1 may be parallel to the first side S1 or the second side S2. For example, in an embodiment, extension lines of short sides of different second sub-pixels F2 respectively facing the first side S1 and the second side S2 may intersect or cross with each other, or extension lines of long sides of the second sub-pixels F2 respectively facing the first side S1 and the second side S2 may intersect or cross with each other. In another embodiment, extension lines of short sides of a plurality of third sub-pixels F3 respectively facing the first side S1 and the second side S2 may intersect or cross with each other, or extension lines of long sides of the third sub-pixels F3 respectively facing the first side S1 and the second side S2 may intersect or cross with each other. In another embodiment, the extension line of a short side of the second sub-pixel F2 facing the first side S1 and the extension line of a short side of the third sub-pixel F3 facing the second side S2 may intersect or cross with each other, or the extension line of a long side of the second sub-pixel F2 facing the first side S1 and the extension line of a long side of the third sub-pixel F3 facing the second side S2 may intersect or cross with each other. In another embodiment, the extension line of a long side of the second sub-pixel F2 facing the first side S1 and the extension line of a short side of the third sub-pixel F3 facing the second side S2 may intersect or cross with each other, or the extension line of a short side of the second sub-pixel F2 facing the first side S1 and the extension line of a long side of the third sub-pixel F3 facing the second side S2 may intersect or cross with each other.

The plurality of second sub-pixels F2 may be spaced apart from each other in at least one selected from the first direction and the second direction. In this case, the centers of some of a plurality of second sub-pixels F2 arranged with each other in one selected from the first direction and the second direction may be arranged with each other on a straight line, and the centers of the other ones of the plurality of second sub-pixels F2 arranged with each other in the other one selected from the first direction and the second direction may be arranged with each other in a serpentine (or zigzag) shape in the other one selected from the first direction and the second direction. Hereinafter, for convenience of description, a case where the centers of some of a plurality of second sub-pixels F2 arranged with each other in the first direction are arranged with each other on a straight line and the centers of the other ones of a plurality of second sub-pixels F2 arranged with each other in the second direction are arranged with each other in a serpentine shape will be mainly described in more detail.

The plurality of third sub-pixels F3 may also be arranged with each other to be spaced apart from each other in at least one selected from the first direction and the second direction similarly to the second sub-pixels F2. In this case, the plurality of third sub-pixels F3 may also be arranged with each other similarly to the second sub-pixels F2. Hereinafter, for convenience of description, a case where the centers of some of a plurality of third sub-pixels F3 arranged with each other in the first direction from among the plurality of third sub-pixels F3 are arranged with each other on a straight line and the centers of the other ones of a plurality of third sub-pixels F3 arranged with each other in the second direction from among the plurality of third sub-pixels F3 are arranged with each other in a serpentine shape will be mainly described in more detail.

In this case, one selected from the second sub-pixel F2 and the third sub-pixel F3 facing the first side S1 of the first sub-pixel F1 may be arranged to be symmetrical (e.g., reflectively symmetrical) with one selected from the second sub-pixel F2 and the third sub-pixel F3 facing the second side S2 of the first sub-pixel F1 with respect to a straight line (otherwise, a straight line parallel to the first direction while passing through the centers of two adjacent first sub-pixels F1) connecting the centers of first sub-pixels F1 arranged in the first direction. For example, the second sub-pixel F2 facing the first side S1 may be symmetrical with the third sub-pixel F3 facing the second side S2 with respect to the straight line. Also, the third sub-pixel F3 facing the first side S1 may be symmetrical with the second sub-pixel F2 facing the second side S2 with respect to the straight line. A distance between the centers of adjacent second sub-pixels F2 (e.g., second sub-pixels F2 adjacent along the first direction and/or the second direction) may be the same as a distance between the centers of adjacent third sub-pixels F3 (e.g., third sub-pixels F3 adjacent along the first direction and/or the second direction). In another embodiment, the second sub-pixel F2 and the third sub-pixel F3 facing the first side S1 may be symmetrical with the second sub-pixel F2 and the third sub-pixel F3 facing the second side S2, respectively. A distance between the centers of one selected from a pair of second sub-pixels F2 and a pair of third sub-pixels F3 arranged symmetrically with respect to each other may be less than a distance between the centers of the other one selected from the pair of second sub-pixels F2 and the pair of third sub-pixels F3 arranged symmetrically with respect to each other. In this case, a pair of second sub-pixels F2 adjacent to each other may be arranged between a pair of third sub-pixels F3 adjacent to each other or the pair of third sub-pixels F3 adjacent to each other may be arranged between the pair of second sub-pixels F2 adjacent to each other. However, hereinafter, for convenience of description, a case where the second sub-pixel F2 and the third sub-pixel F3 are arranged to be symmetrical with each other with respect to a straight line connecting the centers of first sub-pixels F1 arranged in the first direction will be mainly described in more detail.

The second sub-pixel F2 and the third sub-pixel F3 may have the same size (e.g., planar area). For example, the planar area of the second sub-pixel F2 may be equal to the planar area of the third sub-pixel F3. In this case, the length of a short side of the second sub-pixel F2 may be equal to the length of a short side of the third sub-pixel F3, and the length of a long side of the second sub-pixel F2 may be equal to the length of a long side of the third sub-pixel F3. In this case, the second intermediate layer 28-2B and the third intermediate layer 28-2C respectively arranged in the second sub-pixel F2 and the third sub-pixel F3 may also have the same size (e.g., planar area) similarly to the second sub-pixel F2 and the third sub-pixel F3.

The shortest distances from two sub-pixels facing one side of the first sub-pixel F1 to the one side of the first sub-pixel F1 may be different from each other. For example, a first distance L1 that is the shortest distance from an edge of the first sub-pixel F1 to the second sub-pixel F2 and a second distance L2 that is the shortest distance from the edge of the first sub-pixel F1 to the third sub-pixel F3 may be different from each other. For example, the first distance L1 may be less than the second distance L2. In this case, the shortest distance may be measured from the first side S1 or the second side S2 to one side of the second sub-pixel F2 or one side of the third sub-pixel F3 in a direction perpendicular to one selected from the first side S1 and the second side S2. In another embodiment, the shortest distance may be measured from the first side S1 or the second side S2 to one side of the second sub-pixel F2 or one side of the third sub-pixel F3 in a direction perpendicular to an extension line of one of the first side S1 and the second side S2. However, hereinafter, for convenience of description, a case where the shortest distance is a distance measured from the first side S1 or the extension line of the first side S1 to the second sub-pixel F2 or the third sub-pixel F3 facing the first side S1 will be mainly described in more detail. In another embodiment, the shortest distance may be measured as a distance from the center of the first sub-pixel F1 to the center of the second sub-pixel F2 or a distance from the center of the first sub-pixel F1 to the center of the third sub-pixel F3. In some embodiments, the shortest distance may be measured as a distance from the first side S1 of the first sub-pixel F1 or the extension line of the first side S1 to the center of the second sub-pixel F2 or to the center of the third sub-pixel F3.

In addition to the above cases, distances from edges (or sides) of one selected from a second sub-pixel F2 and a third sub-pixel F3 facing the same first sub-pixel F1 to an edge (or one side) of the first sub-pixel F1 may be different from each other. For example, a first distance L1 from a short side of a second sub-pixel F2 facing the first side S1 of the first sub-pixel F1 to the first side S1 may be different from a third distance L3 from a short side of a second sub-pixel F2 facing the second side S2 to the second side S2. In addition, a second distance L2 from a short side of a third sub-pixel F3 facing the first side S1 of the first sub-pixel F1 to the first side S1 may be different from a fourth distance L4 from a short side of a third sub-pixel F3 facing the second side S2 to the second side S2. In this case, the third distance L3 may be equal to the second distance L2, and the fourth distance L4 may be equal to the first distance L1.

Furthermore, the shortest distances from an edge of at least one selected from a second sub-pixel F2 and a third sub-pixel F3 arranged between adjacent first sub-pixels F1 to edges of the first sub-pixels F1 that are different from each other. For example, the first distance L1 from a short side of a second sub-pixel F2 facing the first side S1 of the first sub-pixel F1 to the first side S1 may be different from a sixth distance L6 from a short side of the second sub-pixel F2 facing one side of another adjacent first sub-pixel F1 to the one side of the other adjacent first sub-pixel F1. In addition, the second distance L2 from a short side of a third sub-pixel F3 facing the first side S1 of the first sub-pixel F1 to the first side S1 may be different from a fifth distance L5 from a short side of the third sub-pixel F3 facing one side of another adjacent first sub-pixel F1 to the one side of the other adjacent first sub-pixel F1. In this case, the above relationship may be the same for a long side of the second sub-pixel F2 and a long side of the third sub-pixel F3, and may be equally or similarly applied to the first intermediate layer 28-2A, the second intermediate layer 28-2B, and the third intermediate layer 28-2C.

In this case, a seventh distance L7 between one side of the first sub-pixel F1 and a long side of the second sub-pixel F2 which face each other, an eighth distance L8 between a long side of the second sub-pixel F2 and a long side of the third sub-pixel F3 which face each other, and a ninth distance L9 between a long side of the third sub-pixel F3 and one side of the first sub-pixel F1 which face each other may be equal to one another. In this case, the seventh distance L7 to the ninth distance L9 may be greater than or equal to the first distance L1 and less than the second distance L2. For example, the distances described above may maintain the rigidity of a mask sheet, which will be described later, by providing a width of a mask sheet portion arranged between openings of the mask sheet. In addition, intermediate layers may be prevented from overlapping and/or being connected to each other through the distances, or the amount of overlap and/or connection may be reduced.

An outline R connecting a portion of an edge of the second sub-pixel F2 facing one side of the first sub-pixel F1 to a portion of the third sub-pixel F3 may be square (e.g., a portion of a square). For example, the outline R may be drawn by connecting the remaining edge of the second sub-pixel F2 and the remaining edge of the third sub-pixel F3 excluding one side of the second sub-pixel F2 and one side of the third sub-pixel F3 in which the second sub-pixel F2 and the third sub-pixel F3 face each other and by connecting a vertex of the second sub-pixel F2 and a vertex of the third sub-pixel F3 facing each other at a portion where the second sub-pixel F2 and the third sub-pixel F3 are apart from each other. In some embodiments, the outline R may be defined by one long side of the second sub-pixel F2 that faces oppositely away from the third sub-pixel F3, one long side of the third sub-pixel F3 that faces oppositely away from the second sub-pixel F2, one short side of the second sub-pixel F2, one short side of the third sub-pixel F3 that faces oppositely away from the one short side of the second-sub-pixel F2, an extension line extending from the one long side of the second sub-pixel F2 to meet an extension line extending from the one short side of the third sub-pixel F3, the extension line extending from the one short side of the third sub-pixel F3, an extension line extending from the one long side of the third sub-pixel F3 to meet an extension line extending from the one short side of the second sub-pixel F2, and the extension line extending from the one short side of the second sub-pixel F2. The outline R forms a square, and thus, the second sub-pixel F2 and the third sub-pixel F3 may be arranged at the second side S2 by rotating the second sub-pixel F2 and the third sub-pixel F3 arranged at the first side S1 so that the arrangement of the second sub-pixel F2 and the third sub-pixel F3 arranged at the second side S2 may correspond to the arrangement of the second sub-pixel F2 and the third sub-pixel F3 facing the first side S1.

The first intermediate layer 28-2A, the second intermediate layer 28-2B, and the third intermediate layer 28-2C respectively forming (e.g., in or corresponding to) the first sub-pixel F1, the second sub-pixel F2, and the third sub-pixel F3 may be formed and arranged to be the same as or similar to the first sub-pixel F1, the second sub-pixel F2, and the third sub-pixel F3, respectively. The centers of the first intermediate layer 28-2A, the second intermediate layer 28-2B, and the third intermediate layer 28-2C may be arranged at positions that are the same as or different from those of the centers of the first sub-pixel F1, the second sub-pixel F2, and the third sub-pixel F3, respectively. The descriptions of the first sub-pixel F1, the second sub-pixel F2, and the third sub-pixel F3 given above may be applied to the first intermediate layer 28-2A, the second intermediate layer 28-2B, and the third intermediate layer 28-2C, respectively.

A spacer P may be arranged between the first sub-pixel F1 and the second sub-pixel F2 and/or between the first sub-pixel F1 and the third sub-pixel F3. In this case, the spacer P may be arranged on the pixel-defining layer 29 or integrally formed with the pixel-defining layer 29. The spacer P may have various suitable shapes. For example, a plurality of spacers P may be formed in the form of protrusions, and the plurality of spacers P may be arranged to be spaced apart from each other on the pixel-defining layer 29. In another embodiment, one spacer P may be provided in a space between sub-pixels adjacent to each other (or between intermediate layers adjacent to each other). The spacer P is not limited to the above case, and when each of mask sheets enters an opening of the pixel-defining layer 29 or a deposition material is deposited on the display substrate D, the mask sheet may be in close contact with the pixel-defining layer 29 and contact the display substrate D to thereby prevent or reduce the occurrence of a defect in which a portion of the display substrate D is damaged and/or broken. For example, the spacer P may maintain a gap between the end of an opening area of the pixel-defining layer 29 and each mask assembly when the mask assembly is in close contact with the display substrate D. In this case, the spacer P may be arranged so as not to overlap each of the intermediate layers. Hereinafter, for convenience of description, a case where the spacer P is arranged between the first side S1 and the third sub-pixel F3 and/or between the second side S2 and the second sub-pixel F2 will be mainly described in more detail. For example, one spacer P may be between the first side S1 and the third sub-pixel F3, and another spacer P may be between the second side S2 and the second sub-pixel F2.

The spacer P as described above may be integrally formed simultaneously or concurrently with the pixel-defining layer 29 when the pixel-defining layer 29 is formed, or may be separately formed on the pixel-defining layer 29 after the pixel-defining layer 29 is formed. In this case, the spacer P may utilize a material that is the same as or different from that of the pixel-defining layer 29. Hereinafter, for convenience of description, a case where the spacer P utilizes a material that is the same as that of the pixel-defining layer 29 will be mainly described in more detail.

Distances from sub-pixels facing the edge of the spacer P to the edge of the spacer P may be the same. For example, a tenth distance L10 from one side of the first sub-pixel F1 facing the edge of the spacer P to the edge of the spacer P, an eleventh distance L11 from a short side of the second sub-pixel F2 facing the edge of the spacer P to the edge of the spacer P, and a twelfth distance L12 from a short side of the third sub-pixel F3 facing the edge of the spacer P to the edge of the spacer P may be equal to one another.

An apparatus for manufacturing a display device to be described in more detail later below may form various suitable layers on the display substrate D. For example, the apparatus for manufacturing the display device may form at least one of the intermediate layers 28-2 on the display substrate D. In more detail, the apparatus for manufacturing the display device may form at least one selected from an organic emission layer, a hole injection layer, a hole transport layer, an electron injection layer, an electron transport layer, and a functional layer in the intermediate layer 28-2. For example, when the apparatus for manufacturing the display device forms at least one selected from the layers in the intermediate layer 28-2 on the display substrate D, the apparatus for manufacturing the display device may manufacture one layer through a plurality of deposition materials or may simultaneously or concurrently manufacture a plurality of layers. The thin-film encapsulation layer E may include a plurality of inorganic layers or may include an inorganic layer and an organic layer.

The organic layer of the thin-film encapsulation layer E may be formed of a polymer and may include (e.g., be) polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate, polyacrylic acid, etc.), or any combination thereof.

The inorganic layer of the thin-film encapsulation layer E may be a single layer or stacked layer including (e.g., being) a metal oxide and/or a metal nitride. For example, the inorganic layer may include (e.g., be) SiNx (SiN$_x$), Al$_2$O$_3$, SiO$_2$, and/or TiO$_2$.

An uppermost layer of the thin-film encapsulation layer E that is exposed to the outside may include an inorganic layer in order to prevent or block moisture from penetrating into an organic light-emitting device 28.

The thin-film encapsulation layer E may include at least one sandwich structure in which at least one organic layer is inserted between at least two inorganic layers. As another example, the thin-film encapsulation layer E may include at least one sandwich structure in which at least one inorganic layer is between at least two organic layers. As another example, the thin-film encapsulation layer E may include a sandwich structure in which at least one organic layer is between at least two inorganic layers and a sandwich structure in which at least one inorganic layer is between at least two organic layers (e.g., a structure wherein organic layers and inorganic layers are alternately arranged with each other in a stacked arrangement).

The thin-film encapsulation layer E may sequentially include a first inorganic layer, a first organic layer, and a second inorganic layer from an upper portion of the organic light-emitting device 28 (e.g., sequentially stacked from an upper surface of the organic light-emitting device).

As another example, the thin-film encapsulation layer E may sequentially include a first inorganic layer, a first organic layer, a second inorganic layer, a second organic layer, and a third inorganic layer from an upper portion of the organic light-emitting device 28.

As another example, the thin-film encapsulation layer E may sequentially include a first inorganic layer, a first organic layer, a second inorganic layer, a second organic layer, a third inorganic layer, a third organic layer, and a fourth inorganic layer from an upper portion of the organic light-emitting device 28.

A halogenated metal layer including (e.g., being) LiF may be further between the organic light-emitting device 28 and the first inorganic layer. The halogenated metal layer may prevent the organic-light emitting device 28 from being damaged, or may reduce such damage, when the first inorganic layer is formed by sputtering.

The area (e.g., planar area) of the first organic layer may be less than the area (e.g., planar area) of the second inorganic layer, and the area (e.g., planar area) of the second organic layer may also be less than the area (e.g., planar area) of the third inorganic layer.

When a plurality of inorganic layers are provided as described above, the inorganic layers may be deposited to be in direct contact with each other at (e.g., in) an edge region of the display device 20, and organic layers may not be exposed to the outside. For example, the inorganic layers may extend beyond the organic layers in the plan view to come into contact with each other and encapsulate the organic layers.

The display device 20 as described above may be fixed to a device such as a vehicle for moving a user. The display device 20 may be fixed to the device to form an angle different from 0 degrees between a user's viewing direction (e.g., a direction along a virtual line extending from the user's eyes to the display device 20) and the first direction or the second direction. For example, the display device 20 may be arranged such that the user's viewing direction of the display device 20 and the first direction or the second direction form an angle of 90 degrees. In this case, each of the sub-pixels may be arranged tilted with respect to the user's viewing direction (e.g., the Y-axis direction in FIG. 1B), as described above. Hereinafter, for convenience of description, a case where the user's viewing direction of the display device 20 and the first direction form an angle of 90 degrees will be mainly described in more detail.

In the above case, when a user looks at the display device 20, an inclined portion of the pixel-defining layer 29 is not perpendicular to the user's viewing direction. Accordingly, external light may be prevented from being reflected through (e.g., from) the inclined portion of the pixel-defining layer 29 and being incident on the user's eyes, or the amount of external light reflected through the inclined portion of the pixel-defining layer 29 may be reduced.

Furthermore, the display device 20 may implement a precise image through each sub-pixel.

Figure 4:
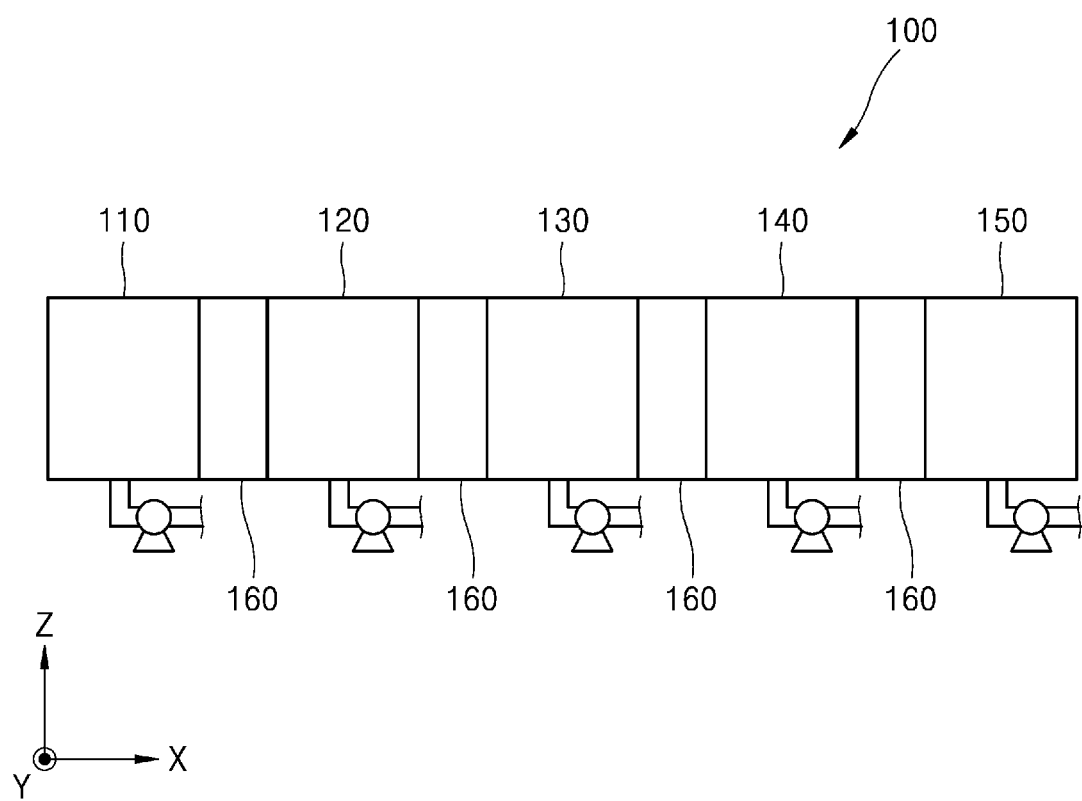
FIG. 4 is a front view of an apparatus for manufacturing the display device shown in FIG. 1B.
Figure 5:
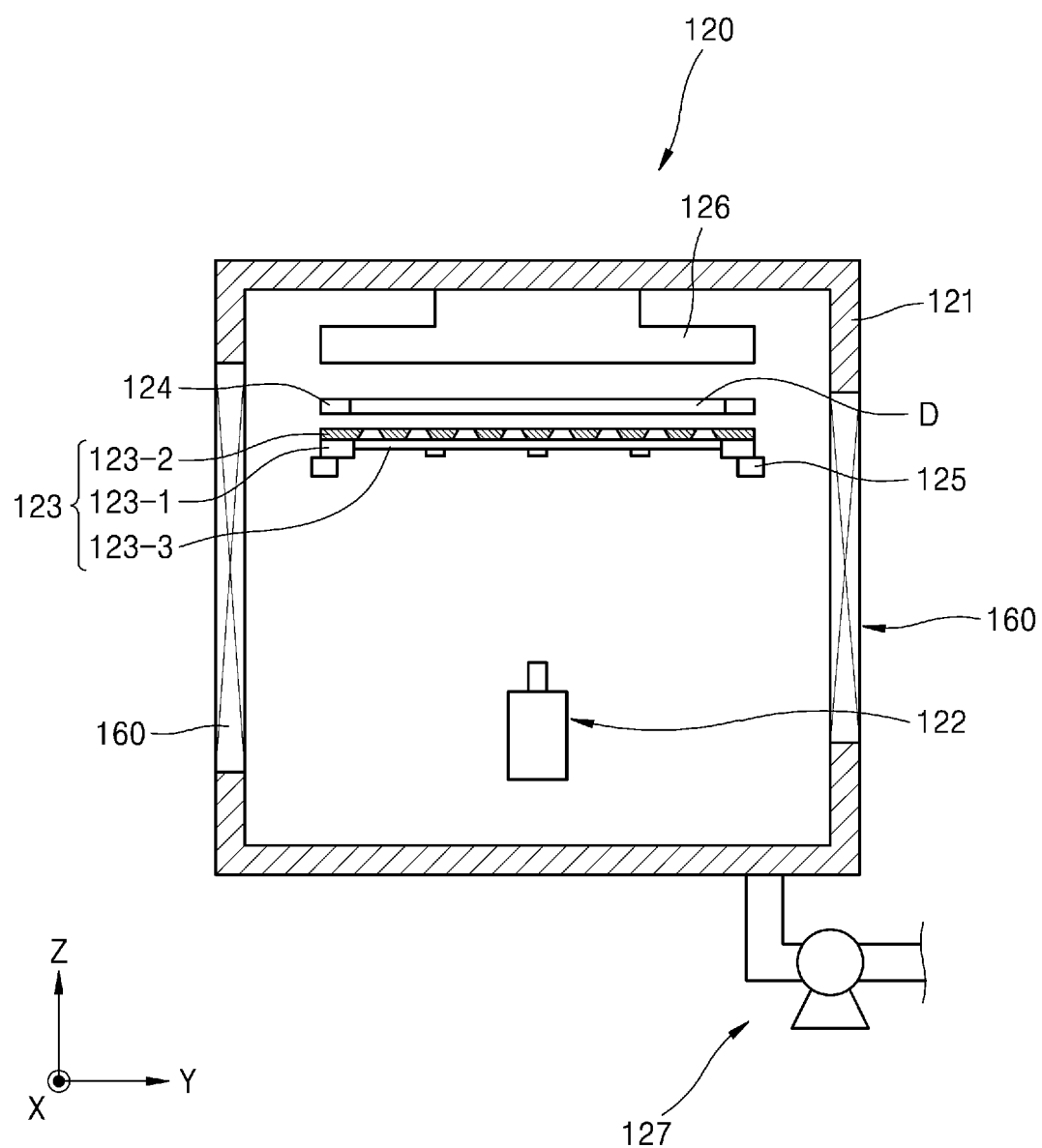
FIG. 5 is a cross-sectional view of a first deposition unit shown in FIG. 4.
Figure 6:
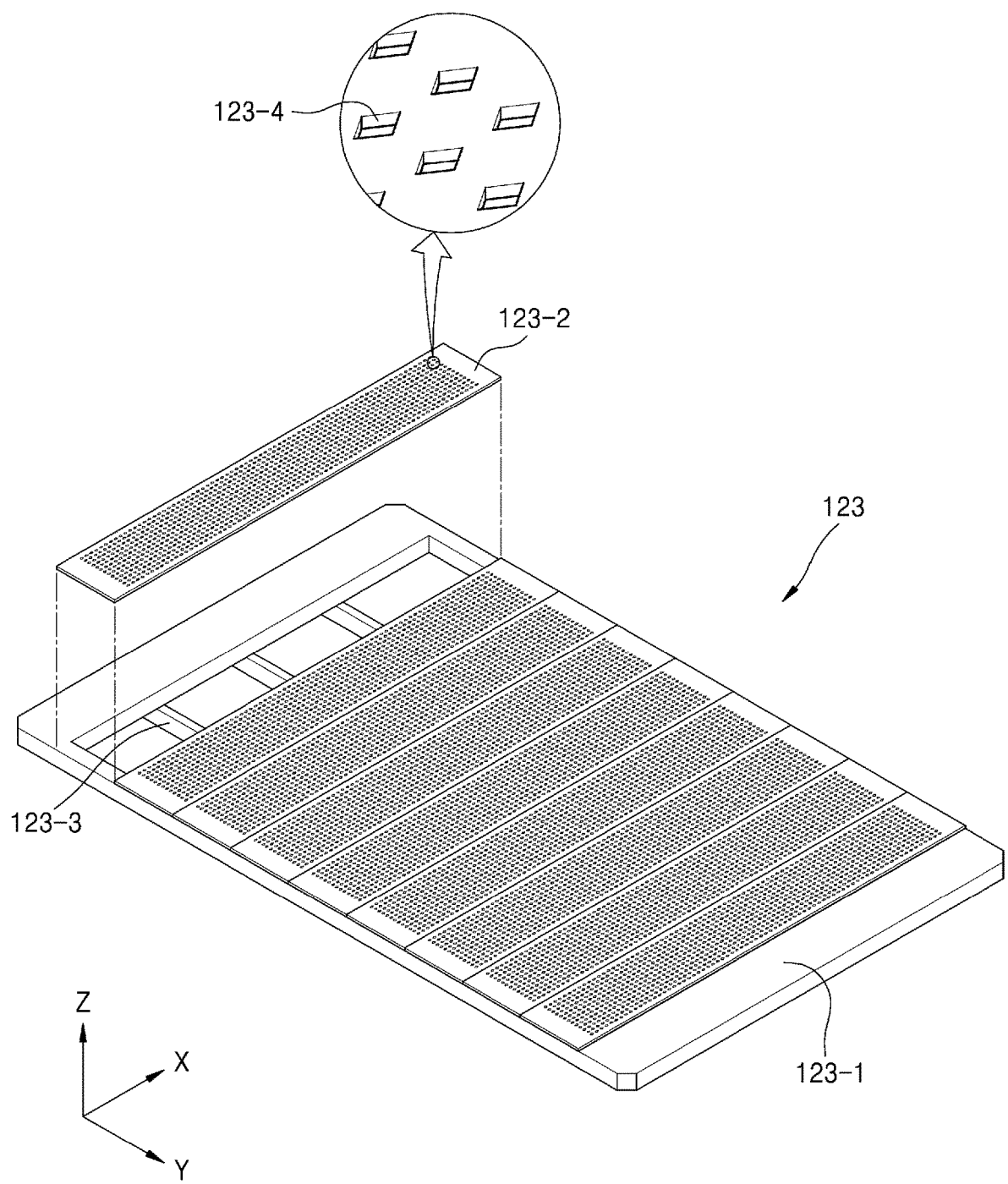
FIG. 6 is a perspective view of a first mask assembly shown in FIG. 5.
Figure 7:
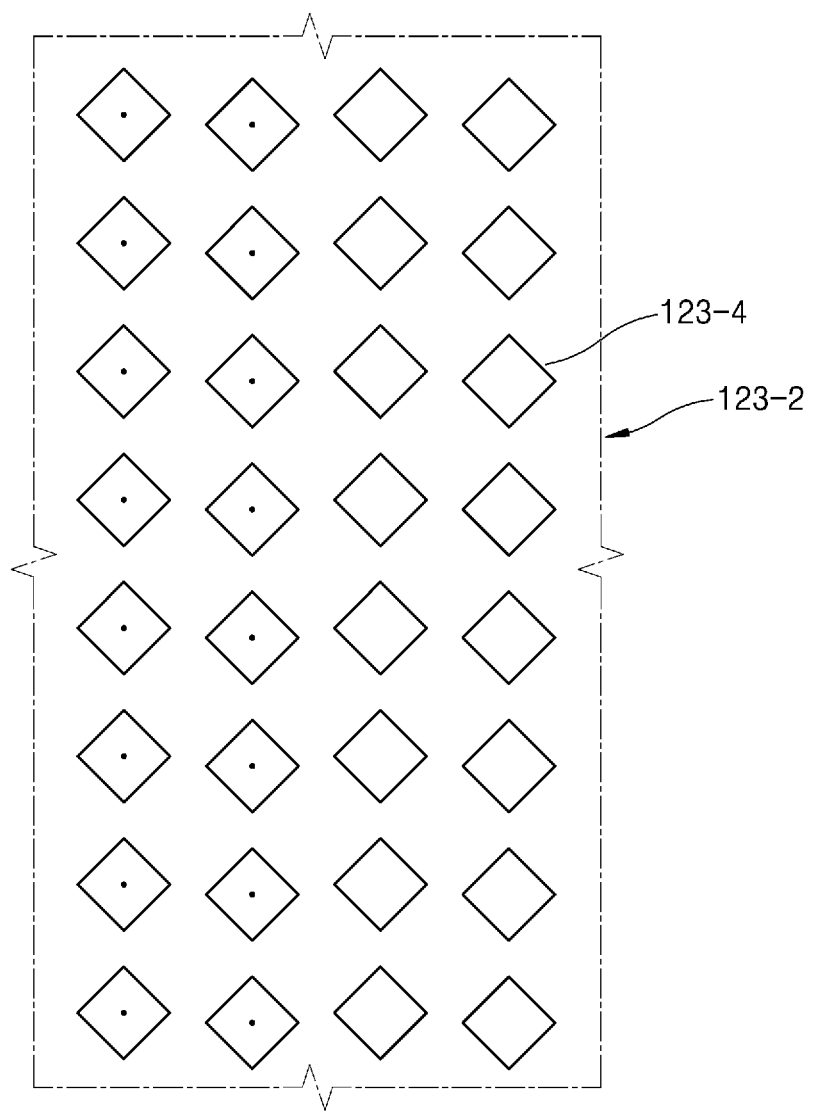
FIG. 7 is a plan view of a portion of a first mask sheet shown in FIG. 6.
Figure 8:
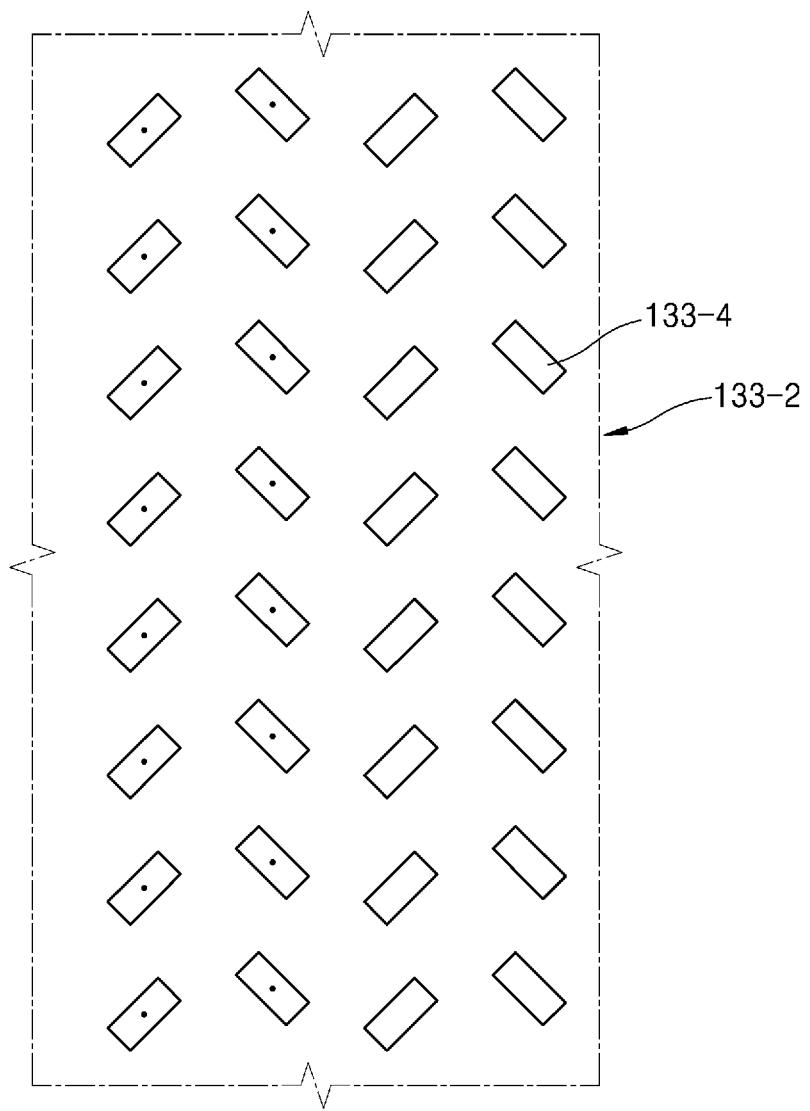
FIG. 8 is a plan view of a portion of a second mask sheet utilized in a second deposition unit shown in FIG. 4.
Figure 9:
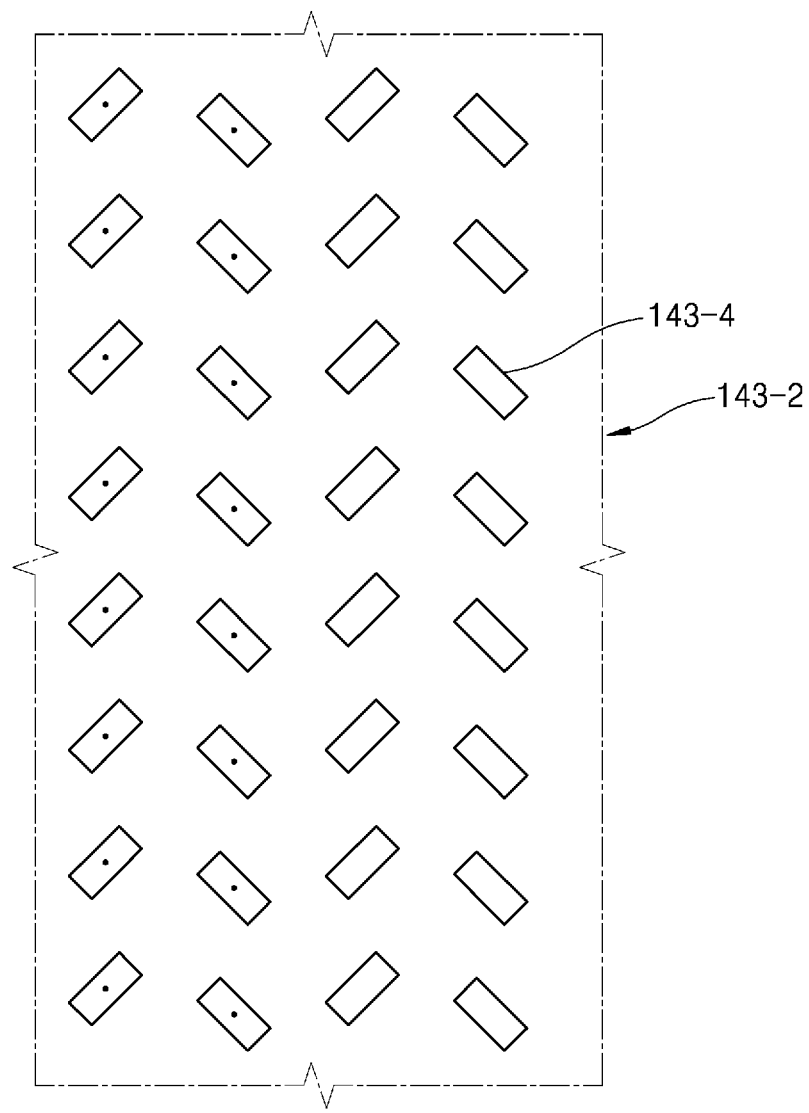
FIG. 9 is a plan view of a portion of a third mask sheet utilized in a third deposition unit shown in FIG. 4.

FIG. 4 is a front view of an apparatus for manufacturing the display device 20 shown in FIG. 1B. FIG. 5 is a cross-sectional view of a first deposition unit shown in FIG. 4. FIG. 6 is a perspective view of a first mask assembly shown in FIG. 5. FIG. 7 is a plan view of a portion of a first mask sheet shown in FIG. 6. FIG. 8 is a plan view of a portion of a second mask sheet utilized in a second deposition unit shown in FIG. 4. FIG. 9 is a plan view of a portion of a third mask sheet utilized in a third deposition unit shown in FIG. 4.

Referring to FIGS. 4 to 9, an apparatus 100 for manufacturing a display device (hereinafter, referred to as a display device manufacturing apparatus) may include a device for loading the display substrate D, a device for manufacturing the display substrate D, a device for forming an intermediate layer on the display substrate D, a device for forming an opposite electrode on the display substrate D, a device for forming a thin-film encapsulation layer on the display substrate D, a device for unloading the display substrate D, and/or the like. In this case, in an embodiment, the display device manufacturing apparatus 100 may be formed by connecting the above-described devices in an in-line form (e.g., by connecting and/or arranging the above-described devices along a line). In another embodiment, in the display device manufacturing apparatus 100, only some of the devices described above may be arranged in an in-line form, and the other ones of the devices may be arranged to be separated from a portion of the in-line form. For example, the other ones of the devices may not be connected and/or arranged along a line along which the some of the devices are connected and/or arranged. In another embodiment, the display device manufacturing apparatus 100 may also be formed by arranging the devices separately. However, hereinafter, for convenience of description, a case where the display device manufacturing apparatus 100 includes the device for loading the display substrate D, the device for forming an intermediate layer, and the device for unloading the display substrate D will be mainly described in more detail.

The display device manufacturing apparatus 100 may include a loading unit 110, a first deposition unit 120, a second deposition unit 130, a third deposition unit 140, and an unloading unit 150. In addition, the display device manufacturing apparatus 100 may include a shielding unit 160 arranged between devices connected to each other to disconnect or connect the spaces of the devices.

The first deposition unit 120, the second deposition unit 130, and the third deposition unit 140 may deposit a first intermediate layer, a second intermediate layer, and a third intermediate layer on the display substrate D in various suitable orders. For example, the first deposition unit 120 may deposit one selected from the first intermediate layer, the second intermediate layer, and the third intermediate layer on the display substrate D, the second deposition unit 130 may deposit another one selected from the first intermediate layer, the second intermediate layer, and the third intermediate layer on the display substrate D, and the third deposition unit 140 may deposit the remaining one selected from the first intermediate layer, the second intermediate layer, and the third intermediate layer on the display substrate D. However, hereinafter, for convenience of description, a case where the first deposition unit 120 deposits the first intermediate layer on the display substrate D, the second deposition unit 130 deposits the second intermediate layer on the display substrate D, and the third deposition unit 140 deposits the third intermediate layer on the display substrate D will be mainly described in more detail. Furthermore, a case where the first intermediate layer, the second intermediate layer, and the third intermediate layer have the same shape and arrangement as the first sub-pixel, the second sub-pixel, and the third sub-pixel described with reference to FIGS. 1A to 3 above will be mainly described in more detail.

In the loading unit 110, the display substrate D may be inserted from the outside and temporarily stored. In this case, the loading unit 110 may store a plurality of display substrates D or one display substrate D. The loading unit 110 may receive the display substrate D from the outside through a robot arm and/or a movable shuttle arranged therein and may supply the display substrate D to the first deposition unit 120. Hereinafter, for convenience of description, a case where the loading unit 110 supports the display substrate D through the robot arm therein and the display substrate D supplied from the robot arm is mounted onto a shuttle and supplied to the first deposition unit 120 from the loading unit 110 will be mainly described in more detail.

The first deposition unit 120 may deposit the first intermediate layer on the display substrate D. In this case, the first deposition unit 120 may be one or more (e.g., may be provided in plurality). For example, in an embodiment, when one first deposition unit 120 is provided, the first deposition unit 120 may form at least one layer of the first intermediate layer. The first deposition unit 120 may include at least one first deposition source 122 to form one layer of the first intermediate layer on the display substrate D. For example, when a plurality of first deposition sources 122 are provided so that the first deposition unit 120 forms a plurality of layers of the first intermediate layer, each of the first deposition sources 122 may be replaceable. In this case, the first deposition sources 122 may store different deposition materials. In another embodiment, when a plurality of first deposition units 120 are provided, the first deposition units 120 may deposit the plurality of layers of the first intermediate layer on the display substrate D, respectively.

In this case, the first deposition units 120 may deposit different deposition materials on the display substrate D, respectively. However, hereinafter, for convenience of description, a case where only one first deposition source 122 is provided, and the first deposition source 122 forms only an organic emission layer of the first intermediate layer, will be mainly described in more detail.

The first deposition unit 120 may include a first chamber 121, the first deposition source 122, a first mask assembly 123, a first substrate supporting portion 124, a first mask supporting portion 125, a first magnetic force generating portion 126, and a first pressure regulating portion 127.

A space may be formed in the first chamber 121, and one side of the first chamber 121 may be opened to allow the display substrate D to be drawn out or contained. In this case, the shielding unit 160 including a gate valve and/or the like is arranged in the opened portion of the first chamber 121 and may be selectively opened and closed.

The first deposition source 122 may contain a first deposition material for forming at least one layer of the first intermediate layer. The first deposition source 122 may vaporize and/or sublimate the first deposition material by applying energy (e.g., thermal energy, light energy, vibration energy, etc.).

The first deposition source 122 as described above may be replaceable. The first deposition source 122 may be replaced with a new first deposition source 122 when the contained first deposition material is exhausted.

The first mask assembly 123 may include a first mask frame 123-1, a first mask sheet 123-2, and a first support frame 123-3.

The first mask frame 123-1 may have an opening at the center thereof. In this case, the first mask frame 123-1 may be formed in a window frame shape. In another embodiment, the first mask frame 123-1 may have an opening at the center thereof, and a separate frame dividing the opening into a lattice form may be arranged. Hereinafter, for convenience of description, a case where the first mask frame 123-1 has an opening at the center thereof will be mainly described in more detail.

The first mask sheet 123-2 is arranged on one side of the first mask frame 123-1 under tension in at least one selected from the first direction and the second direction and may be fixed to the first mask frame 123-1 through welding and/or the like. The first mask frame 123-1 may be formed with a groove to accommodate the first mask sheet 123-2. The first mask sheet 123-2 may be formed in a rectangular shape and may be arranged at (e.g., as or on) one side of the first mask frame 123-1. Further, the first mask sheet 123-2 may be formed in a slit shape.

The first mask sheet 123-2 may be plural (e.g., provided in plural). The plurality of first mask sheets 123-2 may be arranged with each other in a line to be adjacent to each other in the first direction or the second direction. For example, a long side of the first mask sheet 123-2 may be arranged to be parallel to a long side or a short side of the first mask frame 123-1. Hereinafter, for convenience of description, a case where a long side of the first mask sheet 123-2 is arranged in the X-axis direction of FIG. 6 will be mainly described in more detail.

The first mask sheet 123-2 may have a plurality of first openings 123-4. The plurality of first openings 123-4 may be arranged with each other to be spaced apart from each other in the first direction and the second direction. For example, each of the first openings 123-4 may be rhombic (e.g., may have a rhombic planar shape) with a vertex arranged in a tensile direction (e.g., X direction of FIG. 6) of the first mask sheet 123-2. In some embodiments, the tensile direction is the direction in which the first mask sheet 123-2 is under tension. In some embodiments, each of the first openings 123-4 may be in the form of a square having an angle of 90 degrees formed by two sides adjacent to each vertex (e.g., formed by two sides extending from the vertex). In this case, the centers of some of the plurality of first openings 123-4 may be arranged with each other on a line in one selected from the tensile direction of the first mask sheet 123-2 and a direction perpendicular to the tensile direction of the first mask sheet 123-2. In addition, the centers of the other ones of the plurality of first openings 123-4 may be arranged with each other in a serpentine shape in one selected from the tensile direction of the first mask sheet 123-2 and the direction perpendicular to the tensile direction of the first mask sheet 123-2. In this case, the plurality of first openings 123-4 may be arranged with each other to correspond to the arrangement of the first sub-pixels described with reference to FIGS. 1B to 3. In the case where the first opening 123-4 is formed as described above, even if the first mask sheet 123-2 is under tension, a tensile shape of the first mask sheet 123-2 may be predicted to some extent.

The first support frame 123-3 may be arranged in the first mask frame 123-1 to support the first mask sheet 123-2 as well as the first mask frame 123-1. The first support frame 123-3 may be arranged in the first mask frame 123-1 in a lattice shape to define a display area of one display device. For example, the first support frame 123-3 may define a plurality of display areas by dividing a central opening of the first mask frame 123-1 into a plurality of areas.

The first substrate supporting portion 124 may support the display substrate D. The first substrate supporting portion 124 may support the display substrate D by placing the display substrate D thereon or by adsorbing or coupling (e.g., attaching) one surface of the display substrate D thereto. For example, the first substrate supporting portion 124 may include a frame, a bar, and/or the like that is fixed within the first chamber 121. In another embodiment, the first substrate supporting portion 124 may include a clamp for holding the display substrate D. In another embodiment, the first substrate supporting portion 124 may include an adhesive chuck and/or an electrostatic chuck. In this case, the first substrate supporting portion 124 may be formed integrally with the first magnetic force generating portion 126. In another embodiment, the first substrate supporting portion 124 may also include a shuttle for transferring the display substrate D from the loading unit 110. However, hereinafter, for convenience of description, a case where the first substrate supporting portion 124 includes a shuttle will be mainly described in more detail.

The first mask supporting portion 125 may support the first mask assembly 123. Because the first mask supporting portion 125 may be the same as or similar to the first substrate supporting portion 124 described above, a more detailed descriptions thereof may not be provided herein for convenience of description. Hereinafter, a case where the first mask supporting portion 125 includes a frame fixed within the first chamber 121 and the first mask assembly 123 is placed and supported on the frame will be mainly described in more detail.

The first magnetic force generating portion 126 may be arranged in the first chamber 121 to bring the first mask frame 123-1 into close contact with the display substrate D. Here, the first magnetic force generating portion 126 may include an electromagnet.

The first pressure regulating portion 127 may be coupled (e.g., connected) to the first chamber 121 to adjust pressure inside the first chamber 121. The first pressure regulating portion 127 may include a pipe coupled (e.g., connected) to the first chamber 121 and a pump arranged in the pipe.

The second deposition unit 130 may deposit a second deposition material on the display substrate D on which the first intermediate layer is formed to form the second intermediate layer. The second deposition unit 130 may be similar to the first deposition unit 120 described above. The second deposition unit 130 may include a second mask sheet 133-2. The second mask sheet 133-2 may be similar to the first mask sheet 123-2. In this case, the second mask sheet 133-2 may have a plurality of second openings 133-4. The plurality of second openings 133-4 may be spaced apart from each other. Some of the plurality of second openings 133-4 may be tilted in one direction with respect to a tensile direction (e.g., the X-axis direction in FIG. 8) of the second mask sheet 133-2. For example, the plurality of second openings 133-4 may each have a rectangular shape in the plan view, and some of the plurality of second openings 133-4 have a length extending in a direction tilted in the one direction with respect to the tensile direction. The other ones of the plurality of second openings 133-4 may be tilted in a direction different (e.g., may have a length extending in a direction tilted in the different direction) from the one direction of the some of the plurality of second openings 133-4 with respect to the tensile direction of the second mask sheet 133-2. For example, the plurality of second openings 133-4 may be tilted to have an angle different from 0 degrees with respect to the tensile direction of the second mask sheet 133-2. For example, the plurality of second openings 133-4 may be arranged to form an angle of 45 degrees with respect to the tensile direction of the second mask sheet 133-2.

In an embodiment, the centers of the second openings 133-4 may form a straight line in one direction. For example, the centers of the some of the plurality of second openings 133-4 may form a straight line, and the centers of the other ones of the plurality of second openings 133-4 may not form a straight line. For example, among the plurality of second openings 133-4 described above, the centers of second openings 133-4 in a line which are arranged with each other in one selected from the tensile direction of the second mask sheet 133-2 and a direction perpendicular to the tensile direction of the second mask sheet 133-2 may form a straight line. On the other hand, among the plurality of second openings 133-4, the centers of second openings 133-4 arranged with each other in the other one selected from the tensile direction of the second mask sheet 133-2 and the direction perpendicular to the tensile direction of the second mask sheet 133-2 may be arranged with each other in a serpentine shape (or a zigzag shape). However, hereinafter, for convenience of description, a case where the centers of the some of the plurality of second openings 133-4 form a straight line and the centers of the other ones of the plurality of second openings 133-4 do not form a straight line will be mainly described in more detail. The plurality of second openings 133-4 may be rectangular.

The second mask sheet 133-2 may be fixed to a second mask frame in a state where a tensile force is applied to the second mask sheet 133-2, as described above. In this case, when the plurality of second openings 133-4 are all tilted in the same direction with respect to a tensile direction of the second mask sheet 133-2, deformation of the second mask sheet 133-2 may exceed a predictable range because degrees of deformation between the right and left or the front and back of the second mask sheet 133-2 are different from each other. For example, in the above case, one portion of the second mask sheet 133-2 is largely deformed and the other portion of the second mask sheet 133-2 is not deformed or slightly deformed so that the shape of a second opening 133-4 may be distorted or the shape of the some of the plurality of second openings 133-4 and the shape of the other ones of the plurality of second openings 133-4 may be different from each other. Furthermore, in the above case, the centers of the some of the plurality of second openings 133-4 may not be on a line.

However, as described above, the some of the plurality of second openings 133-4 and the other ones of the plurality of second openings 133-4 are formed on the second mask sheet 133-2 by being tilted in different directions with respect to the tensile direction of the second mask sheet 133-2. Therefore, the degree of deformation of the second mask sheet 133-2 during tensioning of the second mask sheet 133-2 may be uniformly maintained throughout the entire second mask sheet 133-2. For example, it is possible to induce uniform deformation throughout the second mask sheet 133-2 by tilting second openings 133-4 adjacent to each other in different directions with respect to the tensile direction of the second mask sheet 133-2.

The third deposition unit 140 may deposit a third deposition material on the display substrate D on which the first intermediate layer and the second intermediate layer are formed to form the third intermediate layer. Here, the first intermediate layer, the second intermediate layer, and the third intermediate layer may be arranged so as not to overlap each other on a plane. The third deposition unit 140 may be similar to the first deposition unit 120. The third deposition unit 140 may include a third mask sheet 143-2 including a plurality of third openings 143-4. In this case, the third mask sheet 143-2 may be similar to the second mask sheet 133-2, and the third openings 143-4 may be arranged with each other similarly to the second openings 133-4. However, when the second mask sheet 133-2 and the third mask sheet 143-2 are arranged to be stacked on each other, the second mask sheet 133-2 and the third mask sheet 143-2 may be manufactured such that the second openings 133-4 and the third openings 143-4 do not overlap each other.

The unloading unit 150 temporarily stores the display substrate D on which the first intermediate layer, the second intermediate layer, and the third intermediate layer are respectively formed, and may unload the display substrate D to the outside or may transfer the display substrate D to another device. The unloading unit 150 may include a robot arm and/or the like for transferring the display substrate D therein.

As described above, the display substrate D, on which the first intermediate layer, the second intermediate layer, and the third intermediate layer are respectively formed, may be manufactured as the display device by forming the opposite electrode on the first intermediate layer, the second intermediate layer, and the third intermediate layer, and by forming the thin-film encapsulation layer.

Referring to the operation of the display device manufacturing apparatus 100, the display device manufacturing apparatus 100 may manufacture the first sub-pixel, the second sub-pixel, and the third sub-pixel in various suitable orders as described above. However, hereinafter, for convenience of description, a case where the display device manufacturing apparatus 100 sequentially manufactures the first sub-pixel F1, the second sub-pixel F2, and the third sub-pixel F3 shown in FIGS. 1B to 3 will be mainly described in more detail.

After the display substrate D is transferred to the loading unit 110, the loading unit 110 may transfer the display substrate D to the first deposition unit 120.

The first deposition unit 120 may supply the first deposition material to the first deposition source 122 to form the first intermediate layer on the display substrate D. The first deposition material may be deposited on the display substrate D through the first openings 123-4. In this case, the first intermediate layer may have a square shape that is tilted with respect to the tensile direction of the first mask sheet 123-2.

After the above process is completed, the display substrate D is transferred from the first deposition unit 120 to the second deposition unit 130 and then the second deposition material may be deposited on the display substrate D in the second deposition unit 130. The second deposition unit 130 may form a pair of adjacent second intermediate layers which are tilted in different directions with respect to the tensile direction of the second mask sheet 133-2 on the display substrate D.

Thereafter, the display substrate D may be transferred from the second deposition unit 130 to the third deposition unit 140. The third deposition unit 140 may supply the third deposition material to the display substrate D and the third deposition material that has passed through the third openings 143-4 may be deposited on the display substrate D. The third deposition unit 140 may form a pair of adjacent third intermediate layers which are tilted in different directions with respect to the tensile direction of the third mask sheet 143-2 on the display substrate D.

The display substrate D on which the first intermediate layer, the second intermediate layer, and the third intermediate layer are formed may be taken out through the unloading unit 150 or may be supplied to a device for the next operation. Thereafter, the opposite electrode and the thin-film encapsulation layer may be formed on the display substrate D to complete the manufacture of the display device.

Therefore, according to the display device manufacturing apparatus 100 and a method (hereinafter, referred to as a display device manufacturing method) of manufacturing a display device, it is possible to manufacture the display device having an accurate deposition pattern.

Furthermore, according to the display device manufacturing apparatus 100 and the display device manufacturing method, it is possible to reduce an error between a design pattern and an actual deposition pattern that may occur during manufacturing.

Figure 10:
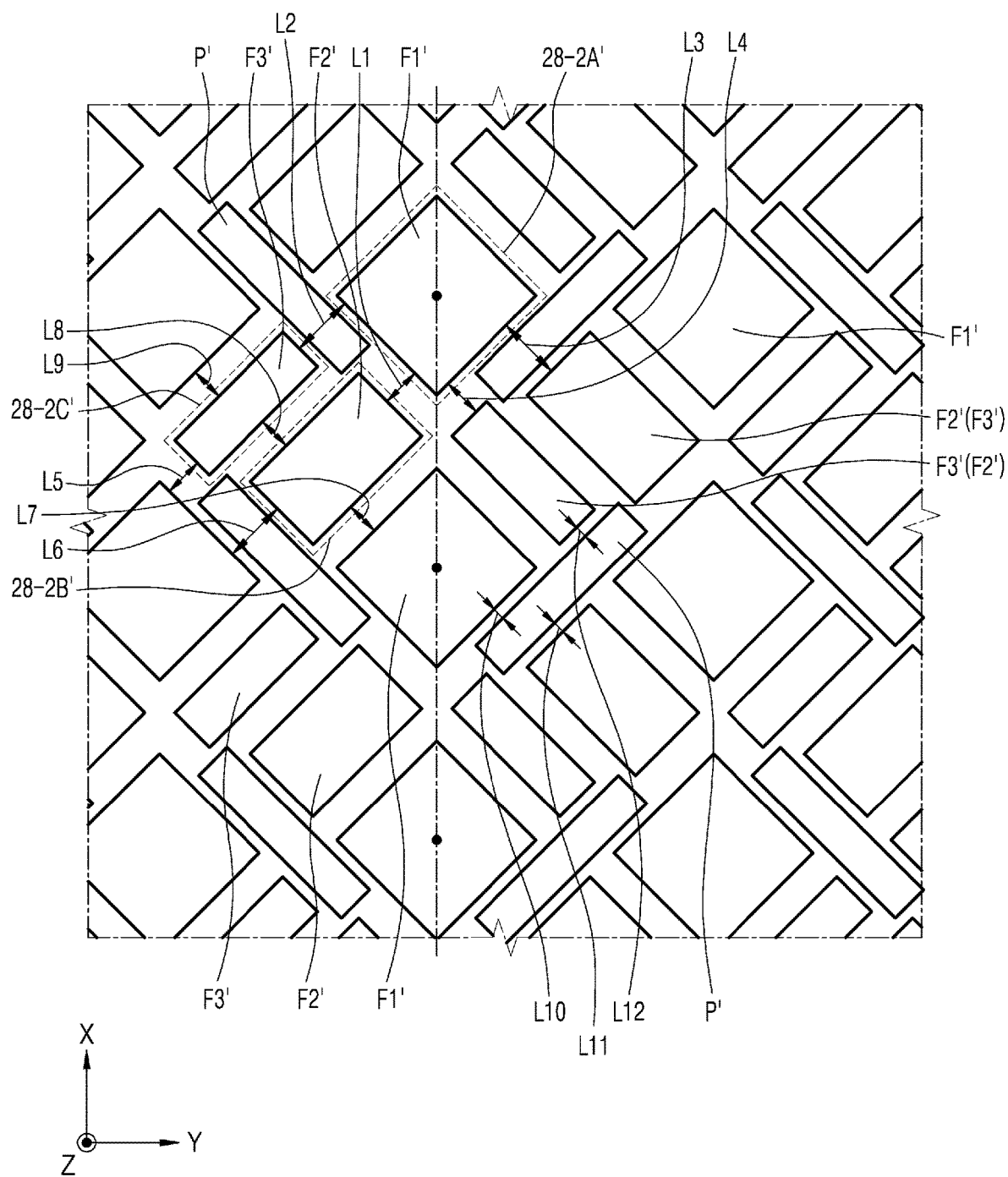
FIG. 10 is a plan view illustrating a first sub-pixel, a second sub-pixel, and a third sub-pixel of a display device according to another embodiment.
Figure 11:
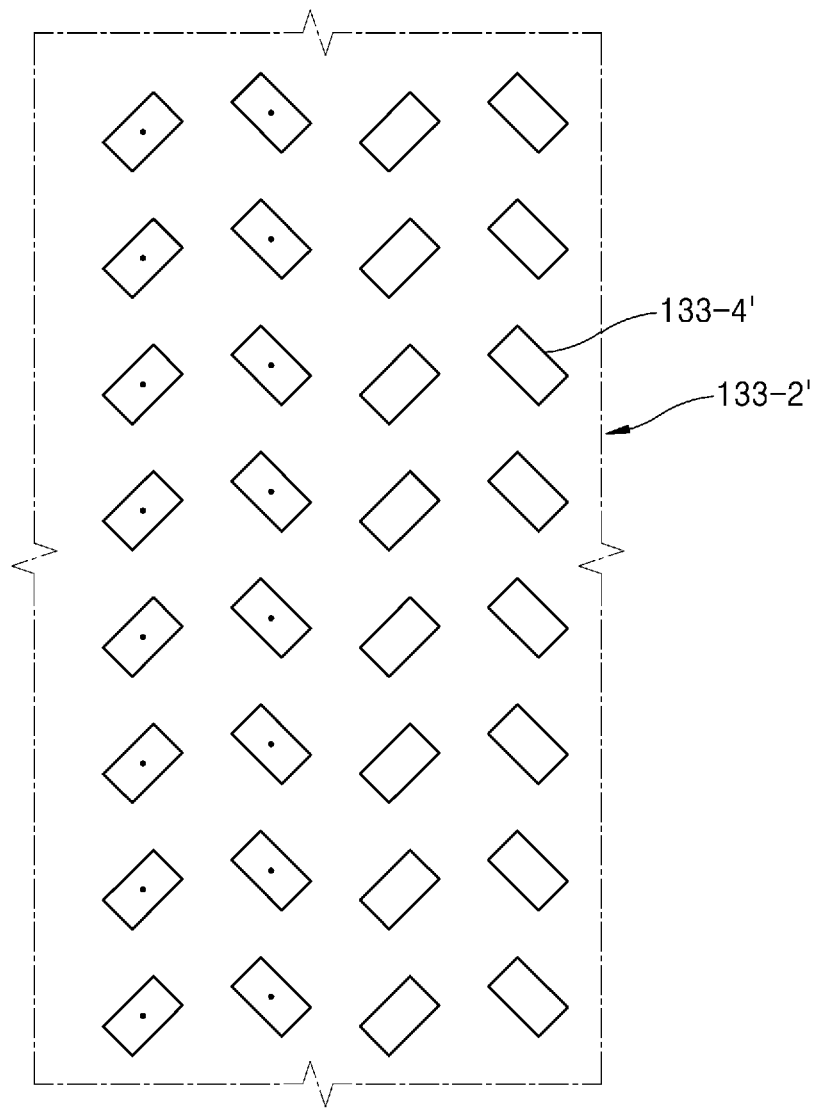
FIG. 11 is a plan view of a portion of a second mask sheet for depositing a second intermediate layer shown in FIG. 10.
Figure 12:
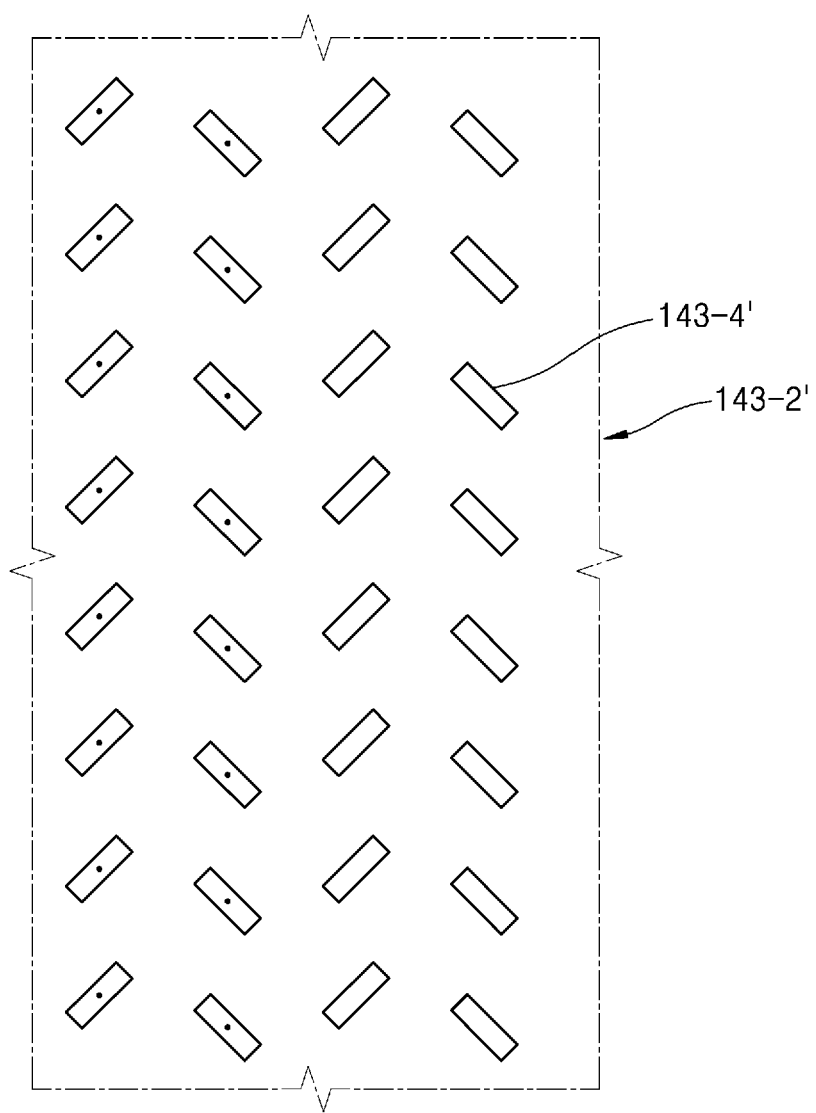
FIG. 12 is a plan view of a portion of a third mask sheet for depositing a third intermediate layer shown in FIG. 10.

FIG. 10 is a plan view illustrating a first sub-pixel, a second sub-pixel, and a third sub-pixel of a display device according to another embodiment. FIG. 11 is a plan view of a portion of a second mask sheet for depositing a second intermediate layer shown in FIG. 10. FIG. 12 is a plan view of a portion of a third mask sheet for depositing a third intermediate layer shown in FIG. 10.

Referring to FIGS. 10 to 12, a display device may include a display area and a non-display area defined on a substrate, the non-display area being around the display area. A plurality of sub-pixels including a first sub-pixel F1', a second sub-pixel F2', and a third sub-pixel F3' may be arranged in the display area, and a power line may be arranged in the non-display area. In addition, a pad portion may be arranged in the non-display area. The display device may include a display substrate, an intermediate layer arranged in the display area, an opposite electrode, and a thin-film encapsulation layer.

The first sub-pixel F1', the second sub-pixel F2', and the third sub-pixel F3' may emit light of different colors. For example, one selected from the first sub-pixel F1', the second sub-pixel F2', and the third sub-pixel F3' is to emit blue light, another one selected from the first sub-pixel F1', the second sub-pixel F2', and the third sub-pixel F3' is to emit red light, and the remaining one selected from the first sub-pixel F1', the second sub-pixel F2', and the third sub-pixel F3' is to emit green light.

One selected from the first sub-pixel F1', the second sub-pixel F2', and the third sub-pixel F3' may be square, and the other two may be rectangular.

Hereinafter, for convenience of description, a case where the first sub-pixel F1' is square and is to emit red light, the second sub-pixel F2' is rectangular and is to emit green light, and the third sub-pixel F3' is rectangular and is to emit blue light will be mainly described in more detail.

The first sub-pixel F1' as described above may include a first intermediate layer 28-2A', and the first intermediate layer 28-2A' may correspond to the shape and position of the first sub-pixel F1'. The planar area of the first intermediate layer 28-2A' may be equal to or greater than the planar area of the first sub-pixel F1', and the first sub-pixel F1' may be arranged inside the first intermediate layer 28-2A' (e.g., may be arranged inside the first intermediate layer 28-2A' in the plan view).

The second sub-pixel F2' may include a second intermediate layer 28-2B'. In addition, the second intermediate layer 28-2B' may correspond to the shape and position of the second sub-pixel F2'. The second sub-pixel F2' may be arranged (e.g., arranged in the plan view) inside the second intermediate layer 28-2B'.

The third sub-pixel F3' may include a third intermediate layer 28-2C'. In addition, the third intermediate layer 28-2C' may correspond to the shape and position of the third sub-pixel F3'. The third sub-pixel F3' may be arranged (e.g., arranged in the plan view) inside the third intermediate layer 28-2C'.

The planar area of the second sub-pixel F2' and the planar area of the third sub-pixel F3' may vary (e.g., may vary relative to each other).

In an embodiment, the planar areas of some of a plurality of second sub-pixels F2' may be different from the planar areas of the other ones of the plurality of second sub-pixels F2', and the planar areas of some of a plurality of third sub-pixels F3' may be different from the planar areas of the other ones of the plurality of third sub-pixels F3'.

In another embodiment, the planar areas of the plurality of second sub-pixels F2' may be the same and the planar areas of the plurality of third sub-pixels F3' may be the same. In this case, the planar area of each of the second sub-pixels F2' and the planar area of each of the third sub-pixels F3' may be different from each other. For example, one selected from the planar area of the second sub-pixel F2' and the planar area of the third sub-pixel F3' may be less than the other one selected from the planar area of the second sub-pixel F2' and the planar area of the third sub-pixel F3'. In an embodiment, the planar area of the second sub-pixel F2' may be less than the planar area of the third sub-pixel F3'. In another embodiment, the planar area of the third sub-pixel F3' may be less than the planar area of the second sub-pixel F2'. Therefore, it is possible to adjust an aperture ratio of light emitted from each sub-pixel.

In this case, the long side of the second sub-pixel F2' and the long side of the third sub-pixel F3' may have the same length. However, the length of the short side of the second sub-pixel F2' and the length of the short side of the third sub-pixel F3' may be different from each other.

As described above, the adjustment of the area of at least one selected from the first sub-pixel F1', the second sub-pixel F2', and the third sub-pixel F3' may be achieved by adjusting an area where a pixel-defining layer exposes a pixel electrode. In this case, the areas and shapes of the first intermediate layer 28-2A', the second intermediate layer 28-2B', and the third intermediate layer 28-2C' formed by being respectively deposited on the first sub-pixel F1', the second sub-pixel F2', and the third sub-pixel F3' may correspond to the areas and shapes of the first sub-pixel F1', the second sub-pixel F2', and the third sub-pixel F3', respectively, to prevent the sub-pixels from overlapping each other or to reduce the amount of such overlap.

A second mask sheet 133-2' and a third mask sheet 143-2' may be utilized to form the second intermediate layer 28-2B' and the third intermediate layer 28-2C' as described above. The second mask sheet 133-2' may have a plurality of second openings 133-4', and the third mask sheet 143-2' may have a plurality of third openings 143-4'. In this case, the area (e.g., planar area) of each of the second openings 133-4 'and the area (e.g., planar area) of each of the third openings 143-4' may be different from each other. For example, the area of each of the second openings 133-4' and the area of each of the third openings 143-4' may correspond to the area of the second intermediate layer 28-2B' and the area of the third intermediate layer 28-2C', respectively. The relationship between each sub-pixel, each intermediate layer, and each opening as described above may be applicable to one or more other embodiments of the present disclosure.

Two second openings 133-4' adjacent (e.g., adjacent in a second direction, for example, the Y-axis direction) to each other among the second openings 133-4' may be arranged in a state of being tilted in opposite directions with respect to a tensile direction of the second mask sheet 133-2'. For example, one of the two adjacent second openings 133-4' may be tilted away from the tensile direction (e.g., the X-axis direction) in one direction (e.g., one angular direction, for example, a clockwise direction), and the other one of the two adjacent second openings 133-4' may be tilted away from the tensile direction in another direction (e.g., another angular direction, for example, a counter-clockwise direction). Furthermore, two third openings 143-4' adjacent (e.g., adjacent in the second direction, for example, the Y-axis direction) to each other among the third openings 143-4' may be arranged in a state of being tilted in the opposite directions with respect to a tensile direction of the third mask sheet 143-2'.

As described above, even when the second mask sheet 133-2' and the third mask sheet 143-2' are under tension, shapes of the second openings 133-4' and the third openings 143-4' are maintained substantially similar to the initial shapes (e.g., their respective initial shapes) and may be moved within a predictable range to some extent when positions of the second openings 133-4' and the third opening 143-4' are variable in the initial position. Therefore, it is somewhat possible to correct (e.g., it is possible to at least partially correct) a pattern when depositing a second deposition material and a third deposition material on the display substrate in the future.

A spacer P' may be arranged between some sub-pixels of the plurality of sub-pixels. In this case, the spacer P' is the same as or similar to that described with reference to FIGS. 1B to 3, and thus, a more detailed description thereof may not be provided. In addition to the above case, the arrangement of each sub-pixel, a distance from the edge of a sub-pixel to the edge of another sub-pixel(s), a distance from the edge of the spacer P' to the edge of each sub-pixel, etc. may be the same as those described above with reference to FIGS. 1B to 3, and thus, more detailed descriptions thereof may not be provided.

The display device may be fixed to a device or the like that is to move a user, such as a vehicle. The display device may be fixed to the device to form a certain angle different from 0 degrees between a user's viewing direction and the first direction and/or the second direction. For example, the display device may be arranged such that the user's viewing direction of the display device and the first direction or the second direction form an angle of 90 degrees.

In the above case, when a user looks at the display device, an inclined portion of a pixel-defining layer is not perpendicular to the user's viewing direction. Accordingly, external light may be prevented from being reflected through (e.g., reflected from) the inclined portion of the pixel-defining layer and being incident on the user's eyes, or the amount of external light reflected through the inclined portion of the pixel-defining layer may be reduced.

Further, the display device may implement a precise (e.g., correct or intended) image through each sub-pixel.

The display device may be manufactured through a manufacturing apparatus of the display device. The display device manufacturing apparatus may be formed similar to that shown in FIGS. 4 and 5. In this case, a second deposition unit may form the first intermediate layer 28-2A' by utilizing the first mask assembly 123 shown in FIG. 6. The second intermediate layer 28-2B' and the third intermediate layer 28-2C' may be formed on the display substrate through deposition materials passing through the second opening 133-4' and the third opening 143-4', respectively, by utilizing the second mask sheet 133-2' and the third mask sheet 143-2', respectively.

According to the display device manufacturing apparatus and the display device manufacturing method, a display device having a precise deposition pattern may be manufactured by reducing the deformation of each mask sheet.

Furthermore, according to the display device manufacturing apparatus and the display device manufacturing method, it is possible to reduce an error between a design pattern (e.g., an intended deposition pattern) and an actual deposition pattern that may occur during manufacturing.

Figure 13:
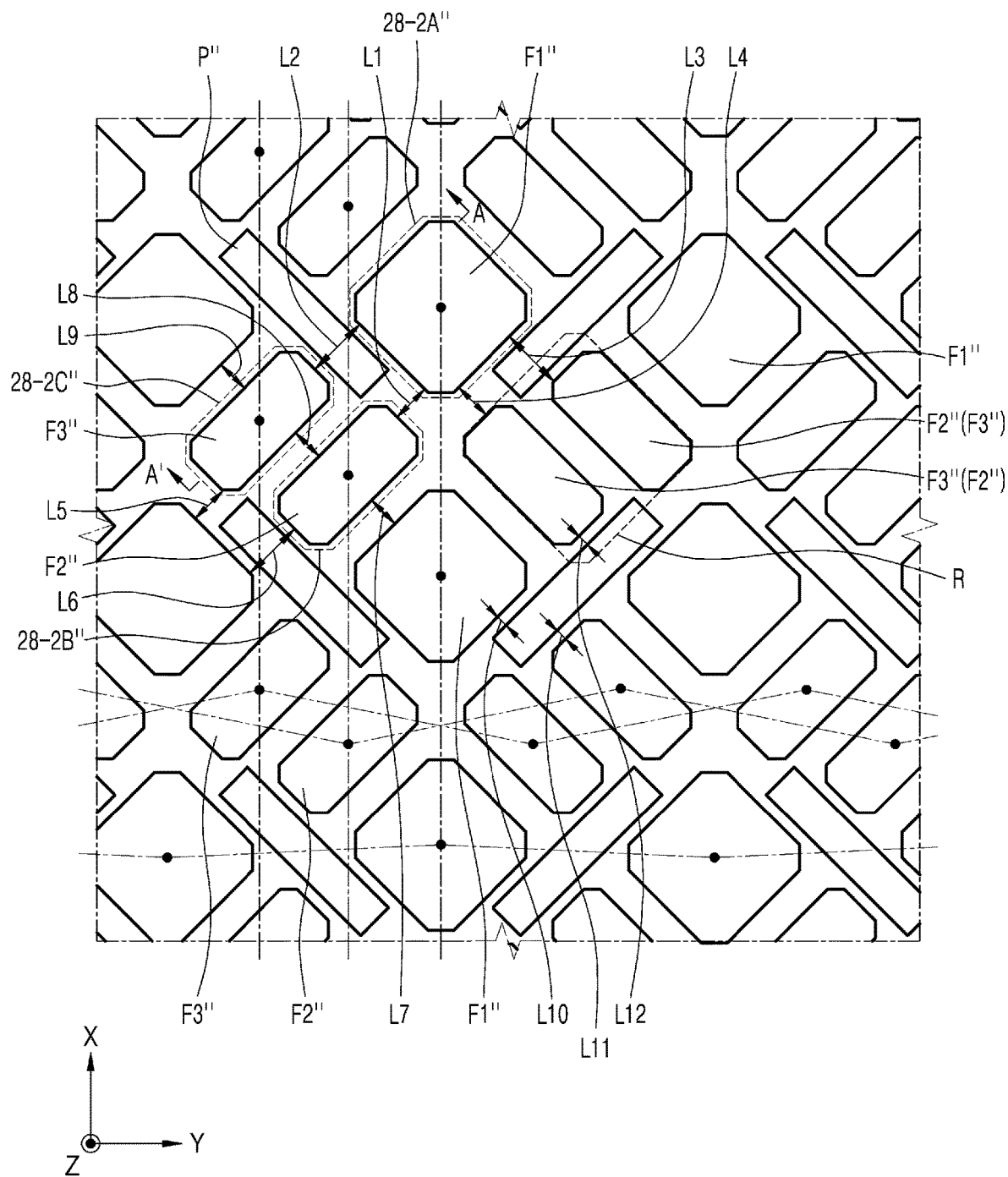
FIG. 13 is a plan view illustrating a first sub-pixel, a second sub-pixel, and a third sub-pixel of a display device according to another embodiment.
Figure 14:
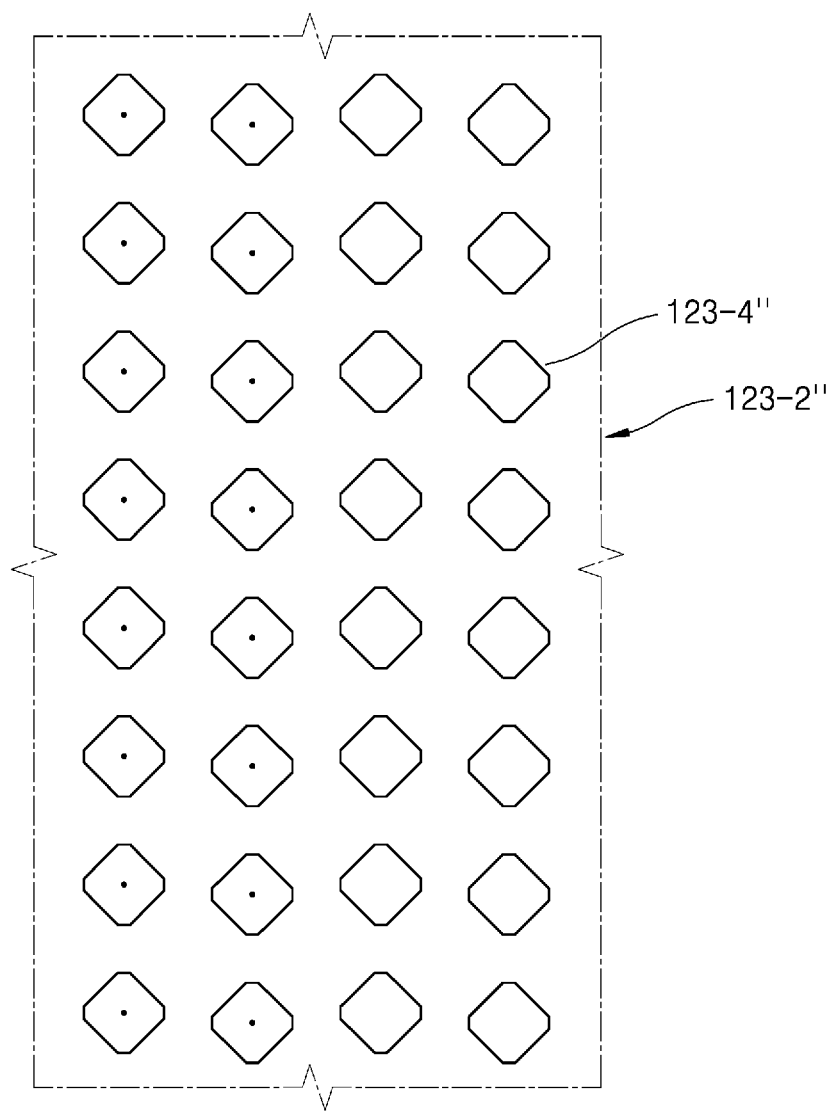
FIG. 14 is a plan view of a portion of a first mask sheet for depositing a first intermediate layer shown in FIG. 13.
Figure 15:
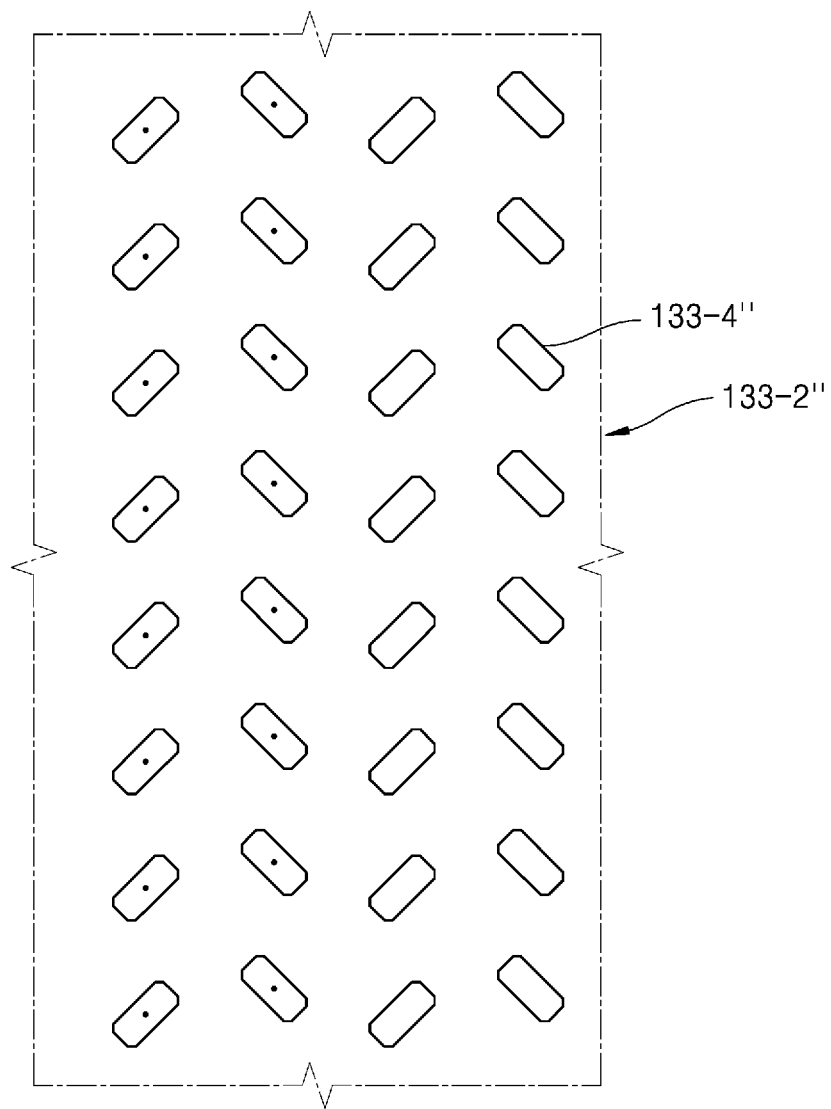
FIG. 15 is a plan view of a portion of a second mask sheet for depositing a second intermediate layer shown in FIG. 13.
Figure 16:
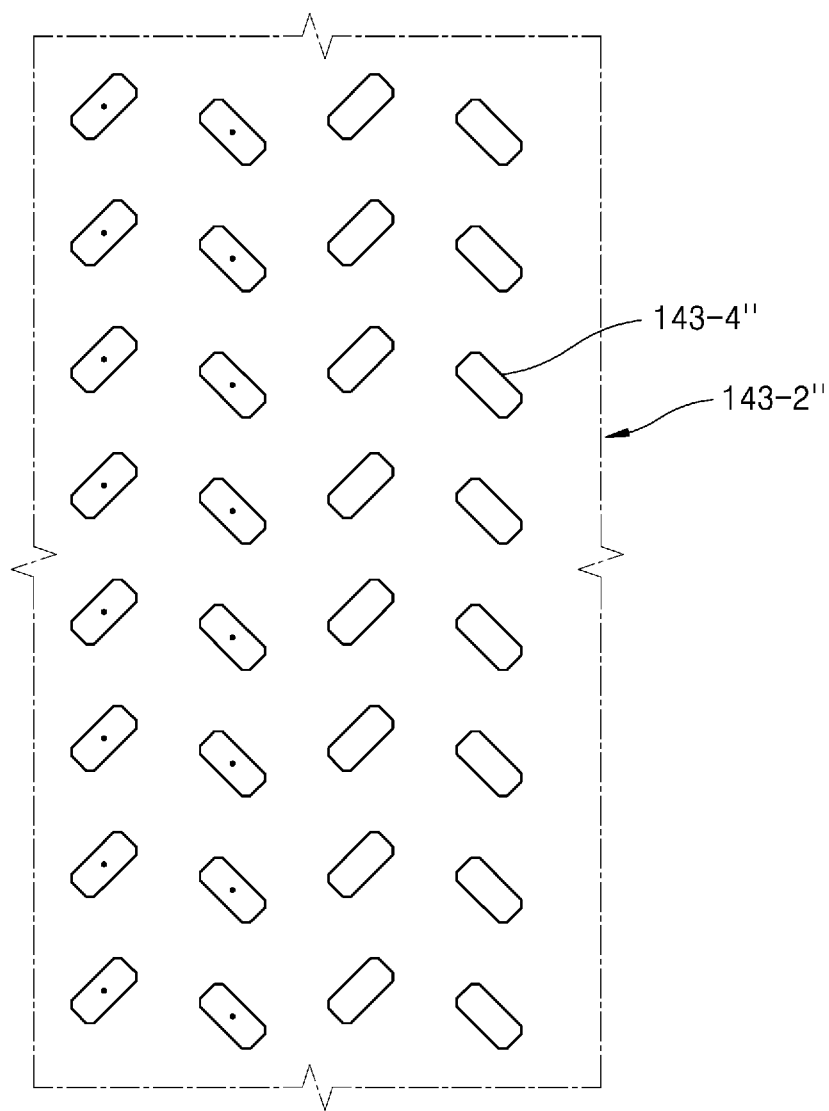
FIG. 16 is a plan view of a portion of a third mask sheet for depositing a third intermediate layer shown in FIG. 13.

FIG. 13 is a plan view illustrating a first sub-pixel, a second sub-pixel, and a third sub-pixel of a display device according to another embodiment. FIG. 14 is a plan view of a portion of a first mask sheet for depositing a first intermediate layer shown in FIG. 13. FIG. 15 is a plan view of a portion of a second mask sheet for depositing a second intermediate layer shown in FIG. 13. FIG. 16 is a plan view of a portion of a third mask sheet for depositing a third intermediate layer shown in FIG. 13.

Referring to FIGS. 13 to 16, a display device may include a display area and a non-display area defined on a substrate, the non-display area being around the display area. A plurality of sub-pixels including a first sub-pixel F1", a second sub-pixel F2", and a third sub-pixel F3" may be arranged in the display area, and a power line may be arranged in the non-display area. In addition, a pad portion may be arranged in the non-display area. The display device may include a display substrate, an intermediate layer arranged in the display area, an opposite electrode, and a thin-film encapsulation layer. The display device is the same as or similar to that described above in FIG. 3, and thus, a more detailed description thereof will not be given herein.

The first sub-pixel F1", the second sub-pixel F2", and the third sub-pixel F3" may emit light of different colors. For example, one selected from the first sub-pixel F1", the second sub-pixel F2", and the third sub-pixel F3" may emit blue light, another one selected from the first sub-pixel F1", the second sub-pixel F2", and the third sub-pixel F3" may emit red light, and the remaining one selected from the first sub-pixel F1", the second sub-pixel F2", and the third sub-pixel F3" may emit green light.

One selected from the first sub-pixel F1", the second sub-pixel F2", and the third sub-pixel F3" may be square, and the other two may be rectangular.

Hereinafter, for convenience of description, a case where the first sub-pixel F1" is square and is to emit red light, the second sub-pixel F2" is rectangular and is to emit green light, and the third sub-pixel F3" is rectangular and is to emit blue light will be mainly described in more detail. In this case, the first sub-pixel F1", the second sub-pixel F2", and the third sub-pixel F3" may be similar to those described with reference to FIGS. 1B to 3. However, corners of each of the sub-pixels may be chamfered. For example, corner portions of each of the sub-pixels may be rounded or inclined.

The first sub-pixel F1" as described above may be arranged (e.g., arranged in the plan view) inside a first intermediate layer 28-2A", and the first intermediate layer 28-2A" may correspond (e.g., correspond in the plan view) to the shape and position of the first sub-pixel F1". The planar area of the first intermediate layer 28-2A" may be equal to or greater than the planar area of the first sub-pixel F1".

The second sub-pixel F2" includes a second intermediate layer 28-2B". In addition, the second intermediate layer 28-2B" may correspond (e.g., correspond in the plan view) to the shape and position of the second sub-pixel F2". The second sub-pixel F2" may be arranged (e.g., arranged in the plan view) inside the second intermediate layer 28-2B".

The third sub-pixel F3" includes a third intermediate layer 28-2C". In addition, the third intermediate layer 28-2C" may correspond (e.g., correspond in the plan view) to the shape and position of the third sub-pixel F3". The third sub-pixel F3" may be arranged (e.g., arranged in the plan view) inside the third intermediate layer 28-2C".

A spacer P"' may be arranged among and/or between the sub-pixels as described above. The spacer P"' is the same as or similar to that described with reference to FIGS. 1B to 3, and thus, a more detailed description thereof may not be provided.

In order to manufacture the first sub-pixel F1", the second sub-pixel F2", and the third sub-pixel F3" as described above, the display substrate may be supplied to the display device manufacturing apparatus described with reference to FIGS. 4 and 5, or to a display device manufacturing apparatus similar to the one described with reference to FIGS. 4 and 5.

In this case, a first deposition unit may supply a first deposition material to the display substrate to form a first intermediate layer 28-2A", a second deposition unit may supply a second deposition material to the display substrate to form a second intermediate layer 28-2B", and a third deposition unit may supply a third deposition material to the display substrate to form a third intermediate layer 28-2C". For example, the first, second, and third deposition units may respectively correspond to the second, third, and fourth deposition units 120, 130, and 140 of the display device manufacturing apparatus 100 described with reference to FIG. 4.

In this case, a first mask sheet 123-2" utilized in the first deposition unit may have a first opening 123-4" formed to correspond to a shape of the first sub-pixel F1". In this case, the planar area of the first opening 123-4" may be equal to or greater than the planar area of a corresponding first sub-pixel F1". Furthermore, the planar area of the first opening 123-4" may be less than the planar area of the first intermediate layer 28-2A" formed by depositing the first deposition material having passed through the first opening 123-4" on the display substrate. A shape of the first opening 123-4", a shape of the first intermediate layer 28-2A", and a shape of the first sub-pixel F1", which correspond (e.g., mutually correspond) to each other, may be the same and may be square.

A second opening 133-4" of a second mask sheet 133-2" utilized in the second deposition unit may be formed to correspond to a shape of the second sub-pixel F2". The second opening 133-4" may be arranged in the same manner as the arrangement of the second sub-pixel F2". In this case, the planar area of the second opening 133-4" may be equal to or greater than the planar area of the second sub-pixel F2", and may be less than the planar area of the second intermediate layer 28-2B" formed by depositing the second deposition material on the display substrate.

A third opening 143-4" of a third mask sheet 143-2" utilized in the third deposition unit is also formed to correspond to the shape of the third sub-pixel F3", and the planar area of the third opening 143-4" may be equal to or greater than the planar area of the third sub-pixel F3". Furthermore, the planar area of the third opening 143-4" may be less than the planar area of the third intermediate layer 28-2C".

In this case, a relationship among the first sub-pixel F1", the second sub-pixel F2", and the third sub-pixel F3" may be similar to those described with reference to FIGS. 1B to 3. A relationship among and/or between the first intermediate layer 28-2A", the second intermediate layer 28-2B", and the third intermediate layer 28-2C" may be the same as the relationship among and/or between the first sub-pixel F1", the second sub-pixel F2", and the third sub-pixel F3".

For example, the centers of some of the plurality of second sub-pixels F2" may be on (e.g., arranged with each other on) a straight line in one direction, and the centers of the other ones of the plurality of second sub-pixels F2" may be arranged with each other in a serpentine (or zigzag) shape in another direction. Furthermore, the centers of some of a plurality of third sub-pixels F3" may be arranged with each other on a straight line (e.g., a straight line in one direction), and the centers of the other ones of the plurality of third sub-pixels F3" may be arranged with each other in a serpentine (or zigzag) shape in another direction. The centers of the plurality of first sub-pixels F1" may be on (e.g., arranged with each other on) a straight line in a direction different from the one direction. In some embodiments, the centers of some of the plurality of first sub-pixels F1" may be arranged with each other on a straight line in the one direction.

In addition, the second sub-pixel F2" and the third sub-pixel F3" facing the same first sub-pixel F1" (e.g., the second sub-pixel F2" facing one side of the first sub-pixel F1" and the third sub-pixel F3" facing another side of the first sub-pixel F1") may be tilted in opposite directions with respect to a tensile direction of the second mask sheet 133-2" and a tensile direction (e.g., X-axis direction) of the third mask sheet 143-2". In this case, the second sub-pixels F2" adjacent (e.g., adjacent in a direction perpendicular to the tensile direction, for example, the Y-axis direction) to each other may form an angle of 45 degrees with respect to the tensile direction of the second mask sheet 133-2" in opposite directions, respectively. Also, the second openings 133-4" formed in the second mask sheet 133-2" and adjacent to each other may form an angle of 45 degrees with respect to the tensile direction of the second mask sheet 133-2". The third sub-pixels F3" adjacent (e.g., adjacent in a direction perpendicular to the tensile direction, for example, the Y-axis direction) to each other may form an angle of 45 degrees with respect to the tensile direction of the third mask sheet 143-2" in opposite directions, respectively. Also, the third openings 143-4" formed in the third mask sheet 143-2" and adjacent to each other may form an angle of 45 degrees with respect to the tensile direction of the third mask sheet 143-2". The second intermediate layer 28-2B" and the third intermediate layer 28-2C" may be arranged on the display substrate at positions corresponding to the second opening 133-4" and the third opening 143-4", respectively.

The display device may be fixed to a device such as a vehicle that is for moving a user. The display device may be fixed to the device to form an angle different from 0 degrees between a user's viewing direction and the first direction and/or the second direction. For example, the display device may be arranged so that the user's viewing direction of the display device and the first direction or the second direction form an angle of 90 degrees.

In the above case, when a user looks at the display device, an inclined portion of the pixel-defining layer is not perpendicular to the user's viewing direction. Accordingly, external light may be prevented from being reflected through (e.g., reflected from) the inclined portion of the pixel-defining layer and being incident on the user's eyes, or the amount of external light reflected through the inclined portion of the pixel-defining layer may be reduced.

Furthermore, the display device may implement a precise image through each sub-pixel.

According to the display device manufacturing apparatus and the display device manufacturing method, it is possible to manufacture the display device having an accurate deposition pattern.

Furthermore, according to the display device manufacturing apparatus and the display device manufacturing method, it is possible to reduce an error between a design pattern (e.g., an intended deposition pattern) and an actual deposition pattern that may occur during manufacturing, for example, as a result of tension applied to the mask sheets.

Figure 17:
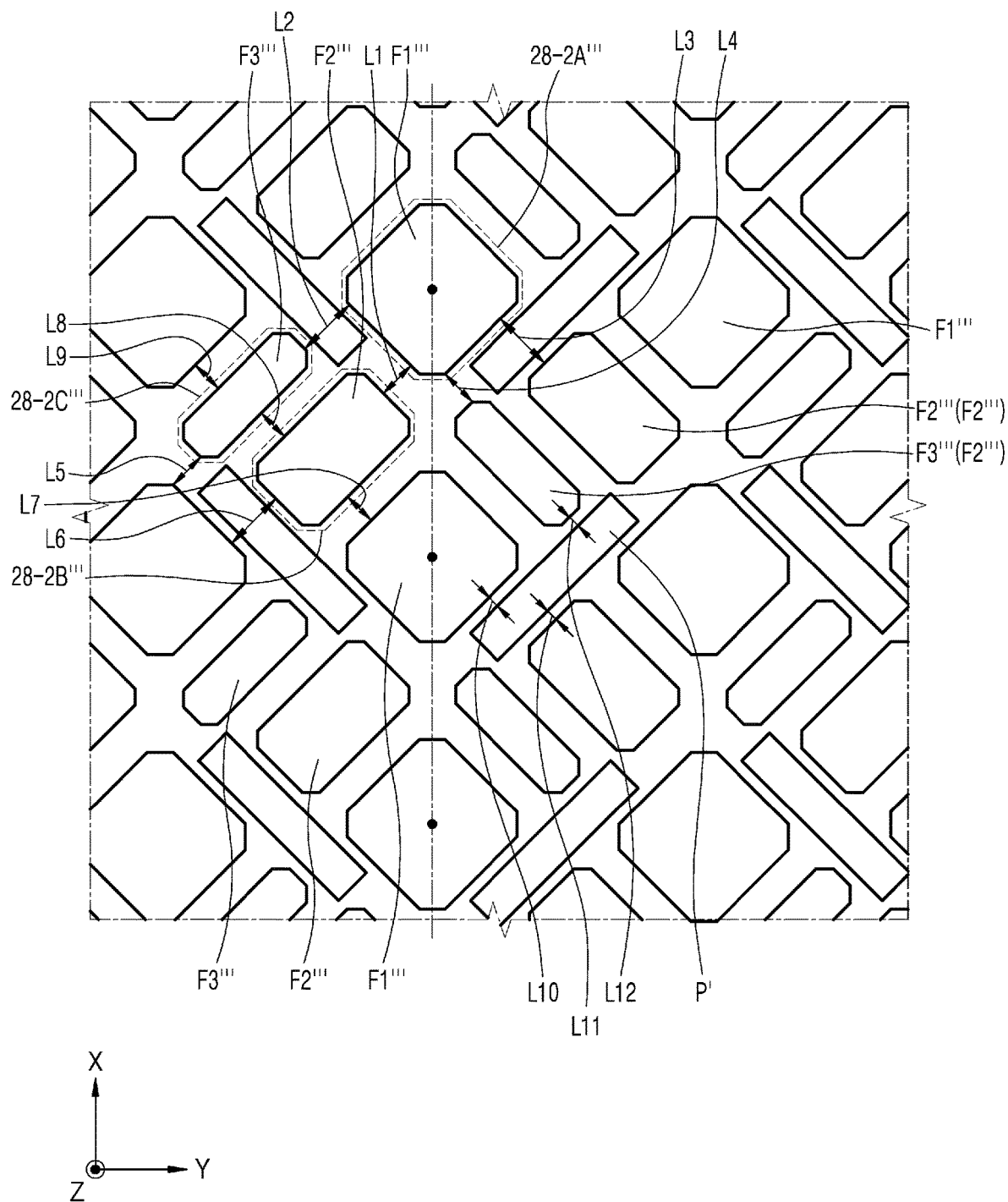
FIG. 17 is a plan view illustrating a first sub-pixel, a second sub-pixel, and a third sub-pixel of a display device according to another embodiment.
Figure 18:
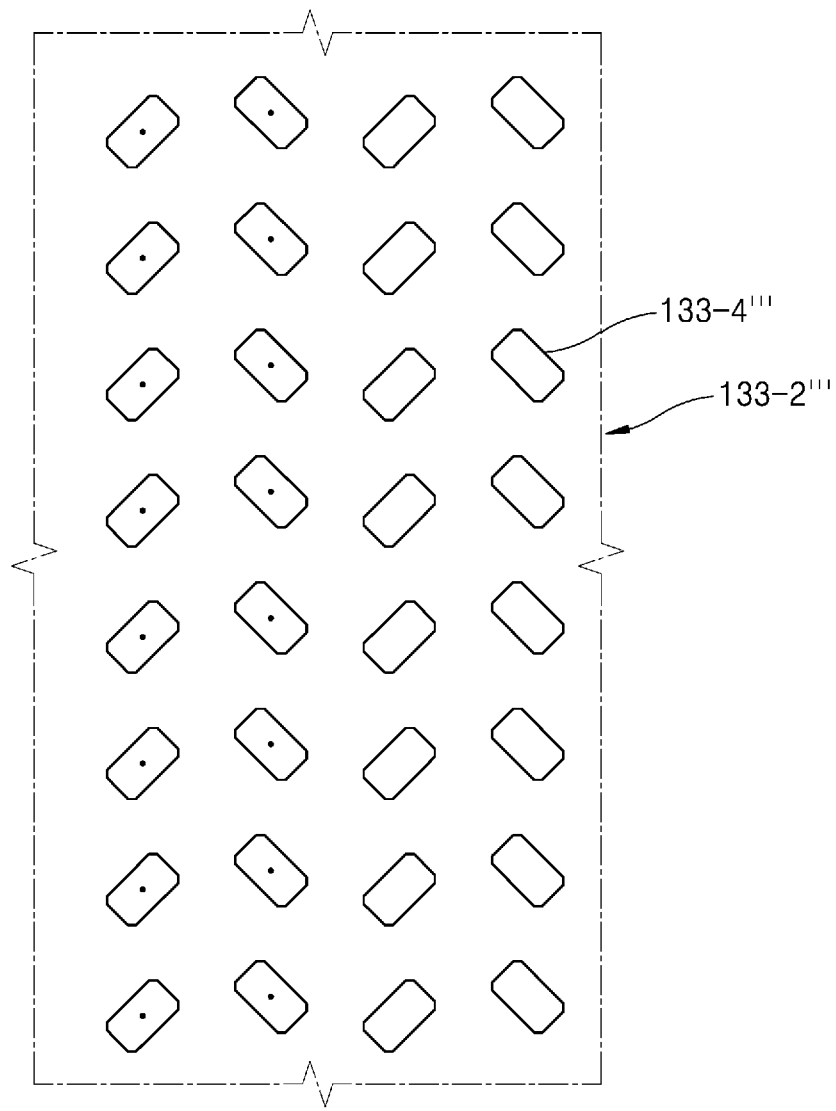
FIG. 18 is a plan view of a portion of a second mask sheet for depositing a second intermediate layer shown in FIG. 17.
Figure 19:
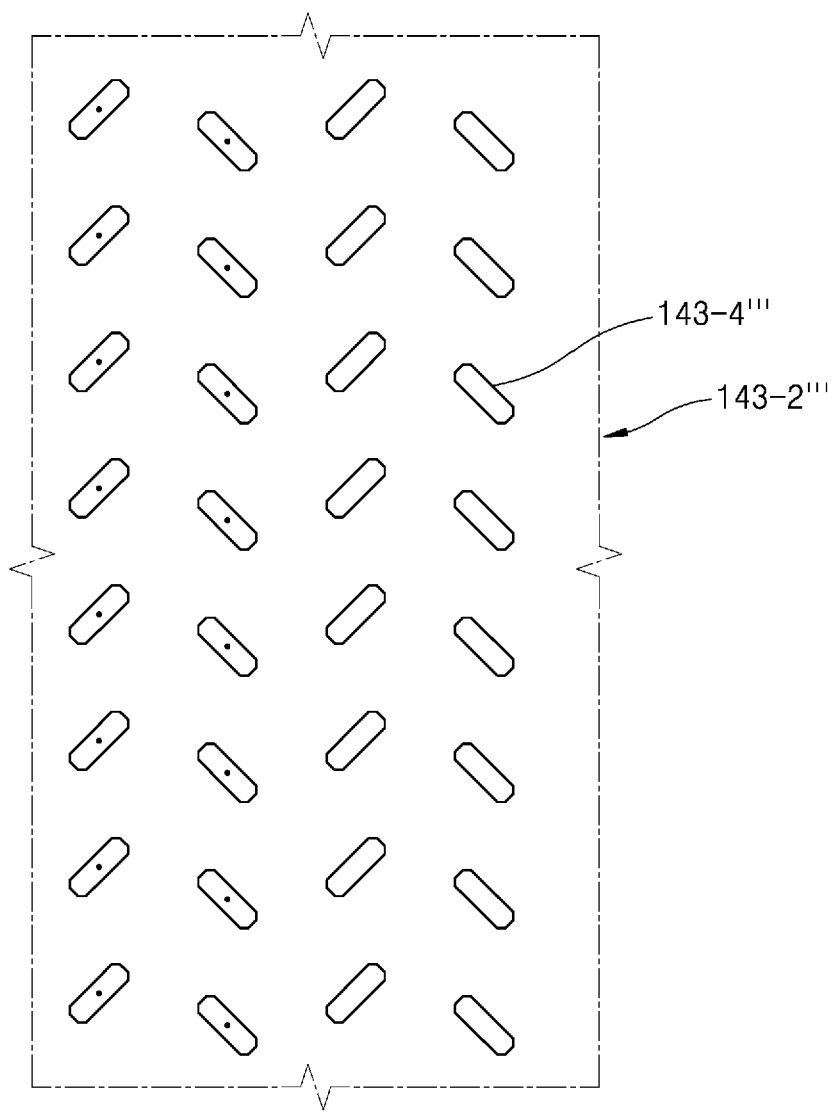
FIG. 19 is a plan view of a portion of a third mask sheet for depositing a third intermediate layer shown in FIG. 17.

FIG. 17 is a plan view illustrating a first sub-pixel, a second sub-pixel, and a third sub-pixel of a display device according to another embodiment. FIG. 18 is a plan view of a portion of a second mask sheet for depositing a second intermediate layer shown in FIG. 17. FIG. 19 is a plan view of a portion of a third mask sheet for depositing a third intermediate layer shown in FIG. 17.

Referring to FIGS. 17 to 19, a display device may include a display area and a non-display area defined on a substrate, the non-display area being around the display area. A plurality of sub-pixels including a first sub-pixel F1''', a second sub-pixel F1''', and a third sub-pixel F3''' may be arranged in the display area, and a power line may be arranged in the non-display area. In addition, a pad portion may be arranged in the non-display area. The display device may include a display substrate, an intermediate layer arranged in the display area, an opposite electrode, and a thin-film encapsulation layer.

The first sub-pixel F1''', the second sub-pixel F1''', and the third sub-pixel F3''' may emit light of different colors. For example, one selected from the first sub-pixel F1''', the second sub-pixel F1''', and the third sub-pixel F3''' may emit blue light, another one selected from the first sub-pixel F1''', the second sub-pixel F1''', and the third sub-pixel F3''' may emit red light, and the remaining one selected from the first sub-pixel F1''', the second sub-pixel F1''', and the third sub-pixel F3''' may emit green light.

One selected from the first sub-pixel F1''', the second sub-pixel F1''', and the third sub-pixel F3''' may be square, and the other two may be rectangular.

Hereinafter, for convenience of description, a case where the first sub-pixel F1''' is square and is to emit red light, the second sub-pixel F2''' is rectangular and is to emit green light, and the third sub-pixel F3''' is rectangular and is to emit blue light will be mainly described in more detail.

The first sub-pixel F1''' as described above may include a first intermediate layer 28-2A''', and the first intermediate layer 28-2A''' may correspond to the shape and position of the first sub-pixel F1'''. The planar area of the first intermediate layer 28-2A''' may be greater than the planar area of the first sub-pixel F1''', and the first sub-pixel F1''' may be arranged inside the first intermediate layer 28-2A'''.

The second sub-pixel F2''' may include a second intermediate layer 28-2B'''. In addition, the second intermediate layer 28-2B''' may correspond to the shape and position of the second sub-pixel F1'''. The second sub-pixel F2''' may be arranged inside the second intermediate layer 28-2B'''.

The third sub-pixel F3''' may include a third intermediate layer 28-2C'''. In addition, the third intermediate layer 28-2C''' may correspond to the shape and position of the third sub-pixel F3'''. The third sub-pixel F3''' may be arranged inside the third intermediate layer 28-2C'''.

The first sub-pixel F1''', the second sub-pixel F1''', and the third sub-pixel F3''' may be applied to the structures shown in FIGS. 1B to 3 in the same or similar manner, and may be arranged with each other the same as or similar to those described with reference to FIGS. 1B to 3.

At least one selected from the first sub-pixel F1''', the second sub-pixel F1''', and the third sub-pixel F3''' may have a chamfered edge (e.g., corner or vertex). For example, in an embodiment, one selected from a vertex of the first sub-pixel F1''', a vertex of the second sub-pixel F1''', and a vertex of the third sub-pixel F3''' may be chamfered, and the remaining two of them are not chamfered. In another embodiment, two selected from the vertex of the first sub-pixel F1''', the vertex of the second sub-pixel F1''', and the vertex of the third sub-pixel F3''' may be chamfered, and the remaining one of them may not be chamfered. In another embodiment, all of the vertex of the first sub-pixel F1''', the vertex of the second sub-pixel F1''', and the vertex of the third sub-pixel F3''' may be chamfered. Hereinafter, for convenience of description, a case where all of the vertex of the first sub-pixel F1''', the vertex of the second sub-pixel F1''', and the vertex of the third sub-pixel F3''' are chamfered will be mainly described in more detail.

In order to form the vertex of the first sub-pixel F1''', the vertex of the second sub-pixel F1''', and the vertex of the third sub-pixel F3''' that are chamfered as described above, a vertex (or corner) of a first opening of a first mask sheet, a vertex (or corner) of a second opening 133-4''' of a second mask sheet 133-2''', and a vertex (or corner) of a third opening 143-4''' of a third mask sheet 143-2''' may be chamfered. In this case, each of the first opening, the second opening 133-4''', and the third opening 143-4''' may be the same as or similar to an octagonal shape. For example, chamfered portions in the first opening, the second opening 133-4''', and the third opening 143-4''' may be rounded. The first opening may be formed as shown in FIG. 14, and the second opening 133-4''' and the third opening 143-4''' may be inclined as shown in FIGS. 18 and 19.

When the vertex of the first opening, the vertex of the second opening 133-4''', and the vertex of the third opening 143-4''' are chamfered as described above, stress may not be concentrated on the vertex of the first opening, the vertex of the second opening 133-4''', and the vertex of the third opening 143-4''' when the first mask sheet, the second mask sheet 133-2''', and the third mask sheet 143-2''' are respectively under tension. Therefore, when the first mask sheet, the second mask sheet 133-2''', and the third mask sheet 143-2''' are respectively under tension, damage to the first mask sheet, the second mask sheet 133-2''', and the third mask sheet 143-2''' may be prevented or reduced. In addition, because a first deposition material, a second deposition material, and a third deposition material are not deposited and do not clog at the vertex of the first opening, the vertex of the second opening 133-4''', and the vertex of the third opening 143-4''', the first intermediate layer 28-2A''', the second intermediate layer 28-2B''', and the third intermediate layer 28-2C''' having correct shapes may be formed.

The display device may be manufactured through a display device manufacturing apparatus of the same or similar type (e.g., kind) as the display device manufacturing apparatus shown in FIGS. 4 and 5 described above.

In this case, a first deposition unit may supply a first deposition material to the display substrate to form the first intermediate layer 28-2A''', a second deposition unit may supply a second deposition material to the display substrate to form the second intermediate layer 28-2B''', and a third deposition unit may supply a third deposition material to the display substrate to form the third intermediate layer 28-2C'''.

In this case, the first mask sheet utilized in the first deposition unit may have the first opening formed to correspond to the shape of the first sub-pixel F1'''. In this case, the planar area of the first opening may be equal to or greater than the planar area of a corresponding first sub-pixel F1'''. Also, the planar area of the first opening may be equal to or greater than the planar area of the corresponding first intermediate layer 28-2A''' formed by depositing the first deposition material having passed through the first opening on the display substrate. A shape of the first opening, a shape of the first intermediate layer 28-2A''', and a shape of the first sub-pixel F1''', which correspond to each other, may be the same and may be square.

A second opening 133-4''' of a second mask sheet 133-2''' utilized in the second deposition unit may be formed to correspond to the shape of the second sub-pixel F1'''. The second openings 133-4''' may be arranged in the same manner as the arrangement of the second sub-pixels F1'''. In this case, the planar area of the second opening 133-4''' may be equal to or greater than the planar area of the second sub-pixel F1''', and may be equal to or greater than the planar area of the second intermediate layer 28-2B''' formed by depositing the second deposition material on the display substrate.

A third opening 143-4''' of a third mask sheet 143-2''' utilized in the third deposition unit is also formed to correspond to the shape of the third sub-pixel F3''', and the planar area of the third opening 143-4''' may be equal to or greater than the planar area of the third sub-pixel F3'''. Furthermore, the planar area of the third opening 143-4''' may be equal to or greater than the planar area of the third intermediate layer 28-2C'''.

In this case, the first sub-pixel F1''', the second sub-pixel F2''' and the third sub-pixel F3''' may be similar to those described with reference to FIG. 1B to FIG. 3. A relationship among and/or between the first intermediate layer 28-2A''', the second intermediate layer 28-2B''', and the third intermediate layer 28-2C''' may be the same as the relationship among and/or between the first sub-pixel F1''', the second sub-pixel F1''', and the third sub-pixel F3'''.

For example, the centers of some of a plurality of second sub-pixels F2''' may be arranged with each other on a straight line in one direction, and the centers of the other ones of the plurality of second sub-pixels F2''' may be arranged with each other in a serpentine (or zigzag) shape in another direction. Furthermore, the centers of a portion of a plurality of third sub-pixels F3''' may be arranged with each other on a straight line, and the centers of another portion of the plurality of third sub-pixels F3''' may be arranged with each other in a serpentine (or zigzag) shape in another direction. The centers of a plurality of first sub-pixels F1''' may be on (e.g., arranged with each other on) a straight line in a direction different from the one direction. In some embodiments, the centers of some of a plurality of first sub-pixels F1''' may be arranged with each other on a straight line in the one direction.

In addition, the second sub-pixel F2''' and the third sub-pixel F3''' facing the same first sub-pixel F1''' (e.g., the second sub-pixel F2''' facing one side of the first sub-pixel F1''' and the third sub-pixel F3''' facing another side of the first sub-pixel F1''') may be tilted in opposite directions with respect to a tensile direction of the second mask sheet 133-2''' and a tensile direction of the third mask sheet 143-2'''. In this case, the second sub-pixels F2''' adjacent to each other may form an angle of 45 degrees with respect to the tensile direction of the second mask sheet 133-2''' in opposite directions, respectively. Also, the second openings 133-4''' formed in the second mask sheet 133-2''' and adjacent to each other may form an angle of 45 degrees with respect to the tensile direction of the second mask sheet 133-2'''. The third sub-pixels F3''' adjacent to each other may form an angle of 45 degrees with respect to the tensile direction of the third mask sheet 143-2''' in opposite directions, respectively. Also, the third openings 143-4''' formed in the third mask sheet 143-2''' and adjacent to each other may form an angle of 45 degrees with respect to the tensile direction of the third mask sheet 143-2'''. The second intermediate layer 28-2B''' and the third intermediate layer 28-2C''' may be arranged on the display substrate at positions corresponding to the second opening 133-4''' and the third opening 143-4''', respectively.

The display device may be fixed to a device or the like for moving a user, such as a vehicle. The display device may be fixed to the device to form a certain angle different from 0 degrees between a user's viewing direction and the first direction and/or the second direction. For example, the display device may be arranged such that the user's viewing direction of the display device and the first direction or the second direction form an angle of 90 degrees.

In the above case, when a user looks at the display device, an inclined portion of the pixel-defining layer is not perpendicular to the user's viewing direction. Accordingly, external light may be prevented from being reflected through (e.g., reflected from) the inclined portion of the pixel-defining layer and incident on the user's eyes, or the amount of external light reflected through the inclined portion of the pixel-defining layer may be reduced.

Further, the display device may implement a precise image through each sub-pixel.

According to the display device manufacturing apparatus and the display device manufacturing method, it is possible to manufacture the display device having an accurate deposition pattern.

Furthermore, according to the display device manufacturing apparatus and the display device manufacturing method, it is possible to reduce an error between a design pattern and an actual deposition pattern that may occur during manufacturing.

The shape in which corner portions of the sub-pixels F1''', F2''' and F3''' shown in FIG. 17 are chamfered is not limited to that shown FIG. 17 and may be applied to other embodiments described herein.

Figure 20:
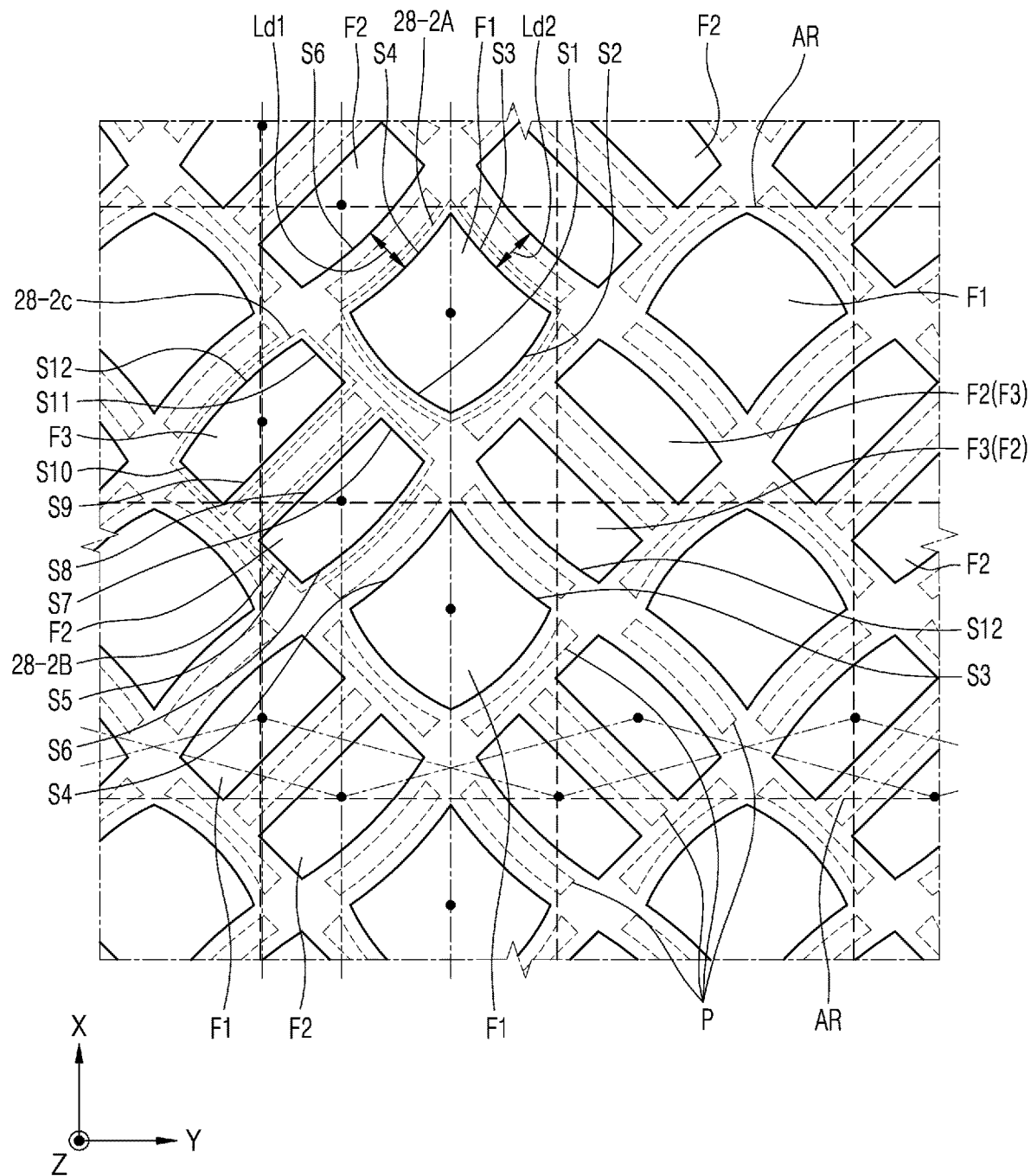
FIG. 20 is a plan view illustrating a first sub-pixel, a second sub-pixel, and a third sub-pixel of a display device according to another embodiment.

FIG. 20 is a plan view illustrating a first sub-pixel, a second sub-pixel, and a third sub-pixel of a display device according to another embodiment.

Referring to FIG. 20, the display device may include a plurality of sub-pixels arranged with each other in a display area. The plurality of sub-pixels may be arranged with each other to be spaced apart from each other by a certain interval in the display area. In this case, the display area may be divided into a plurality of virtual areas, each having a certain planar area. For example, the display area may include pixel areas AR having the same area. Each of the pixel areas AR may include one or more of the plurality of sub-pixels or may include parts of one or more of the plurality of sub-pixels.

The plurality of sub-pixels may include a first sub-pixel F1, a second sub-pixel F2, and a third sub-pixel F3. One selected from the first sub-pixel F1, the second sub-pixel F2, and the third sub-pixel F3 may emit blue light, another one selected from the first sub-pixel F1, the second sub-pixel F2, and the third sub-pixel F3 may emit red light, and the remaining one selected from the first sub-pixel F1, the second sub-pixel F2, and the third sub-pixel F3 may emit green light. In this case, depending on the shape of each of the first sub-pixel F1, the second sub-pixel F2, and the third sub-pixel F3, one selected from the blue light, the red light, and the green light may be square, and the other two selected from the blue light, the red light, and the green light may be rectangular. Hereinafter, for convenience of description, a case where the first sub-pixel F1 is to emit blue light, the second sub-pixel F2 is to emit red light, and the third sub-pixel F3 is to emit green light will be mainly described in more detail.

The area of each of the first sub-pixel F1, the second sub-pixel F2, and the third sub-pixel F3 may vary. In this case, because an aperture ratio of each of the sub-pixels may be adjusted, the display device 20 may be realized to perform various suitable operations in various suitable forms.

The first sub-pixel F1, the second sub-pixel F2, and the third sub-pixel F3 may include a first intermediate layer 28-2A, a second intermediate layer 28-2B, and a third intermediate layer 28-2C, respectively. In this case, the first intermediate layer 28-2A, the second intermediate layer 28-2B, and the third intermediate layer 28-2C may include (e.g., be) materials (e.g., organic emission layers) that are to emit different pieces of light (e.g., light of different colors) when external power is applied thereto.

The first intermediate layer 28-2A, the second intermediate layer 28-2B, and the third intermediate layer 28-2C may correspond to the shapes of the first sub-pixel F1, the second sub-pixel F2, and the third sub-pixel F3, respectively. In this case, the planar area of each of the intermediate layers may be the same as or different from the planar area of a respective one of the sub-pixels. For example, in an embodiment, the planar area of the first intermediate layer 28-2A may be different from the planar area of the first sub-pixel F1, the planar area of the second intermediate layer 28-2B may be the same as the planar area of the second sub-pixel F2, and the planar area of the third intermediate layer 28-2C may be the same as the planar area of the third sub-pixel F3. In another embodiment, the planar area of the second intermediate layer 28-2B may be different from the planar area of the second sub-pixel F2, the planar area of the first intermediate layer 28-2A may be the same as the planar area of the first sub-pixel F1, and the planar area of the third intermediate layer 28-2C may be the same as the planar area of the third sub-pixel F3. In another embodiment, the planar area of the third intermediate layer 28-2C may be different from the planar area of the third sub-pixel F3, the planar area of the second intermediate layer 28-2B may be the same as the planar area of the second sub-pixel F2, and the planar area of the first intermediate layer 28-2A may be the same as the planar area of the first sub-pixel F1. In another embodiment, the planar area of the first intermediate layer 28-2A may be the same as the planar area of the first sub-pixel F1, the planar area of the second intermediate layer 28-2B may be different from the planar area of the second sub-pixel F2, and the planar area of the third intermediate layer 28-2C may be different from the planar area of the third sub-pixel F3. In another embodiment, the planar area of the second intermediate layer 28-2B may be the same as the planar area of the second sub-pixel F2, the planar area of the first intermediate layer 28-2A may be different from the planar area of the first sub-pixel F1, and the planar area of the third intermediate layer 28-2C may be different from the planar area of the third sub-pixel F3. In another embodiment, the planar area of the third intermediate layer 28-2C may be the same as the planar area of the third sub-pixel F3, the planar area of the first intermediate layer 28-2A may be different from the planar area of the first sub-pixel F1, and the planar area of the second intermediate layer 28-2B may be different from the planar area of the second sub-pixel F2. In another embodiment, the planar area of the first intermediate layer 28-2A may be different from the planar area of the first sub-pixel F1, the planar area of the second intermediate layer 28-2B may be different from the planar area of the second sub-pixel F2, and the planar area of the third intermediate layer 28-2C may be different from the planar area of the third sub-pixel F3. In another embodiment, the planar area of the first intermediate layer 28-2A may be the same as the planar area of the first sub-pixel F1, the planar area of the second intermediate layer 28-2B may be the same as the planar area of the second sub-pixel F2, and the planar area of the third intermediate layer 28-2C may be the same as the planar area of the third sub-pixel F3. Here, the planar area may be an area on a plane formed by the display area DA of the display device 20. In some embodiments, the planar area may be an area on a plane on which an image is to be implemented (e.g., displayed) when the image is implemented (e.g., generated). In some embodiments, the planar area may be an area of components (e.g. intermediate layers and sub-pixels) when viewed in a plan view. Hereinafter, for convenience of description, a case where the planar area of each intermediate layer is different from the planar area of each sub-pixel will be mainly described in more detail.

For example, the planar area of each sub-pixel may be less than the planar area of each intermediate layer. For example, the planar shape of each sub-pixel may be arranged (e.g., arranged in the plan view) inside the planar shape of each intermediate layer. In this case, the planar shape of each sub-pixel may correspond to the planar shape of a respective opening OP of a pixel-defining layer 29. In this case, each intermediate layer is formed on the display substrate D to completely cover each opening OP of the pixel-defining layer 29 while having a sufficient margin, and thus, each sub-pixel may emit light having an accurate shape.

Because a relationship between the sub-pixels and a relationship between the intermediate layers are the same or similar to each other, the following description will be made mainly on the relationship between the sub-pixels for convenience of description.

A plurality of first sub-pixels F1, a plurality of second sub-pixels F2, and a plurality of third sub-pixels F3 may be provided. In this case, one side of at least one selected from the first to third sub-pixels F1, F2, and F3 may be protruding or retracted (e.g., recessed, indented, etc.). Also, one side of at least one selected from the first to third sub-pixels F1, F2, and F3 may be curved.

When one side of at least one selected from the first to third sub-pixels F1, F2, and F3 is curved, the planar area of each sub-pixel may be increased as compared to when all sides of the first to third sub-pixels F1, F2, and F3 are straight. In addition, because the inner wall of the opening of the pixel-defining layer defining each sub-pixel has a curved shape, external light impinging on (e.g., incident on) the inner wall of the opening of the pixel-defining layer may be dispersed.

The plurality of first sub-pixels F1 may be spaced apart from each other in at least one selected from a first direction and a second direction. For example, some of the plurality of first sub-pixels F1 may be arranged with each other to be spaced apart from each other in a first direction (e.g., one selected from an X-axis direction and a Y-axis direction in FIG. 1B), and the other ones of the plurality of first sub-pixels F1 may be arranged with each other to be spaced apart from each other in a second direction (e.g., the other one selected from the X-axis direction and the Y-axis direction in FIG. 1B). In this case, the centers of first sub-pixels F1 arranged with each other in the first direction from among the plurality of first sub-pixels F1 may be arranged with each other on one straight line. In addition, the centers of first sub-pixels F1 arranged with each other in the second direction from among the plurality of first sub-pixels F1 may be arranged with each other on one straight line or in a serpentine (or zigzag) shape.

The planar area of each of the plurality of first sub-pixels F1 may have a shape similar to a quadrangle. For example, the planar area of the first sub-pixel F1 may include four vertexes. In this case, one side of the first sub-pixel F1 connecting adjacent vertices may be curved as described above and may protrude to the outside of the first sub-pixel F1 (e.g., away from the center of the first sub-pixel F1) or be retracted to the inside of the first sub-pixel F1 (e.g., toward the center of the first sub-pixel F1).

The first sub-pixels F1 as described above may be arranged tilted with respect to a user's viewing direction shown in FIG. 1A. For example, a straight line (e.g., a virtual straight line) connecting adjacent vertices among the vertices of the first sub-pixel F1 may be arranged in a diagonal direction with respect to the user's viewing direction of FIG. 1A.

The first sub-pixel F1 may have a first side S1, a second side S2, a third side S3, and a fourth side S4. In this case, at least one selected from the first side S1, the second side S2, the third side S3, and the fourth side S4 may be convex or concave, and may be curved. In another embodiment, at least one selected from the first side S1, the second side S2, the third side S3, and the fourth side S4 may have a linear form. For example, one or more selected from the first side S1, the second side S2, the third side S3, and the fourth side S4 may be curved with a convex or concave shape, and the others selected from the first side S1, the second side S2, the third side S3, and the fourth side S4 may have a linear form. Hereinafter, for convenience of description, a case where the first side S1, the second side S2, the third side S3, and the fourth side S4 all have curved shapes will be mainly described in more detail. A case where the first side S1 and the second side S2 have convex curved shapes and the third side S3 and the fourth side S4 have concave curved shapes will be mainly described in more detail. In some embodiments, the first side S1 and the second side S2 may share a common vertex, and the third side S3 and the fourth side S4 may share a common vertex.

The first sub-pixels F1 may be arranged to have the same shape in the first direction. For example, first sub-pixels F1 arranged with each other along a straight line in the first direction may each have the same shape. On the other hand, the first sub-pixels F1 may be arranged to have alternating shapes inverted in the second direction. For example, first sub-pixels F1 arranged with each other in the second direction may each have a shape that is the same as a shape of an adjacent one of the first sub-pixels F1 along the second direction after having been inverted with respect to a line extending along the second direction and through the center of the adjacent first sub-pixel F1. For example, the first sub-pixels F1 arranged with each other in the X-axis direction in FIG. 20 may be arranged to have the same shape, and thus, one side of each first sub-pixel F1 may be arranged in the same position. On the other hand, one of the first sub-pixels F1 arranged in the Y-axis direction and adjacent to another one of the first sub-pixels F1 in the Y-axis direction may have a shape in which the top and bottom of the adjacent other one of the first sub-pixels F1 are inverted as in FIG. 20. For example, the first and second sides S1 and S2 of one of the first sub-pixels F1 adjacent to another one of the first sub-pixels F1 in the Y-axis direction may be arranged at the lower side of FIG. 20, and the first and second sides S1 and S2 of the adjacent other one of the first sub-pixels F1 may be arranged at the upper side of FIG. 20.

One second sub-pixel F2 and one third sub-pixel F3 may be arranged on the first side S1 or the second side S2 of one first sub-pixel F1 to face the first sub-pixel F1. In this case, the second sub-pixel F2 and the third sub-pixel F3 may be arranged to be tilted with respect to one selected from the first direction and the second direction.

The second sub-pixel F2 and the third sub-pixel F3 may have rectangular shapes. In this case, the area of at least one selected from the second sub-pixel F2 and the third sub-pixel F3 may be less than the area of the first sub-pixel F1. Furthermore, at least one selected from the second sub-pixel F2 and the third sub-pixel F3 facing the first sub-pixel F1 may be arranged to overlap one side (e.g., the first side S1 or the second side S2) of the first sub-pixel F1 facing the second sub-pixel F2 and the third sub-pixel F3 and/or an extension line of the one side of the first sub-pixel F1. For example, at least a portion of the second sub-pixel F2 and at least a portion of the third sub-pixel F3 adjacent to each other may be arranged within a length range of one selected from the first side S1 and the second side S2.

For example, in an embodiment, extension lines of short sides of different second sub-pixels F2 respectively facing the first side S1 and the second side S2 may intersect or cross with each other, or extension lines of long sides of the second sub-pixels F2 respectively facing the first side S1 and the second side S2 may intersect or cross with each other. In another embodiment, extension lines of short sides of a plurality of third sub-pixels F3 respectively facing the first side S1 and the second side S2 may intersect or cross with each other, or extension lines of long sides of the third sub-pixels F3 respectively facing the first side S1 and the second side S2 may intersect or cross with each other. In another embodiment, the extension line of a short side of the second sub-pixel F2 facing the first side S1 and the extension line of a short side of the third sub-pixel F3 facing the second side S2 may intersect or cross with each other, or the extension line of a long side of the second sub-pixel F2 facing the first side S1 and the extension line of a long side of the third sub-pixel F3 facing the second side S2 may intersect or cross with each other. In another embodiment, the extension line of a long side of the second sub-pixel F2 facing the first side S1 and the extension line of a short side of the third sub-pixel F3 facing the second side S2 may intersect or cross with each other, or the extension line of a short side of the second sub-pixel F2 facing the first side S1 and the extension line of a long side of the third sub-pixel F3 facing the second side S2 may intersect or cross with each other.

The plurality of second sub-pixels F2 may be spaced apart from each other in at least one selected from the first direction and the second direction. In another embodiment, the centers of some of a plurality of second sub-pixels F2 arranged with each other in the first direction or the second direction may be arranged on a straight line. In another embodiment, the centers of some of a plurality of second sub-pixels F2 arranged with each other in one selected from the first direction and the second direction may be arranged on a straight line, and the centers of the others of the plurality of second sub-pixels F2 arranged with each other in the other one selected from the first direction and the second direction may be arranged with each other in a serpentine (or zigzag) shape in the other one selected from the first direction and the second direction. Hereinafter, for convenience of description, a case where the centers of some of a plurality of second sub-pixels F2 arranged with each other in the first direction are arranged with each other on a straight line and the centers of the others of the plurality of second sub-pixels F2 arranged with each other in the second direction are arranged with each other in a serpentine (or zigzag) shape will be mainly described in more detail.

In the above case, four second sub-pixels F2 may be arranged around one first sub-pixel F1. In this case, three second sub-pixels F2 may be arranged at positions rotated by the same angle with respect to the center of the first sub-pixel F1, with respect to one second sub-pixel F2. In this case, short sides of two of the four second sub-pixels F2 facing the one first sub-pixel F1 may respectively face the first side S1 and the second side S2 of the one first sub-pixel F1, and long sides of the remaining two of the four second sub-pixels F2 facing the one first sub-pixel F1 may respectively face the third side S3 and the fourth side S4 of the one first sub-pixel F1.

The plurality of third sub-pixels F3 may also be arranged with each other to be spaced apart from each other in at least one selected from the first direction and the second direction similarly to the second sub-pixels F2. In this case, the plurality of third sub-pixels F3 may also be arranged similarly to the second sub-pixels F2. Hereinafter, for convenience of description, a case where the centers of some of a plurality of third sub-pixels F3 arranged with each other in the first direction from among the plurality of third sub-pixels F3 are arranged with each other on a straight line and the centers of the other ones of the plurality of third sub-pixels F3 arranged with each other in the second direction from among the plurality of third sub-pixels F3 are arranged with each other in a serpentine (or zigzag) shape will be mainly described in more detail.

In this case, one selected from the second sub-pixel F2 and the third sub-pixel F3 facing the first side S1 of the first sub-pixel F1 may be arranged to be symmetrical with one selected from the second sub-pixel F2 and the third sub-pixel F3 facing the second side S2 of the first sub-pixel F1 with respect to a straight line (e.g., a straight line parallel to the first direction while passing through the centers of two adjacent first sub-pixels F1) connecting the centers of first sub-pixels F1 arranged in the first direction. For example, the second sub-pixel F2 facing the first side S1 may be symmetrical with the third sub-pixel F3 facing the second side S2 with respect to the straight line. Also, the third sub-pixel F3 facing the first side S1 may be symmetrical with the second sub-pixel F2 facing the second side S2 with respect to the straight line. A distance between the centers of adjacent second sub-pixels F2 may be the same as a distance between the centers of adjacent third sub-pixels F3. In another embodiment, the second sub-pixel F2 and the third sub-pixel F3 facing the first side S1 may be symmetrical with the second sub-pixel F2 and the third sub-pixel F3 facing the second side S2, respectively. A distance between the centers of one selected from a pair of second sub-pixels F2 and a pair of third sub-pixels F3 arranged symmetrically with respect to each other may be less than a distance between the centers of the other one selected from the pair of second sub-pixels F2 and the pair of third sub-pixels F3 arranged symmetrically with respect to each other. In this case, a pair of second sub-pixels F2 adjacent to each other may be arranged between a pair of third sub-pixels F3 adjacent to each other or the pair of third sub-pixels F3 adjacent to each other may be arranged between the pair of second sub-pixels F2 adjacent to each other. However, hereinafter, for convenience of description, a case where the second sub-pixel F2 is arranged to be symmetrical with the third sub-pixel F3 with respect to a straight line connecting the centers of first sub-pixels F1 arranged in the first direction will be mainly described in more detail.

One side of at least one selected from the second sub-pixel F2 and the third sub-pixel F3 may be concave or convex. In this case, a concave or convex side of the at least one selected from the second sub-pixel F2 and the third sub-pixel F3 may have a curved shape. Hereinafter, for convenience of description, a case where one side of the second sub-pixel F2 and one side of the third sub-pixel F3 each have a convex curve will be described in more detail.

In the above case, the second sub-pixel F2 and the third sub-pixel F3 adjacent to each other may have convex shapes in opposite directions. The second sub-pixel F2 may have a fifth side S5, a sixth side S6, a seventh side S7, and an eighth side S8. In this case, the length of the sixth side S6 and the length of the eighth side S8 may each be greater than each of the length of the fifth side S5 and the length of the seventh side S7. The sixth side S6 and the eighth side S8 may form long sides, and the fifth side S5 and the seventh side S7 may form short sides. Also, the third sub-pixel F3 may have a ninth side S9, a tenth side S10, an eleventh side S11, and a twelfth side S12. In this case, the length of the tenth side S10 and the length of the eleventh side S11 may each be less than each of the length of the ninth side S9 and the length of the twelfth side S12. The tenth side S10 and the eleventh side S11 may form short sides, and the ninth side S9 and the twelfth side S12 may form long sides. In this case, the eighth side S8 and the ninth side S9 facing each other may be parallel to each other and may each have a linear shape. In addition, the fifth side S5, the seventh side S7, the tenth side S10, and the eleventh side S11 may each have a linear shape. On the other hand, the sixth side S6 facing oppositely away from the eighth side S8 and the twelfth side S12 facing oppositely away from the ninth side S9 may each have a convex curved shape. In this case, the sixth side S6 and the twelfth side S12 may be parts of a circle or parts of a curve. In this case, a first distance Ld1 between the sixth side S6 and the fourth side S4 may be constant along a length direction of the sixth side S6 and along a length direction of the fourth side S4. For example, the shortest distance from any point of the sixth side S6 to the fourth side S4 may be the same for multiple or all measurements along the sixth side S6. In addition, a second distance Ld2 between the twelfth side S12 and the third side S3 may also be the same along a length direction of the twelfth side S12 and along a length direction of the third side S3.

In the above case, a spacer P may be arranged between the first sub-pixel F1 and the second sub-pixel F2 adjacent to each other, between the first sub-pixel F1 and the third sub-pixel F3 adjacent to each other, and/or between the second sub-pixel F2 and the third sub-pixel F3 adjacent to each other. In this case, one side of the planar shape of the spacer P may be formed to correspond to the shape of one side of the planar shape of each sub-pixel facing the one side of the planar shape of the spacer P. For example, when the shape of one side of the planar shape of each sub-pixel facing the one side of the planar shape of the spacer P is a straight line, the one side of the planar shape of the spacer P may be straight, and when the shape of one side of the planar shape of each sub-pixel facing the one side of the planar shape of the spacer P is a curve, the one side of the planar shape of the spacer P may be curved. For example, in FIG. 20, the spacer P may be arranged between the first sub-pixel F1 and the long side of the third sub-pixel F3, between the first sub-pixel F1 and the long side of the second sub-pixel F2, between the long side of the second sub-pixel F2 and the long side of the third sub-pixel F3, or between the first sub-pixel F1 and the short side of the second sub-pixel F2. In this case, when the spacer P is arranged between the first side S1 and the seventh side S7, and between the first side S1 and the eleventh side S11, the shape of one side of the spacer P facing the first side S1 may be a concave curve, and the shape of the other side of the spacer P facing the seventh side S7 and the eleventh side S11 may be a straight line. In addition, when the spacer P is arranged between the fourth side S4 and the sixth side S6, the shape of one side of the spacer P facing the fourth side S4 may be a convex curve, and the shape of one side of the spacer P facing the sixth side S6 may be a concave curve. When the spacer P is arranged between the third side S3 and the twelfth side S12, the shape of one side of the spacer P facing the third side S3 may be a convex curve, and the shape of one side of the spacer P facing the twelfth side S12 may be a concave curve. When the spacer P is arranged between the eighth side S8 and the ninth side S9, the shapes of all sides of the spacer P may be straight lines. In the above case, one side of the planar shape of the spacer P may maintain a constant distance from one side of the planar shape of each of the sub-pixels facing each other (e.g., of the respective sub-pixel having a side facing the one side of the planar shape of the spacer P). For example, the distance from one side of the planar shape of the spacer P to one side of the planar shape of each sub-pixel (e.g., of the respective sub-pixel) facing one side of the planar shape of the spacer P may have a constant value in a length direction of one side of each sub-pixel (e.g., of the respective sub-pixel). For example, as described above, a space in which the spacer P may be arranged may be provided by maintaining the first and second distances Ld1 and Ld2 constant.

Because at least one side of each sub-pixel has a curved shape as described above, reflection of light incident on the display device from above may be reduced. When external light is incident on the display device, the external light may be reflected from the inner wall of an opening of a pixel-defining layer formed in a thickness direction of the display device and enter a user's eyes.

However, external light may be reflected in various directions by forming at least one side of each sub-pixel in a curved shape as described above. For example, external light may be effectively dispersed by forming the opening of the pixel-defining layer to have the same planar shape as that of a respective sub-pixel.

The first intermediate layer 28-2A, the second intermediate layer 28-2B, and the third intermediate layer 28-2C respectively forming (e.g., corresponding to) the first sub-pixel F1, the second sub-pixel F2, and the third sub-pixel F3, respectively, may be formed and arranged to be the same as or similar to the first sub-pixel F1, the second sub-pixel F2, and the third sub-pixel F3, respectively. The centers of the first intermediate layer 28-2A, the second intermediate layer 28-2B, and the third intermediate layer 28-2C may be arranged at positions that are the same as or different from those of the centers of the first sub-pixel F1, the second sub-pixel F2, and the third sub-pixel F3, respectively. The descriptions of the first sub-pixel F1, the second sub-pixel F2, and the third sub-pixel F3 given above may be applied to the first intermediate layer 28-2A, the second intermediate layer 28-2B, and the third intermediate layer 28-2C, respectively.

Figure 21:
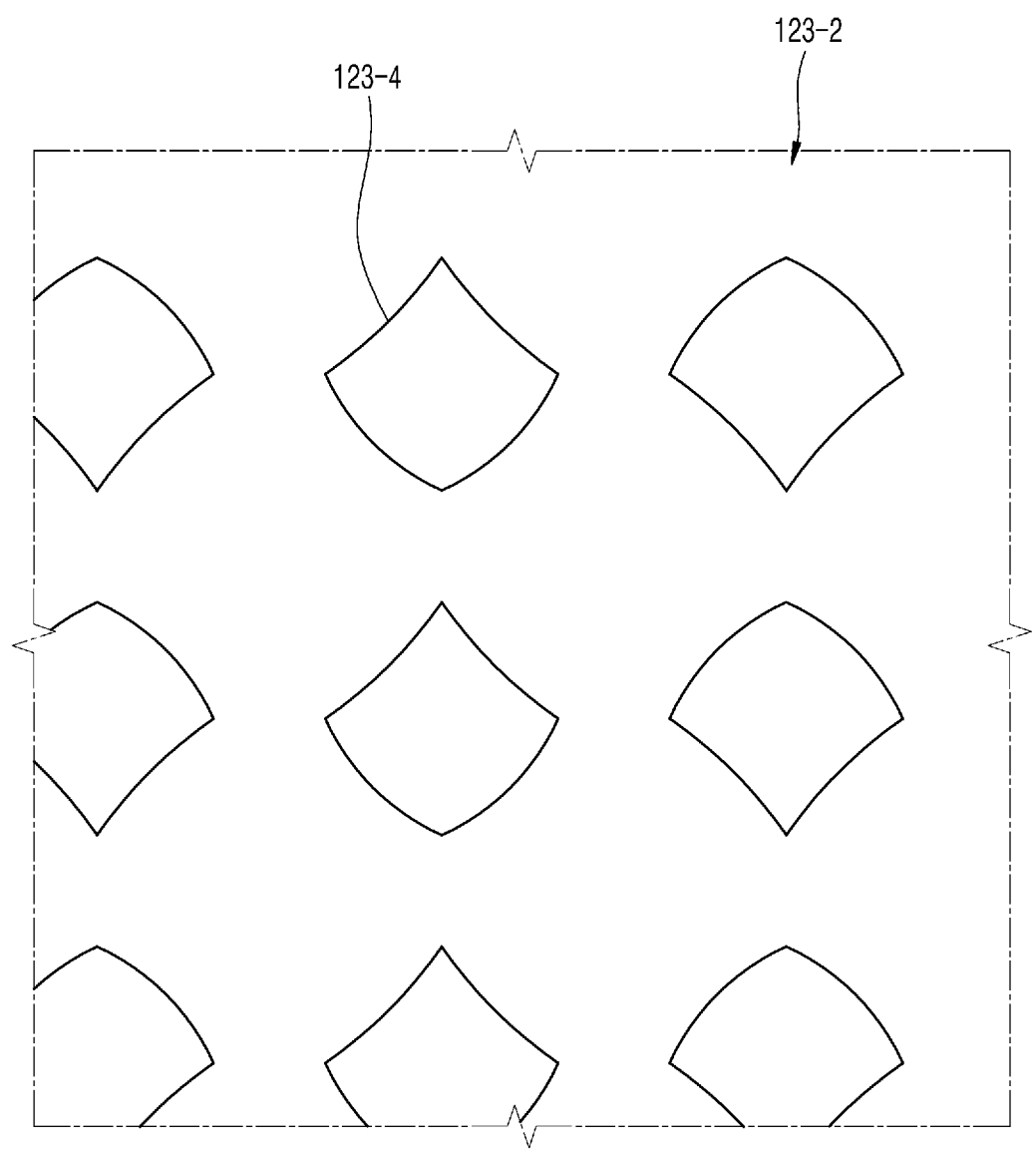
FIG. 21 is a plan view of a portion of a first mask sheet for depositing a first intermediate layer shown in FIG. 20.

FIG. 21 is a plan view of a portion of a first mask sheet for depositing a first intermediate layer shown in FIG. 20.

Referring to FIG. 21, a first mask sheet 123-2 may be arranged on a first mask frame, as shown in FIGS. 5 to 6. The first mask sheet 123-2 may number two or more (e.g., may be provided in plurality). The plurality of first mask sheets 123-2 may be arranged in a line to be adjacent to each other in the first direction or the second direction. For example, in this case, a long side of the first mask sheet 123-2 may be arranged to be parallel to a long side or a short side of the first mask frame.

The first mask sheet 123-2 may have a plurality of first openings 123-4. The plurality of first openings 123-4 may be arranged with each other to be spaced apart from each other in the first direction and the second direction. For example, each of the first openings 123-4 may have a shape similar to a rhombus with a vertex arranged in a tensile direction of the first mask sheet 123-2. Each of these first openings 123-4 may be formed to correspond to the shape of the first sub-pixel F1 described with reference to FIG. 20. For example, at least one side of the planar shape of the first opening 123-4 may be concave or convex and may be curved.

The centers of some of the plurality of first openings 123-4 may be arranged with each other on a line in one selected from the tensile direction of the first mask sheet 123-2 and a direction perpendicular or normal to the tensile direction of the first mask sheet 123-2. In addition, the centers of the other ones of the plurality of first openings 123-4 may be arranged with each other in a serpentine (or zigzag) shape in one (e.g., the other one) selected from the tensile direction of the first mask sheet 123-2 and a direction perpendicular to the tensile direction of the first mask sheet 123-2. In the case where the first opening 123-4 is formed as described above, even if the first mask sheet 123-2 is under tension, a tensile shape of the first mask sheet 123-2 may be predicted to some extent.

Figure 22:
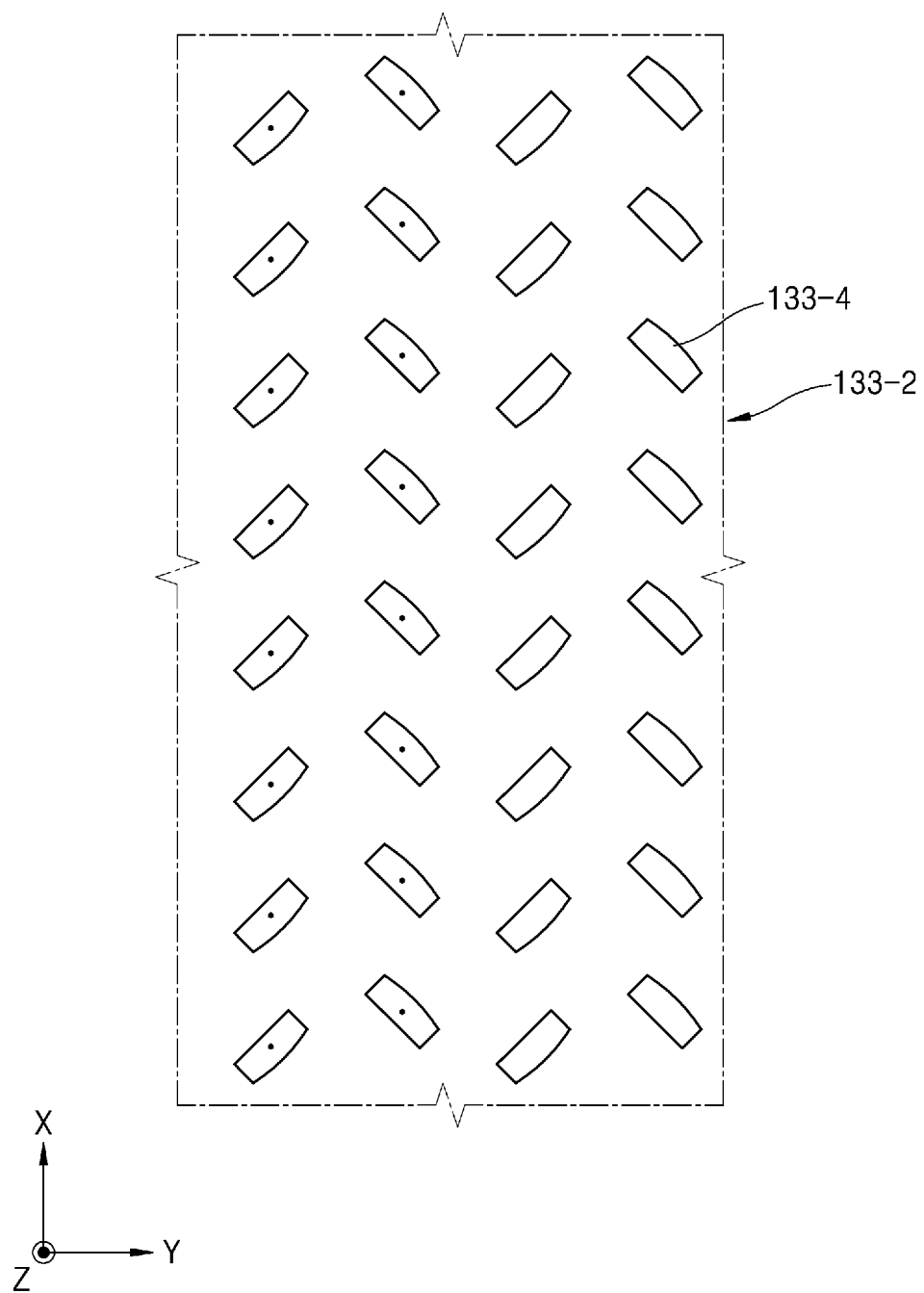
FIG. 22 is a plan view of a portion of a second mask sheet for depositing a second intermediate layer shown in FIG. 20.

FIG. 22 is a plan view of a portion of a second mask sheet for depositing a second intermediate layer shown in FIG. 20.

Referring to FIG. 22, a second mask sheet 133-2 may be similar to the first mask sheet 123-2. In this case, the second mask sheet 133-2 may have a plurality of second openings 133-4. The plurality of second openings 133-4 may be spaced apart from each other. Some of the plurality of second openings 133-4 may be tilted in one direction with respect to a tensile direction (e.g., the X-axis direction in FIG. 22) of the second mask sheet 133-2. The other ones of the plurality of second openings 133-4 may be tilted in a direction different from the direction of the tilt of the some of the plurality of second openings 133-4 with respect to the tensile direction of the second mask sheet 133-2. In this case, a distance (e.g., a minimum distance) between two second openings 133-4 adjacent to each other may be reduced or increased in a tensile direction of the second mask sheet 133-2. For example, the plurality of second openings 133-4 may be tilted to have an angle different from 0 degrees with respect to the tensile direction of the second mask sheet 133-2. For example, the plurality of second openings 133-4 may be arranged to form an angle of 45 degrees with respect to the tensile direction of the second mask sheet 133-2. In this case, the plurality of second openings 133-4 may each have a planar shape corresponding to the planar shape of the second sub-pixel F2 described with reference to FIG. 20. In addition, each second opening 133-4 may be arranged to correspond to a respective second sub-pixel F2.

In an embodiment, the centers of some of the second openings 133-4 may form a straight line in one direction. For example, the centers of second openings 133-4 arranged with each other in a tensile direction of the second mask sheet 133-2 may be arranged with each other on a straight line, and the centers of second openings 133-4 arranged with each other in a direction perpendicular to the tensile direction of the second mask sheet 133-2 may be arranged with each other on a straight line. In this case, the plurality of second openings 133-4 may be arranged in a plurality of columns and rows. In another embodiment, the centers of some of the plurality of second openings 133-4 may form a straight line, and the centers of the other ones of the plurality of second openings 133-4 may not form a straight line. For example, among the plurality of second openings 133-4 described above, the centers of second openings 133-4 in a line which are arranged with each other in a tensile direction of the second mask sheet 133-2 may form a straight line. On the other hand, among the plurality of second openings 133-4, the centers of second openings 133-4 arranged in a direction perpendicular to the tensile direction of the second mask sheet 133-2 may be arranged in a serpentine shape (or a zigzag shape). However, hereinafter, for convenience of description, a case where the centers of the some of the plurality of second openings 133-4 form a straight line and the centers of the other ones of the plurality of second openings 133-4 do not form a straight line will be mainly described in more detail. The plurality of second openings 133-4 may be rectangular.

The second mask sheet 133-2 may be fixed to a second mask frame in a state where a tensile force is applied to the second mask sheet 133-2, as described above. In this case, when the plurality of second openings 133-4 are all tilted in the same direction with respect to a tensile direction of the second mask sheet 133-2, deformation of the second mask sheet 133-2 may exceed a predictable range because degrees of deformation between the right and left or between the front and back of the second mask sheet 133-2 are different from each other. For example, in the above case, one portion of the second mask sheet 133-2 is largely deformed and the other portion of the second mask sheet 133-2 is not deformed or is slightly deformed (e.g., deformed less than the one portion of the second mask sheet 133-2) so that the shape of a second opening 133-4 may be distorted or the shape of the some of the plurality of second openings 133-4, and the shape of another second opening 133-4 or the shape of the other ones of the plurality of second openings 133-4 may be different from each other. For example, the degree of deformation of the plurality of second openings 133-4 may vary between the second openings 133-4. Furthermore, in the above case, the centers of some of the plurality of second openings 133-4 (e.g., the centers of some of the plurality of second openings 133-4 arranged with each other in the tensile direction) may not be on a line (e.g., a straight line).

However, as described above, the some of the plurality of second openings 133-4 and the other ones of the plurality of second openings 133-4 are formed on the second mask sheet 133-2 by being tilted in different directions with respect to the tensile direction of the second mask sheet 133-2. Therefore, the degree of deformation of the second mask sheet 133-2 during tensioning of the second mask sheet 133-2 may be uniformly maintained throughout the entire second mask sheet 133-2. For example, it is possible to induce uniform deformation throughout the second mask sheet 133-2 by tilting second openings 133-4 adjacent to each other in different directions with respect to the tensile direction of the second mask sheet 133-2.

Figure 23:
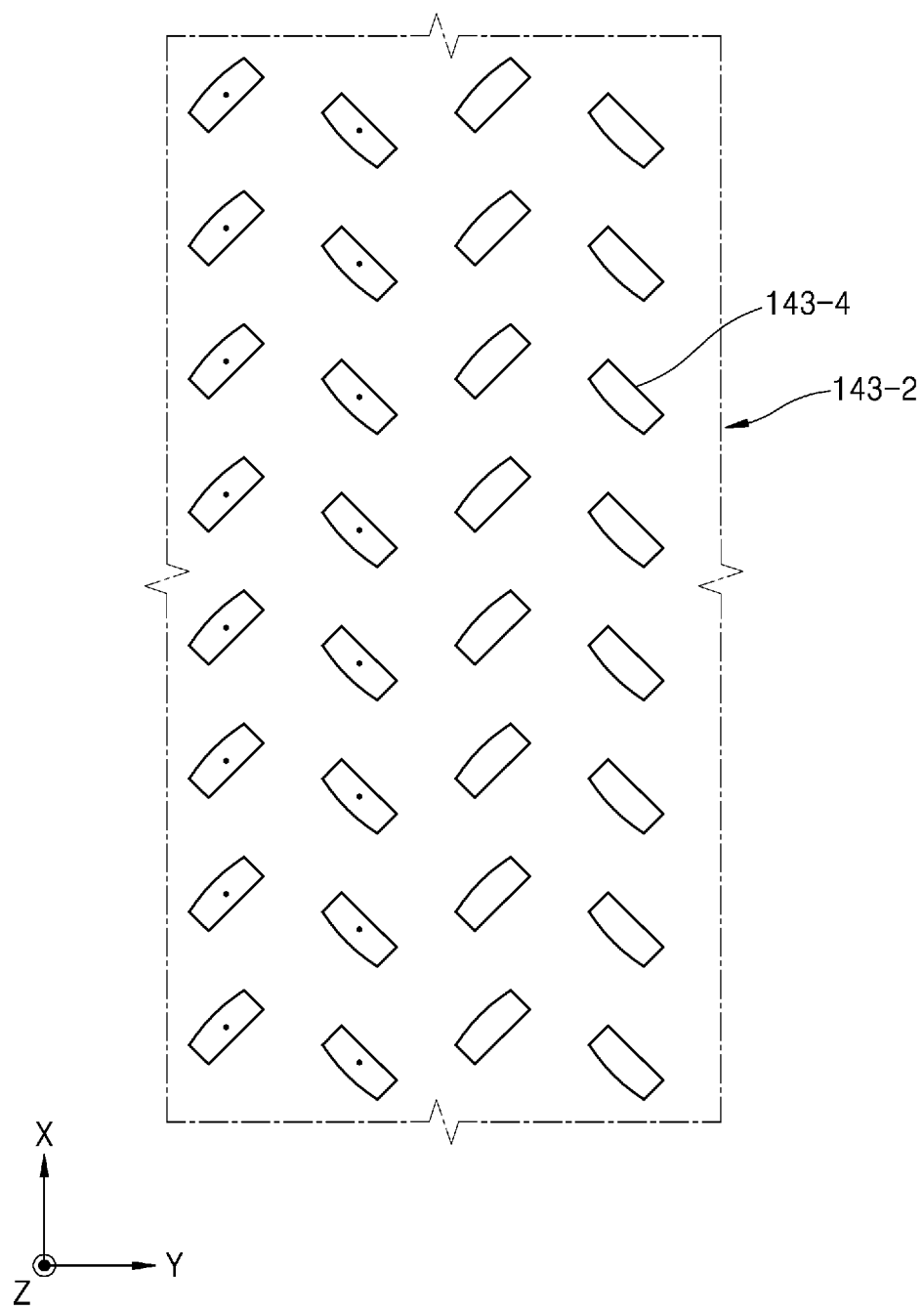
FIG. 23 is a plan view of a portion of a third mask sheet for depositing a third intermediate layer shown in FIG. 20.

FIG. 23 is a plan view of a portion of a third mask sheet for depositing a third intermediate layer shown in FIG. 20.

Referring to FIG. 23, the third mask sheet 143-2 may be similar to the second mask sheet 133-2 and the third openings 143-4 may be arranged similarly to the second openings 133-4. However, when the second mask sheet 133-2 and the third mask sheet 143-2 are arranged to be stacked on each other, the second mask sheet 133-2 and the third mask sheet 143-2 may be manufactured such that the second openings 133-4 and the third openings 143-4 do not overlap each other.

In this case, the planar shape of each of the third openings 143-4 may be arranged to correspond to the planar shape of the third sub-pixel F3 described with reference to FIG. 20. In addition, the third opening 143-4 may be formed in the third mask sheet 143-2 to correspond to the position of the respective third sub-pixel F3.

Figure 24A:
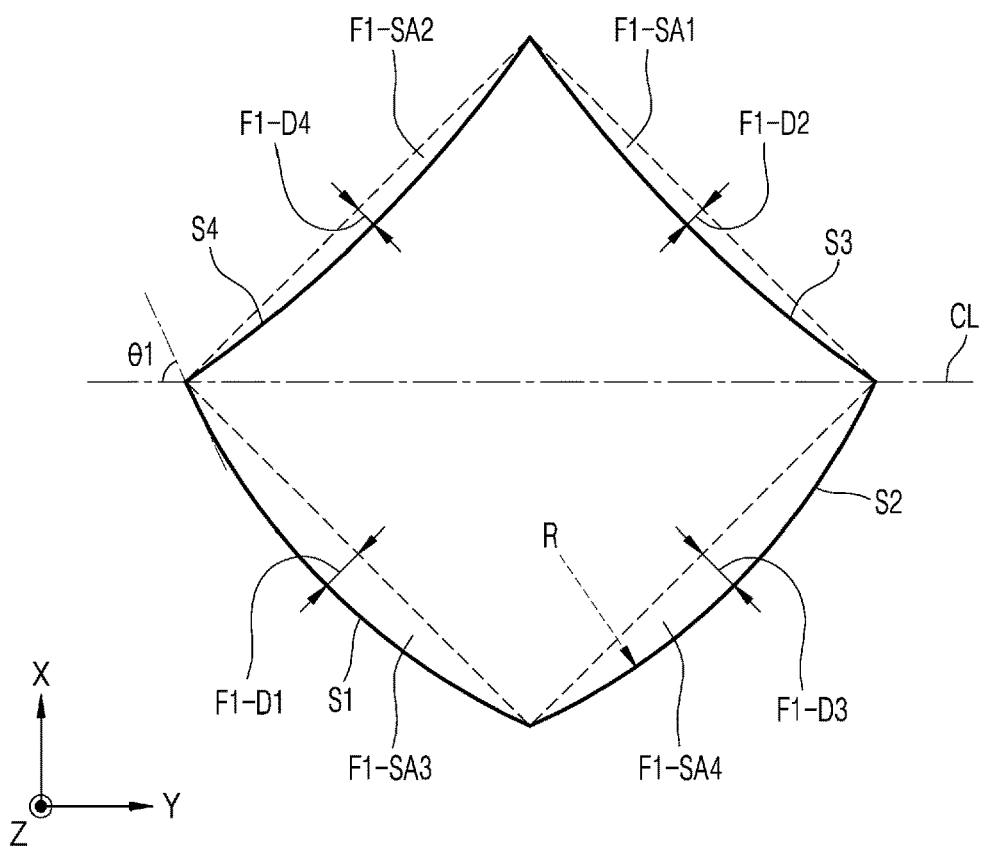
FIG. 24A is a plan view of the first sub-pixel of FIG. 20.
Figure 24B:
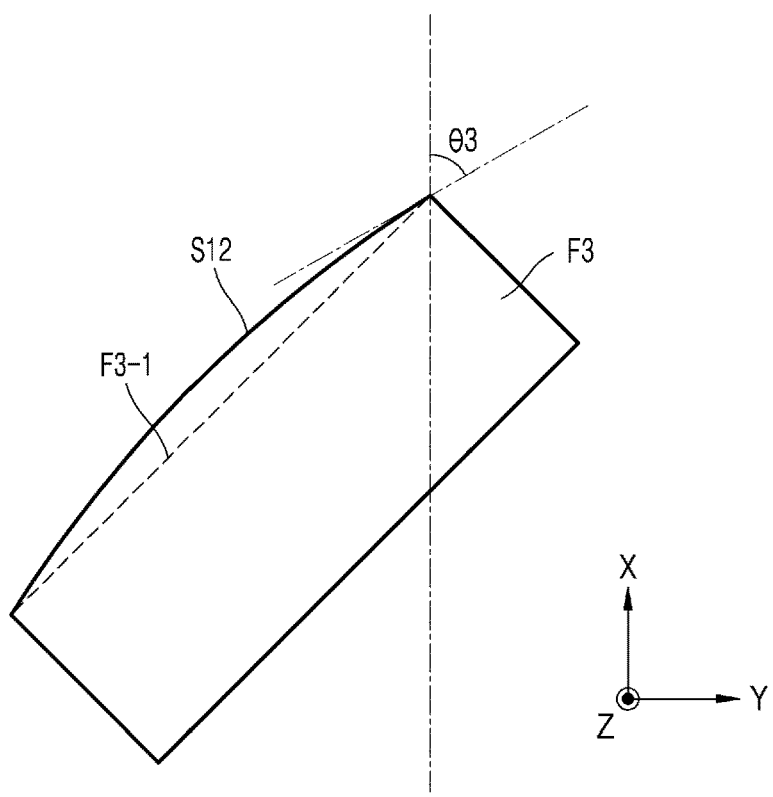
FIG. 24B is a plan view of the third sub-pixel of FIG. 20.

FIG. 24A is a plan view of the first sub-pixel F1 shown in FIG. 20. FIG. 24D is a plan view illustrating a relationship among a first sub-pixel, an opening of a pixel-defining layer, and a first intermediate layer shown in FIG. 24A.

Referring to FIGS. 24A and 24D, as described above, in the first sub-pixel F1, the first side S1 and the second side S2 may have convex curved shapes and the third side S3 and the fourth side S4 may have concave curved shapes (see FIG. 20). In the above case, the first side S1 and the third side S3 facing oppositely away from each other, and/or the second side S2 and the fourth side S4 facing oppositely away from each other may have different radii of curvature or may have different curved shapes. For example, in the above case, the planar area of a first sub-pixel F1 in a case where at least one of the sides of the first sub-pixel F1 has a protruding curve as described above may be greater than that of a first sub-pixel F1 in a case where all the sides of the first sub-pixel F1 have linear forms.

For example, when one of the four sides of the first sub-pixel F1 has a protruding curve, the actual planar area of the first sub-pixel F1 may be greater than a virtual planar area of the first sub-pixel F1 obtained by connecting vertices of the first sub-pixel F1 with straight lines. For example, a portion of one side of the first sub-pixel F1, which has a protruding curved shape, is partly away from the center of the first sub-pixel F1, and thus may protrude farther from the center of the pixel F1 to the outside of the first sub-pixel F1 as compared to a virtual side obtained by connecting vertices of the first subpixel F1 with a straight line.

In addition, even when the first sub-pixel F1 includes both a concave curve and a protruding curve as shown in FIG. 24A, the planar area of the first sub-pixel F1 may be further increased as compared to a case where each side of the first sub-pixel F1 has a linear form. For example, a first area F1-SA3 increased as the first side S1 further protrudes to the outside of the first sub-pixel F1 from a straight line connecting the vertices of the first sub-pixel F1 may be greater than a third area F1-SA1 reduced as the third side S3 further retracts toward the inside of the first sub-pixel F1 from the straight line connecting the vertices of the first sub-pixel F1. For example, the first area F1-SA3 may be an area defined between an edge of the first sub-pixel F1 at the first side S1 between two vertices and a straight line connecting the two vertices, the third area F1-SA1 may be an area defined between an edge of the first sub-pixel F1 at the third side S3 between another two vertices and a straight line connecting the other two vertices, and the first area F1-SA3 may be greater than the third area F1-SA1. In this case, with respect to a parallel line parallel to a straight line passing through a virtual straight line CL that passes through the center of the first sub-pixel F1 and connects vertices of first sub-pixels F1 adjacent to each other, a first straight-line distance F1-D1, which is a distance between a point where the parallel line and the first side S1 meet and a point where the parallel line and a straight line connecting vertices of the first side S1 meet, may be greater than a third straight-line distance F1-D2, which is a distance between a point where the parallel line and the third side S3 meet and a point where the parallel line and a straight line connecting vertices of the third side S3 meet. For example, the first straight-line distance F1-D1 may be a distance between the edge of the first sub-pixel F1 at the first side S1 between the two vertices and the straight line connecting the two vertices, the third straight-line distance F1-D2 may be a distance between the edge of the first sub-pixel F1 at the third side S3 between the other two vertices and the straight line connecting the other two vertices, and the first straight-line distance F1-D1 may be greater than the third straight-line distance F1-D2.

In addition, the relationship between a second area F1-SA4 and a fourth area F1-SA2 may be the same as or similar to the relationship between the first area F1-SA3 and the third area F1-SA1. For example, the second area F1-SA4 may be greater than the fourth area F1-SA2. In addition, the relationship between a second straight-line distance F1-D3 and a fourth straight-line distance F1-D4 is similar to the relationship between the first straight-line distance F1-D1 and the third straight-line distance F1-D2, and the second straight-line distance F1-D3 may be greater than the fourth straight-line distance F1-D4.

In this case, the area of the first sub-pixel F1 may be greater than that of a case where the first sub-pixel F1 is quadrangular. For example, the area of a first sub-pixel F1 in a case where the first side S1 and the second side S2 have convex curved shapes and the third side S3 and the fourth side S4 have concave curved shapes may be greater than the area of a first sub-pixel F1 in a case where the first sub-pixel F1 has the shape of a square.

Therefore, in the above case, when at least one side of the first sub-pixel F1 includes a curve (e.g., a convex curve), the area of the first sub-pixel F1 may increase, thereby increasing the life (e.g., the life span) of the first sub-pixel F1.

In the above case, a tangent line at any point on a curved side of the first sub-pixel F1 and a straight line parallel to a straight line connecting the centers of first sub-pixels F1 arranged in one direction may form a first angle θ1. For example, in FIG. 24, any straight line parallel to a straight line connecting the centers of a plurality of first sub-pixels F1 arranged in a first direction (e.g., the X-axis direction or the Y-axis direction in FIG. 24), and a tangent line at any point on the first side S1 may form the first angle θ1. In this case, the acute angle of an angle formed by any straight line parallel to a straight line connecting the centers of a plurality of first sub-pixels F1 and the tangent line at any point on the first side S1 may be defined as the first angle θ1.

The first angle θ1 may have a range of about 20 degrees or more and about 70 degrees or less. When the first angle θ1 is less than 20 degrees or exceeds 70 degrees, when external light is incident on the display device, the external light may not be dispersed from the inner wall of the opening OP of the pixel-defining layer 29, and thus, a user may feel (e.g., see) glare.

The first sub-pixel F1 may be defined by a lower end OP-DE of the opening OP of the pixel-defining layer 29. In this case, the lower end OP-DE of the opening OP of the pixel-defining layer 29 may define an area and a planar shape in which the pixel electrode 28-1 of FIG. 3 is exposed to the outside. In this case, the lower end OP-DE of the opening OP of the pixel-defining layer 29 may refer to a region where the pixel-defining layer 29 and the pixel electrode 28-1 contact each other. In this case, the lower end OP-DE of the opening OP of the pixel-defining layer 29 may define a planar shape of the first sub-pixel F1. In addition, the planar shape of the upper end OP-UE of the opening OP of the pixel-defining layer 29 may be larger than the planar shape of the lower end OP-DE of the opening OP. In this case, when viewed from the top (e.g., from the plan view), the lower end OP-DE of the opening OP of the pixel-defining layer 29 may be arranged inside an upper end OP-UE of the opening OP of the pixel-defining layer 29.

The upper end OP-UE of the opening OP of the pixel-defining layer 29 as well as the lower end OP-DE of the opening OP of the pixel-defining layer 29 may be arranged inside the first intermediate layer 28-2A on a plane (e.g., in the plan view). For example, the first intermediate layer 28-2A may be arranged to cover (e.g., overlap, for example, entirely overlap) not only the lower end OP-DE of the opening OP of the pixel-defining layer 29 but also the upper end OP-UE of the opening OP of the pixel-defining layer 29, and thus, the same color may be emitted from the entire first sub-pixel F1.

In the above case, at least one selected from the planar shape of the first intermediate layer 28-2A and the planar shape of the upper end OP-UE of the opening OP of the pixel-defining layer 29 may be the same as (e.g., may correspond to) the planar shape of the lower end OP-DE of the opening OP of the pixel-defining layer 29 and may have a different size from that of the planar shape of the lower end OP-DE. A straight-line distance from an edge of at least one selected from the planar shape of the first intermediate layer 28-2A and the planar shape of the upper end OP-UE of the opening OP of the pixel-defining layer 29 to the planar shape of the lower end OP-DE of the opening OP of the pixel-defining layer 29 may be the same for (e.g., along) the entire edge of the planar shape of the lower end OP-DE of the opening OP of the pixel-defining layer 29.

In some embodiments, the planar shape of the first intermediate layer 28-2A may be different from the planar shape of the lower end OP-DE of the opening OP of the pixel-defining layer 29. Even in this case, as described above, the planar shape of the lower end OP-DE of the opening OP of the pixel-defining layer 29 and the planar shape of the upper end OP-UE of the opening OP of the pixel-defining layer 29 may be arranged inside the planar shape of the first intermediate layer 28-2A (e.g., when viewed in the plan view). However, hereinafter, for convenience of description, a case where the planar shape of the lower end OP-DE of the opening OP of the pixel-defining layer 29, the planar shape of the upper end OP-UE of the opening OP of the pixel-defining layer 29, and the planar shape of the intermediate layer 28-2A are all the same as (e.g., all correspond to) the planar shape the first sub-pixel F1 described above will be mainly described in more detail.

Figure 24C:
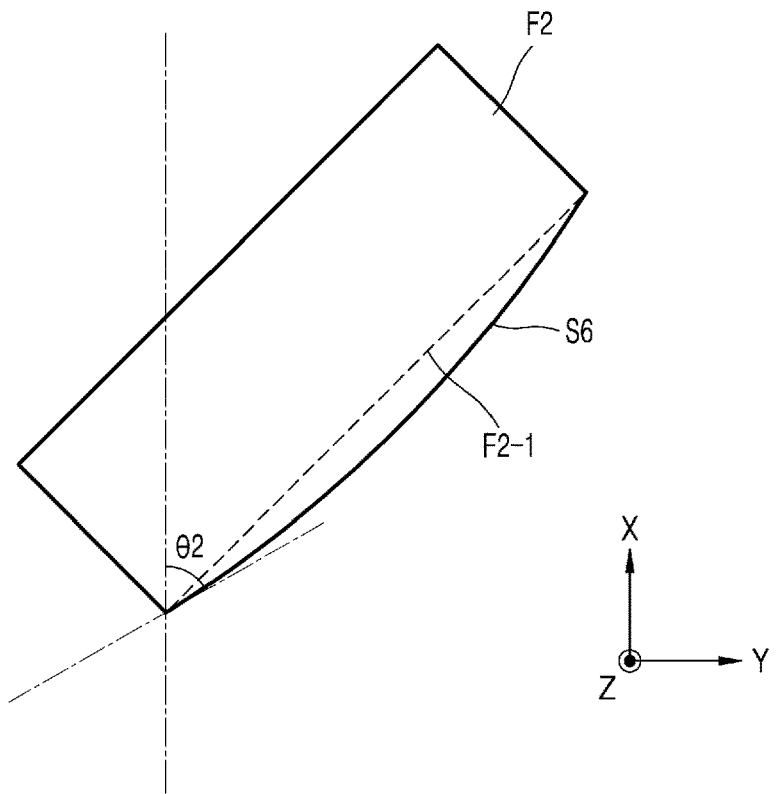
FIG. 24C is a plan view of the second sub-pixel of FIG. 20.
Figure 24D:
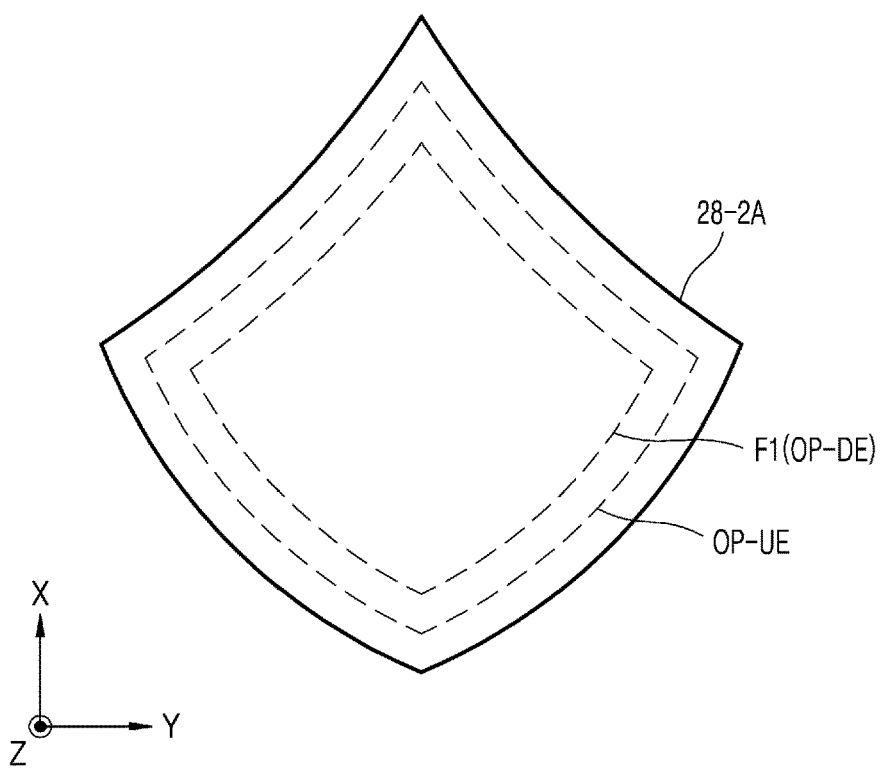
FIG. 24D is a plan view illustrating a relationship among a first sub-pixel, an opening of a pixel-defining layer, and a first intermediate layer shown in FIG. 24A.

FIG. 24C is a plan view of the second sub-pixel F2 of FIG. 20.

Referring to FIG. 24C, the second sub-pixel F2 may have a curve in which the sixth side S6 protrudes away from the center of the second sub-pixel F2 as described above (see FIG. 20). In this case, the planar area of the second sub-pixel F2 may be greater than that of a case where the second sub-pixel F2 is quadrangular. For example, when the vertices of the second sub-pixel F2 are connected to each other in a straight line, the second sub-pixel F2 may have a rectangular shape F2-1. In this case, the sixth side S6 may have a shape that protrudes farther from the center of the second sub-pixel F2 than a straight line connecting vertices arranged at the ends of the sixth side S6.

In the above case, the actual planar area of the second sub-pixel F2 may be greater than the planar area of the rectangular shape F2-1 obtained by connecting the vertices of the second sub-pixel F2 to each other.

In the above case, a tangent line of the sixth side S6, which is a curved line, may form a second angle θ2 with respect to a straight line parallel to an arbitrary straight line passing through the center of the second sub-pixel F2. In this case, the arbitrary straight line passing through the center of the second sub-pixel F2 may be a straight line passing through the centers of a plurality of second sub-pixels F2 arranged in the X-axis direction in FIG. 20. The second angle θ2 may be an acute angle and may be in a range of about 20 degrees or more and about 70 degrees or less.

In the above case, a relationship among the second sub-pixel F2, the opening OP of the pixel-defining layer 29, and the second intermediate layer 28-2B may be determined similarly to the relationship among the first sub-pixel F1, the opening OP of the pixel-defining layer 29, and the first intermediate layer 28-2A shown in FIG. 24D.

FIG. 24B is a plan view of the third sub-pixel F3 of FIG. 20.

Referring to FIG. 24B, the third sub-pixel F3 may have a curve in which the twelfth side S12 protrudes away from the center of the third sub-pixel F3 as described above (see FIG. 20). In this case, the planar area of the third sub-pixel F3 may be greater than that of a case where the third sub-pixel F3 has a quadrangular shape. For example, when the vertices of the third sub-pixel F3 are connected to each other in a straight line, the third sub-pixel F3 may have a rectangular shape F3-1. In this case, the twelfth side S12 may have a shape that protrudes farther from the center of the third sub-pixel F3 than a straight line connecting vertices arranged at the ends of the twelfth side S12.

In the above case, the actual planar area of the third sub-pixel F3 may be greater than the planar area of the rectangular shape F3-1 obtained by connecting the vertices of the third sub-pixel F3 to each other.

In the above case, a tangent line of the twelfth side S12, which is a curved line, may form a third angle θ3 with respect to a straight line parallel to an arbitrary straight line passing through the center of the third sub-pixel F3. In this case, the arbitrary straight line passing through the center of the third sub-pixel F3 may be a straight line passing through the centers of a plurality of third sub-pixels F3 arranged with each other in the X-axis direction in FIG. 20. The third angle θ3 may be an acute angle and may be in a range of about 20 degrees or more and about 70 degrees or less.

In the above case, a relationship among the third sub-pixel F3, the opening OP of the pixel-defining layer 29, and the third intermediate layer 28-2C may be determined similarly to the relationship among the first sub-pixel F1, the opening OP of the pixel-defining layer 29, and the first intermediate layer 28-2A shown in FIG. 24D.

Figure 25:
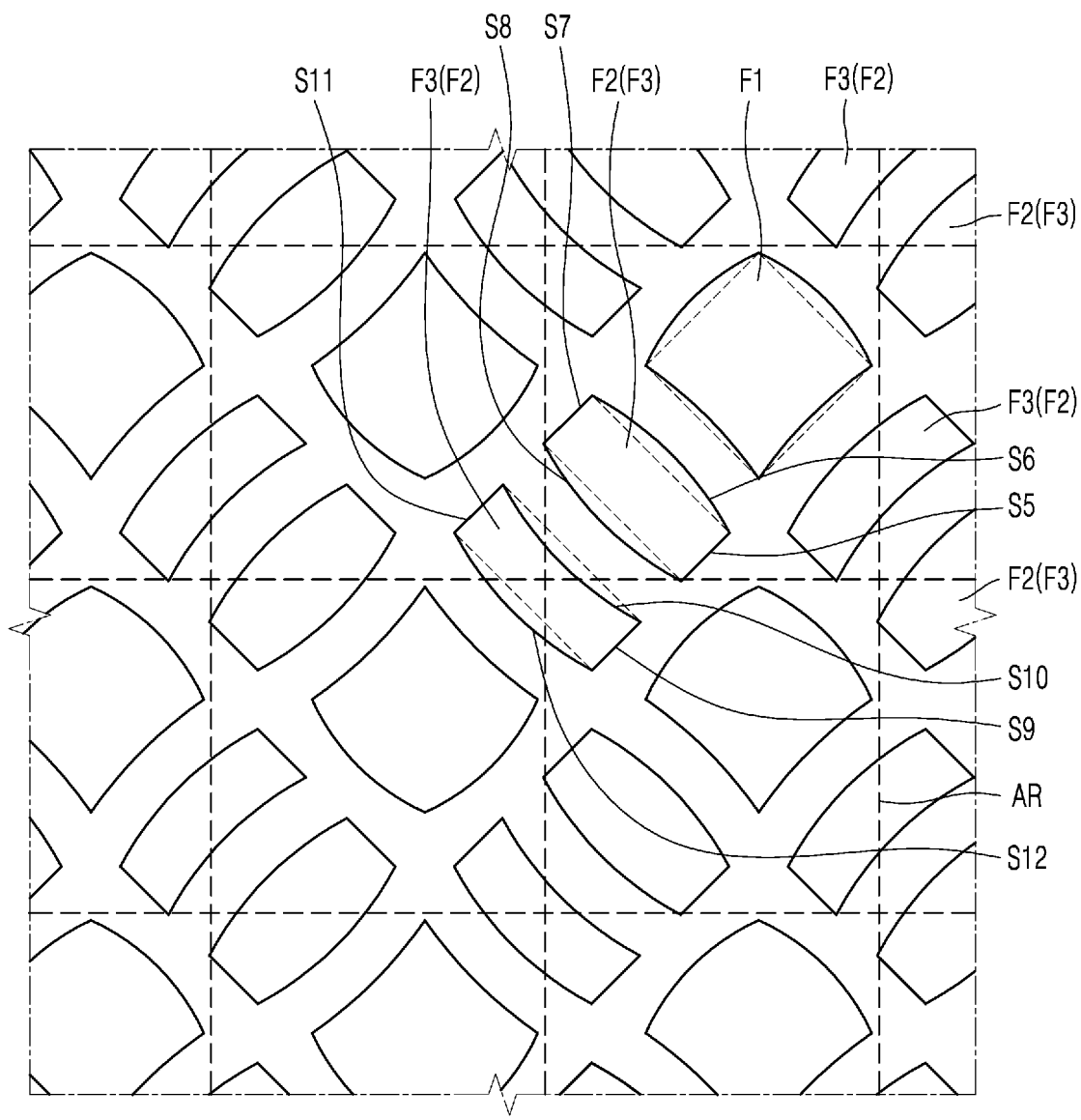
FIG. 25 is a plan view illustrating a first sub-pixel, a second sub-pixel, and a third sub-pixel of a display device according to another embodiment.
Figure 26A:
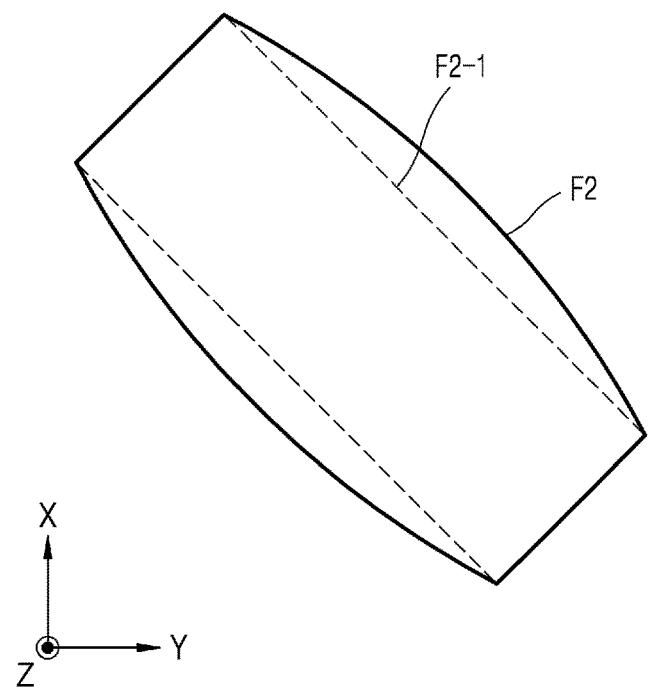
FIG. 26A is a plan view of the second sub-pixel shown in FIG. 25.
Figure 26B:
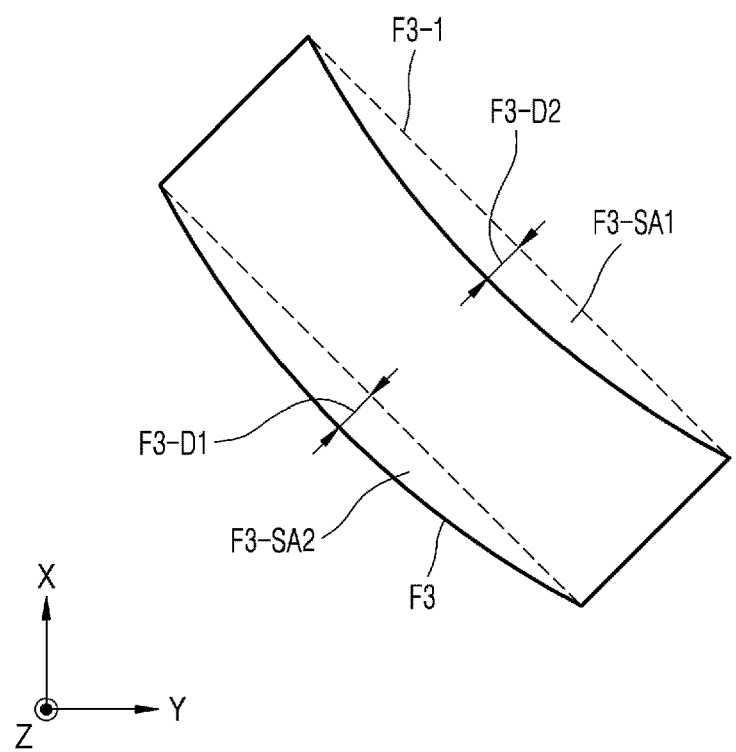
FIG. 26B is a plan view of the third sub-pixel shown in FIG. 25.

FIG. 25 is a plan view illustrating a first sub-pixel, a second sub-pixel, and a third sub-pixel of a display device according to another embodiment. FIG. 26A is a plan view of the second sub-pixel shown in FIG. 25. FIG. 26B is a plan view of the third sub-pixel shown in FIG. 25.

Referring to FIGS. 25 to 26B, a plurality of sub-pixels may be arranged to be spaced apart from each other in a display area of a display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light. In this case, the first sub-pixel F1, the second sub-pixel F2, and the third sub-pixel F3 may be arranged in the same manner as or similar to those shown in FIG. 20.

Because the first sub-pixel F1 is the same as or similar to that shown in FIG. 20, a more detailed description thereof may not be provided.

A fifth side S5 and a seventh side S7 of the second sub-pixel F2 may each have a linear shape. On the other hand, a sixth side S6 and an eighth side S8 may each have a protruding curved shape. In this case, the area of the planar shape of the second sub-pixel F2 may be greater than the area of the planar shape of a virtual rectangular shape F2-1 obtained by connecting the vertices of the second sub-pixel F2. For example, the sixth side S6 and the eighth side S8 may protrude farther from the second sub-pixel F2 than a straight line connecting the ends of the sixth side S6 and a straight line connecting the ends of the eighth side S8, respectively.

A tenth side S10 and an eleventh side S11 of the third sub-pixel F3 may each be formed in a linear shape. In addition, a ninth side S9 and a twelfth side S12 may each be formed in a curved shape. In this case, the ninth side S9 may have a concave shape, and the twelfth side S12 may have a convex shape. In the above case, compared to a case where each side of the third sub-pixel F3 is a straight line, a sixth area F3-SA1 of the third sub-pixel F3, which is reduced by the shape of the ninth side S9, may be less than a fifth area F3-SA2 that is increased by the shape of the twelfth side S12. In this case, a fifth straight-line distance F3-D1 between the twelfth side S12 and an arbitrary straight line (e.g., a line connecting the vertices at the ends of the twelfth side S12) may be greater than a sixth straight-line distance F3-D2 between the ninth side S9 and an arbitrary straight line (e.g., a straight line connecting the vertices at the ends of the ninth side S9). The fifth straight-line distance F3-D1 and the sixth straight-line distance F3-D2 may be measured in a similar manner to the first straight-line distance F1-D1 to the fourth straight-line distance F1-D4 described above.

In the above case, the planar area of the first sub-pixel F1, the planar area of the second sub-pixel F2, and the planar area of the third sub-pixel F3 may be further increased as compared to those in a case where each of the sides of each of the first to third sub-pixels F1 to F3 is a straight line. In this case, an area occupied, in a pixel area AR, by at least one of the plurality of sub-pixels arranged in the pixel area AR may be greater than that in a case where each side of each sub-pixel is a straight line.

Accordingly, a sub-pixel including a curve in the planar shape thereof has an increased area of (e.g., in) a pixel area AR than that of a sub-pixel having sides each having a linear shape, and thus, the life and emission area of the sub-pixel including a curve may increase.

Figure 27:
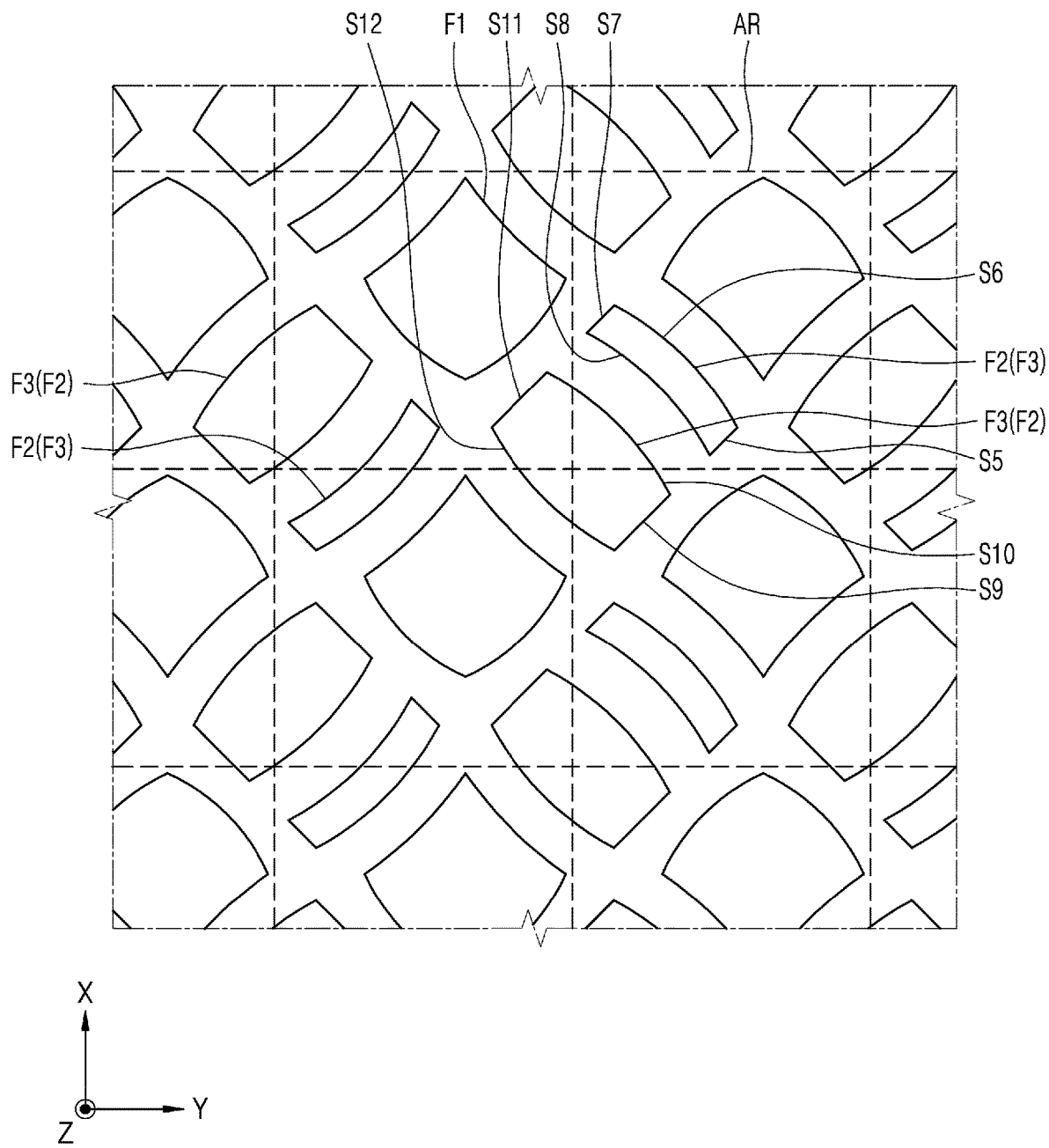
FIG. 27 is a plan view illustrating a first sub-pixel, a second sub-pixel, and a third sub-pixel of a display device according to another embodiment.

FIG. 27 is a plan view illustrating a first sub-pixel, a second sub-pixel, and a third sub-pixel of a display device according to another embodiment.

Referring to FIG. 27, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light. In this case, the first sub-pixel F1, the second sub-pixel F2, and the third sub-pixel F3 may be arranged similar to those shown in FIG. 20. Because the first sub-pixel F1 has the same shape as that shown in FIG. 20, a more detailed description thereof may not be provided.

The second sub-pixel F2 may have a shape corresponding to that of the third sub-pixel F3 shown in FIG. 25. On the other hand, the third sub-pixel F3 may have a shape corresponding to that of the second sub-pixel F2 shown in FIG. 25. For example, a sixth side S6 (see FIG. 20) of the second sub-pixel F2 may have a protruding curve, and an eighth side S8 may have a concave curved shape. In this case, a fifth side S5 and a seventh side S7, which connect the end(s) of the sixth side S6 to the eighth side S8, may each have a linear shape. In addition, a ninth side S9 and a twelfth side S12 of the third sub-pixel F3 may each have a protruding curved shape. In this case, the planar area of the second sub-pixel F2 may be equal to or greater than the planar area of the second sub-pixel F2 when each of the sides of the second sub-pixel F2 is a straight line. Also, the planar area of the third sub-pixel F3 may be greater than the planar area of the third sub-pixel F3 when each of the sides of the third sub-pixel F3 is a straight line.

In the above case, the distance between the end of the ninth side S9 of the third sub-pixel F3 and the end of the twelfth side S12 may be different from the distance between the end of the sixth side S6 of the second sub-pixel F2 and the end of the eighth side S8. For example, the distance between the end of the ninth side S9 of the third sub-pixel F3 and the end of the twelfth side S12 may be greater than the distance between the end of the sixth side S6 of the second sub-pixel F2 and the end of the eighth side S8.

When the first sub-pixel F1, the second sub-pixel F2, and the third sub-pixel F3 are formed as described above, the planar area of at least one of the first sub-pixel F1, the second sub-pixel F2, and the third sub-pixel F3 in the pixel area AR may be increased as compared to when each of the sides of each of the first to third sub-pixels F1 to F3 is a straight line. In this case, as the planar area of at least one selected from the first sub-pixel F1, the second sub-pixel F2, and the third sub-pixel F3 in the pixel area AR may increase, the life of a sub-pixel having an increased area may increase. In addition, by arranging a sub-pixel in which at least one side of the planar shape thereof includes a curve, reflection of external light by the inner surface of an opening of a pixel-defining layer may be reduced.

Figure 28:
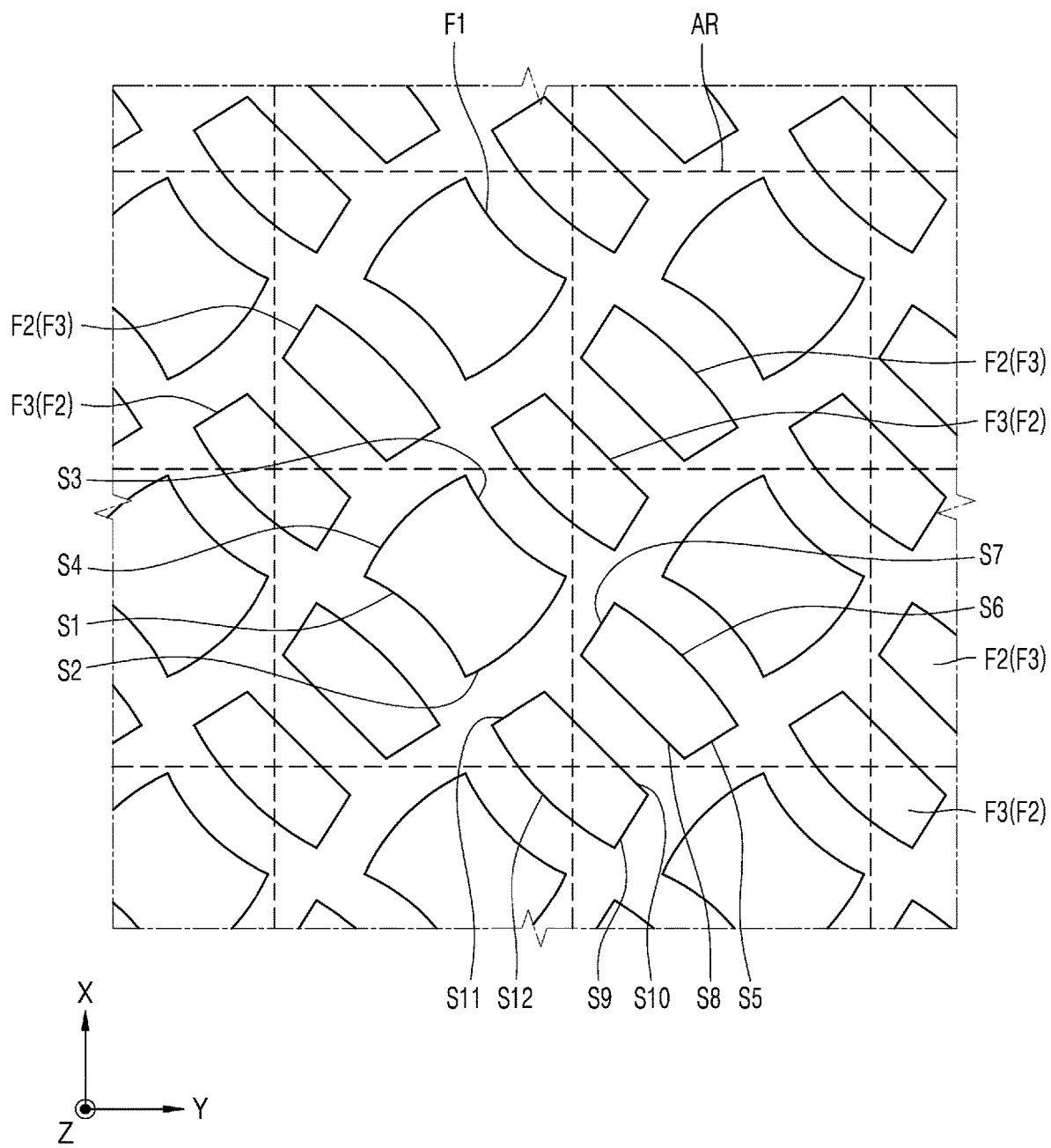
FIG. 28 is a plan view illustrating a first sub-pixel, a second sub-pixel, and a third sub-pixel of a display device according to another embodiment.

FIG. 28 is a plan view illustrating a first sub-pixel, a second sub-pixel, and a third sub-pixel of a display device according to another embodiment.

Referring to FIG. 28, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light.

In the above case, the second sub-pixel F2 and the third sub-pixel F3 may be arranged to be adjacent to the first sub-pixel F1. In this case, the first sub-pixel F1, the second sub-pixel F2, and the third sub-pixel F3 may be arranged in one direction. For example, the center of the first sub-pixel F1, the center of the second sub-pixel F2, and the center of the third sub-pixel F3 may be arranged with each other on a straight line. Also, the first sub-pixel F1, the second sub-pixel F2, and the third sub-pixel F3 may be arranged tilted with respect to a user's viewing direction. For example, in the first sub-pixel F1, the second sub-pixel F2, and the third sub-pixel F3, a straight line connecting vertices adjacent to each other may not form a right angle with, or may not be parallel to, a straight line connecting the centers of first sub-pixels F1.

In this case, at least one selected from the first side S1, the second side S2, the third side S3 and the fourth side S4 of the first sub-pixel F1 may be protruding or retracted. Also, at least one selected from the first side S1, the second side S2, the third side S3 and the fourth side S4 of the first sub-pixel F1 may be curved. For example, as shown in FIG. 28, the first side S1 and the third side S3 of the first sub-pixel F1 may be concave curves, and the second side S2 and the fourth side S4 of the first sub-pixel F1 may be convex curves. In some embodiments, the first side S1, the second side S2, the third side S3 and the fourth side S4 of the first sub-pixel F1 may all be formed to be straight lines, concave curves, or convex curves different from those shown in the drawings. In this case, when the first side S1, the second side S2, the third side S3, and the fourth side S4 of the first sub-pixel F1 are all formed to be straight, the planar shape of the first sub-pixel F1 may be a rhombus or square shape.

The second sub-pixel F2 and the third sub-pixel F3 may be arranged to face at least one selected from the first side S1, the second side S2, the third side S3, and the fourth side S4 of the first sub-pixel F1 (e.g., of one or more of adjacent first sub-pixels F1). In this case, the second sub-pixel F2 and the third sub-pixel F3 may be arranged such that a short side of the second sub-pixel F2 and a short side of the third sub-pixel F3 face one side of the first sub-pixel F1 or a long side of the second sub-pixel F2 and a long side of the third sub-pixel F3 face one side of the first sub-pixel F1.

In the above case, at least one selected from the fifth side S5, the sixth side S6, the seventh side S7 and the eighth side S8 of the second sub-pixel F2 may be concave or convex, and may be curved. In addition, at least one selected from the ninth side S9, the tenth side S10, the eleventh side S11 and the twelfth side S12 of the third sub-pixel F3 may be concave or convex, and may be curved.

In the above case, the sixth side S6 of the second sub-pixel F2 may have a convex curved shape, and the twelfth side S12 of the third sub-pixel F3 may have a convex curved shape. In this case, the first side S1 of the first sub-pixel F1 facing the sixth side S6, and the third side S3 of the first sub-pixel F1 facing the twelfth side S12, may each have a concave curved shape. In this case, a straight-line distance, which is the shortest distance from a point of the sixth side S6 to the first side S1, may be constant throughout the sixth side S6 in a length direction of the sixth side S6, and a straight-line distance, which is the shortest distance from a point of the twelfth side S12 to the third side S3, may be the same for the entire twelfth side S12 in a length direction of the twelfth side S12.

In the above case, a spacer may be arranged between the first sub-pixel F1 and the second sub-pixel F2, between the second sub-pixel F2 and the third sub-pixel F3, and/or between the third sub-pixel F3 and the first sub-pixel F1. In this case, the edge of the planar shape of the spacer may correspond to the shape of one side of a sub-pixel adjacent to the spacer. For example, when a spacer is arranged between the first sub-pixel F1 and the third sub-pixel F3, one side of the spacer facing the third side S3 may correspond to the shape of the third side S3. For example, one side of the spacer facing the third side S3 may protrude toward the first sub-pixel F1. Also, another side of the spacer facing the twelfth side S12 may correspond to the shape of the twelfth side S12. For example, the other side of the spacer facing the twelfth side S12 may be retracted (e.g., may be concave) toward the inside of the spacer. In addition, when a spacer is arranged between the second sub-pixel F2 and the third sub-pixel F3, the sides of each sub-pixel adjacent to the spacer are the eighth side S8 and the tenth side S10 and thus the sides of the spacer may be straight. When a spacer is arranged between the first sub-pixel F1 and the second sub-pixel F2, one side of the planar shape of the spacer may correspond to the shape of the first side S1 and another side of the planar shape of the spacer may correspond to the sixth side S6. In this case, the spacer may have a shape similar to the spacer between the third sub-pixel F3 and the first sub-pixel F1. In addition, when a spacer is arranged between the seventh side S7 and the second side S2, one side of the planar shape of the spacer facing the second side S2 may have a retracted curved shape (e.g., a concave shape), and another side of the planar shape of the spacer facing the seventh side S7 may have a linear shape.

Therefore, in the above case, in each sub-pixel, reflection of light due to external light may be reduced. In addition, in some of the plurality of sub-pixels, the life thereof may be increased by securing the maximum planar areas of sub-pixels included in the pixel area AR.

Figure 29:
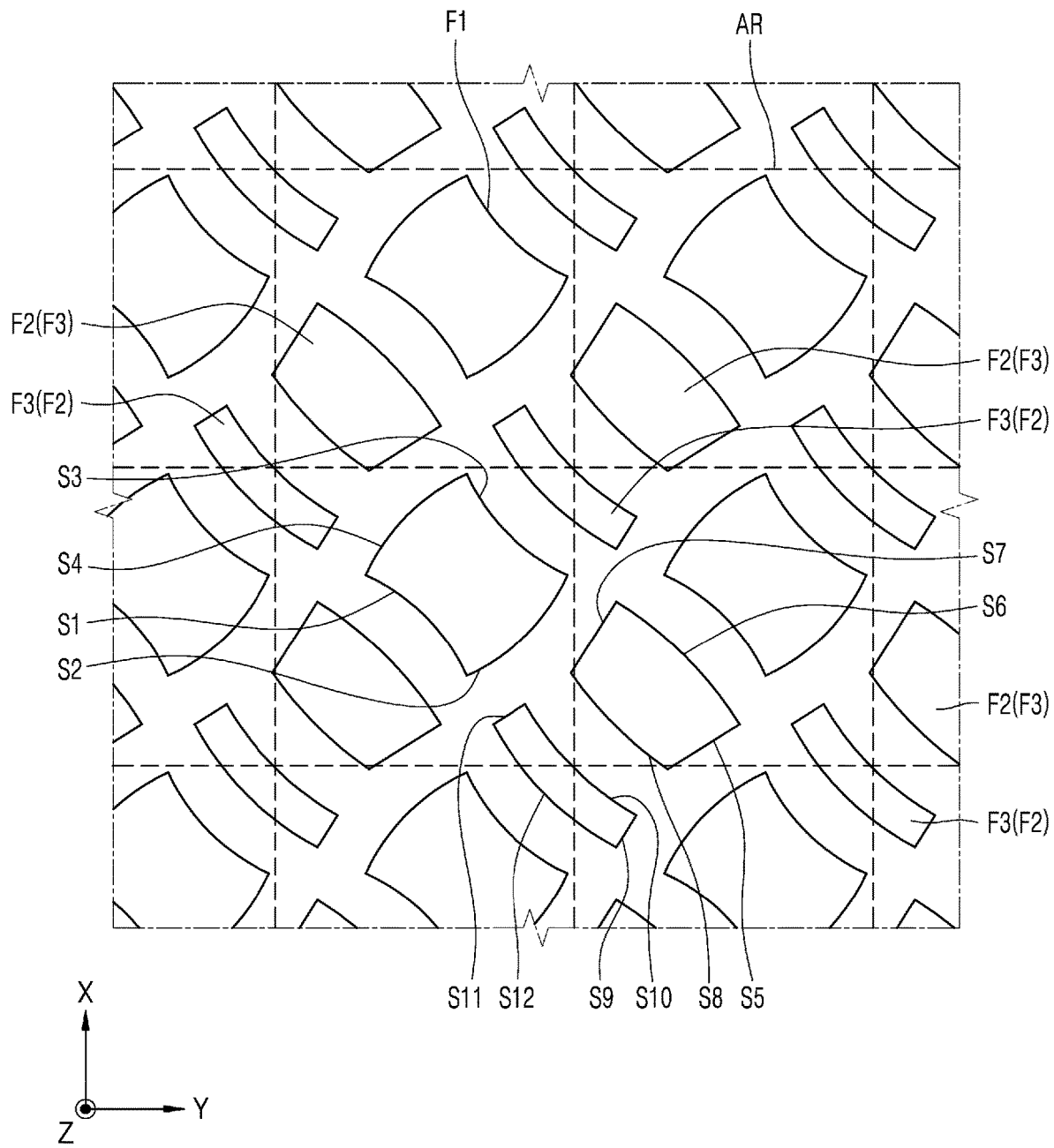
FIG. 29 is a plan view illustrating a first sub-pixel, a second sub-pixel, and a third sub-pixel of a display device according to another embodiment.

FIG. 29 is a plan view illustrating a first sub-pixel, a second sub-pixel, and a third sub-pixel of a display device according to another embodiment.

Referring to FIG. 29, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light. In this case, the first sub-pixel F1 may have a shape that is the same as or similar to that described with reference to FIG. 28.

In the above case, the second sub-pixel F2 may have a sixth side S6 and an eighth side S8, each having a convex curved shape. In addition, the second sub-pixel F2 may have a fifth side S5 and a seventh side S7, each having a linear shape. In this case, the sixth side S6 may be arranged to face a first side S1, and the straight-line distance between the sixth side S6 and the first side S1 may be constant along the side S6 in a length direction of the sixth side S6.

The third sub-pixel F3 may be arranged adjacent to the second sub-pixel F2. In this case, the third sub-pixel F3 may have a twelfth side S12 having a convex curved shape, a tenth side S10 having a concave curved shape, and a ninth side S9 and an eleventh side S11 each having a linear shape.

In the above case, spacers may be arranged between respective two sub-pixels. In this case, each side of the edge of the planar shape of each of the spacers may have a shape corresponding to the shape of each side of the planar shape of a sub-pixel adjacent to the spacer.

In the above case, one side of the planar shape of each sub-pixel may have a shape corresponding to one side of the planar shape of another sub-pixel adjacent to the sub-pixel. In this case, the distance between sub-pixels adjacent to each other is constant, and thus a space in which a spacer is arranged may be provided.

In addition, at least one side of the edge of the planar shape of each sub-pixel is formed to have a curved shape, and thus reflection of external light may be reduced.

In addition, the planar shape of each sub-pixel includes one side having a protruding curved shape, and thus the areas of sub-pixels arranged in the pixel area AR may increase.

Figure 30:
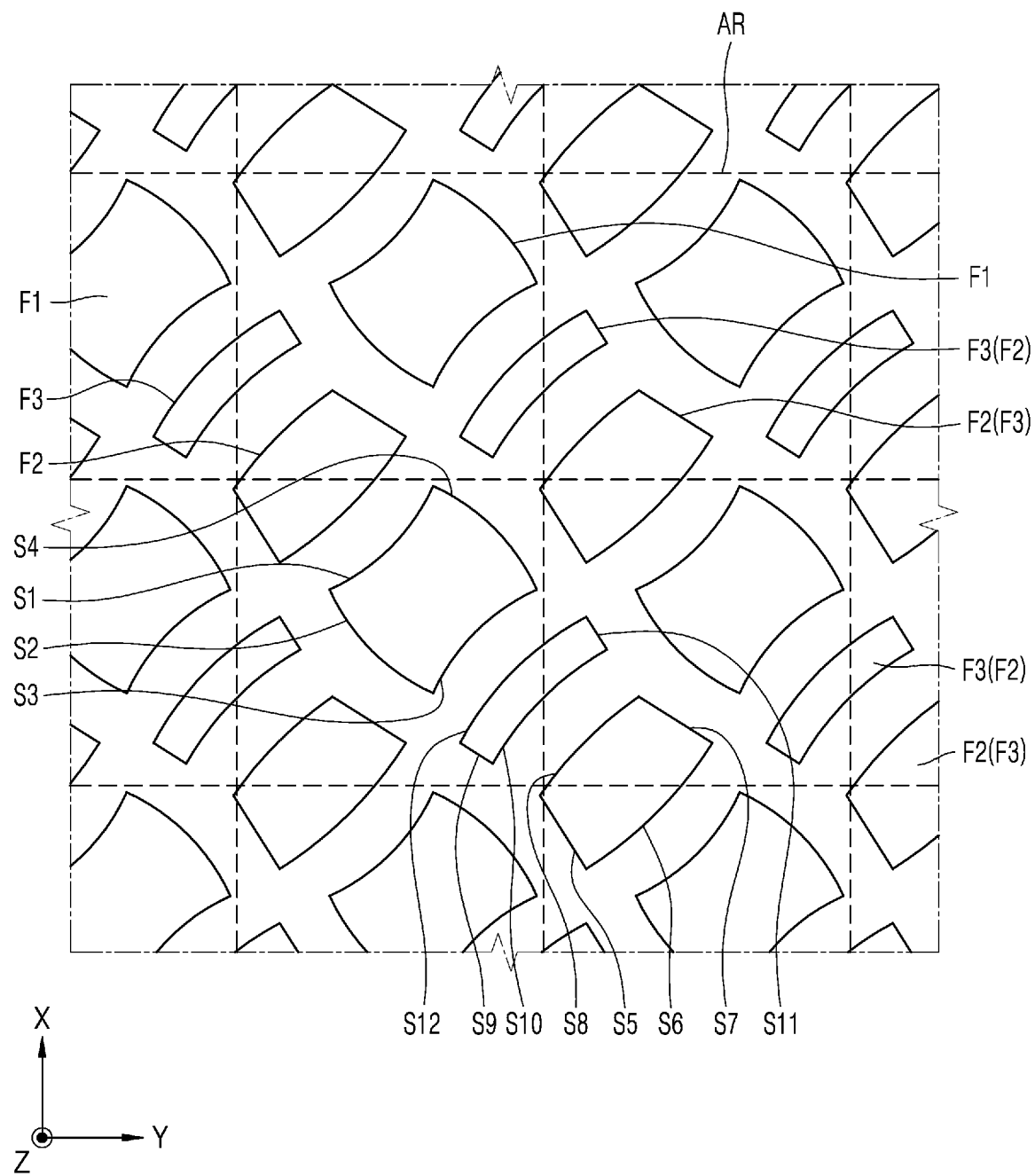
FIG. 30 is a plan view illustrating a first sub-pixel, a second sub-pixel, and a third sub-pixel of a display device according to another embodiment.

FIG. 30 is a plan view illustrating a first sub-pixel, a second sub-pixel, and a third sub-pixel of a display device according to another embodiment.

Referring to FIG. 30, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light.

The first sub-pixel F1, the second sub-pixel F2, and the third sub-pixel F3 as described above may have shapes obtained by rotating, by 90 degrees (e.g., in a clockwise angular direction), each of the first sub-pixel F1, the second sub-pixel F2, and the third sub-pixel F3 shown in FIG. 29, based on the center of one sub-pixel (e.g., based on their respective centers). In this case, the shapes of the first sub-pixel F1, the second sub-pixel F2, and the third sub-pixel F3 may be the same as those shown in FIG. 29.

In the above case, spacers may be arranged between each two sub-pixels (e.g., each two adjacent sub-pixels). In this case, each side of the edge of the planar shape of each of the spacers may have a shape corresponding to the shape of each side (e.g., a side facing the spacer) of the planar shape of a sub-pixel adjacent to the spacer.

Figure 31:
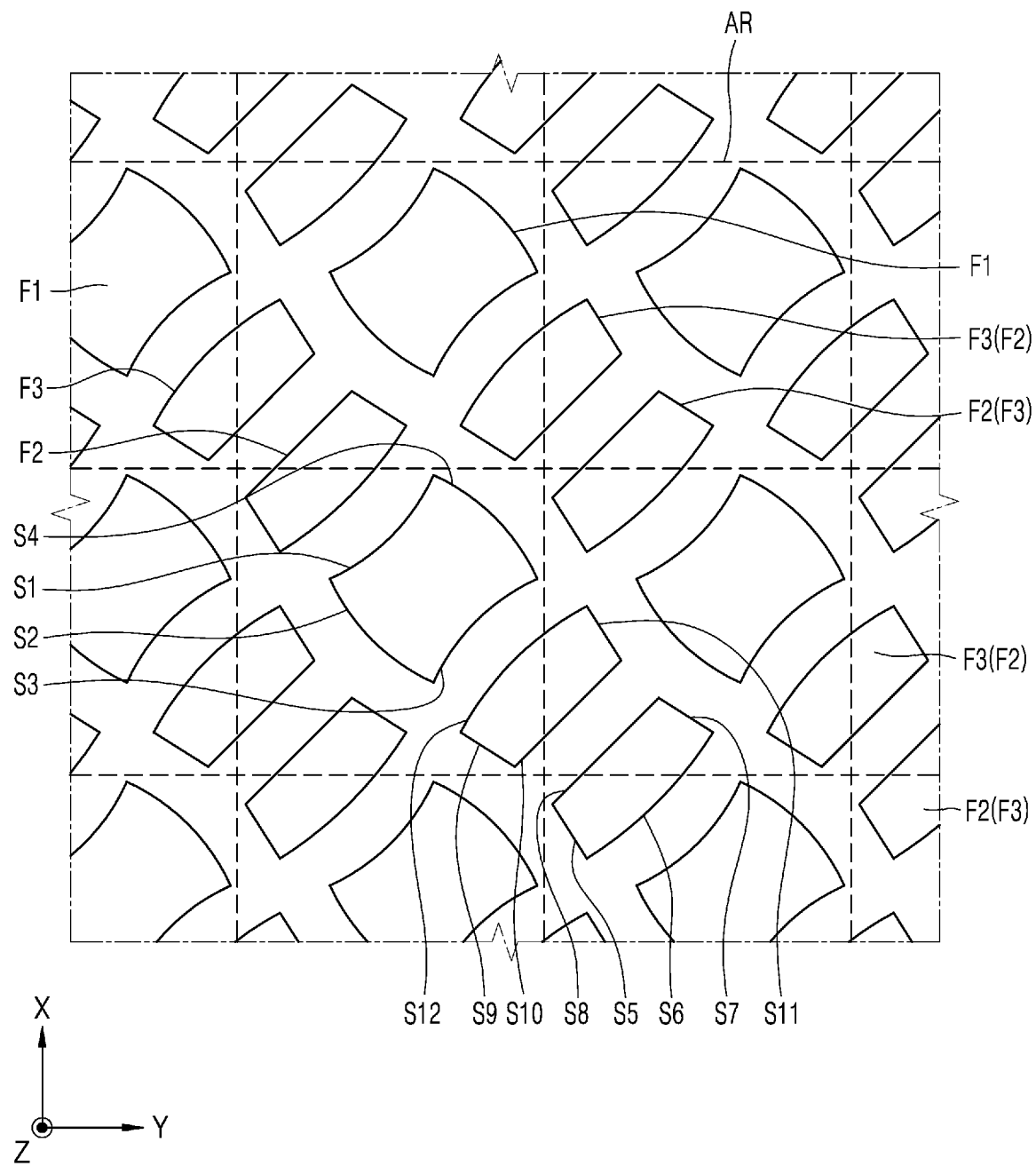
FIG. 31 is a plan view illustrating a first sub-pixel, a second sub-pixel, and a third sub-pixel of a display device according to another embodiment.

FIG. 31 is a plan view illustrating a first sub-pixel, a second sub-pixel, and a third sub-pixel of a display device according to another embodiment.

Referring to FIG. 31, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light. In this case, the first sub-pixel F1 may have a shape that is the same as or similar to that arranged in FIG. 30.

A short side of the second sub-pixel F2 and a short side of the third sub-pixel F3 may be arranged adjacent to the second side S2 and the fourth side S4 of the first sub-pixel F1. In addition, a long side of the second sub-pixel F2 and a long side of the third sub-pixel F3 may be arranged adjacent to the first side S1 or the third side S3 of the first sub-pixel F1.

In this case, the sides of sub-pixels adjacent to each other may have shapes corresponding to each other. For example, one side of one sub-pixel that faces another side of another sub-pixel adjacent to the one sub-pixel may have a shape that corresponds to a shape of the other side of the other sub-pixel. For example, the first side S1 and the third side S3 may be concave, and the sixth side S6 and the twelfth side S12 facing the first side S1 and the third side S3, respectively, may be convex. On the other hand, the eighth side S8 and the tenth side S10 facing each other may be straight.

In addition to the above case, the shapes of the sides of sub-pixels facing each other may be different from each other. For example, the second side S2 facing the seventh side S7 and the eleventh side S11, and the fourth side S4 facing the fifth side S5 and the ninth side S9 may each have a protruding curved shape. On the other hand, the fifth side S5, the seventh side S7, the ninth side S9, and the eleventh side S11 may all be straight. In another embodiment, the fifth side S5, the seventh side S7, the ninth side S9 and the eleventh side S11 may each have a concave curved shape to correspond to the second side S2 or the fourth side S4.

In the above case, spacers may be arranged between each two sub-pixels (e.g., each two adjacent sub-pixels). In this case, each side of the edge of the planar shape of each of the spacers may have a shape corresponding to the shape of each side (e.g., a side facing the spacer) of the planar shape of a sub-pixel adjacent to the spacer.

Figure 32:
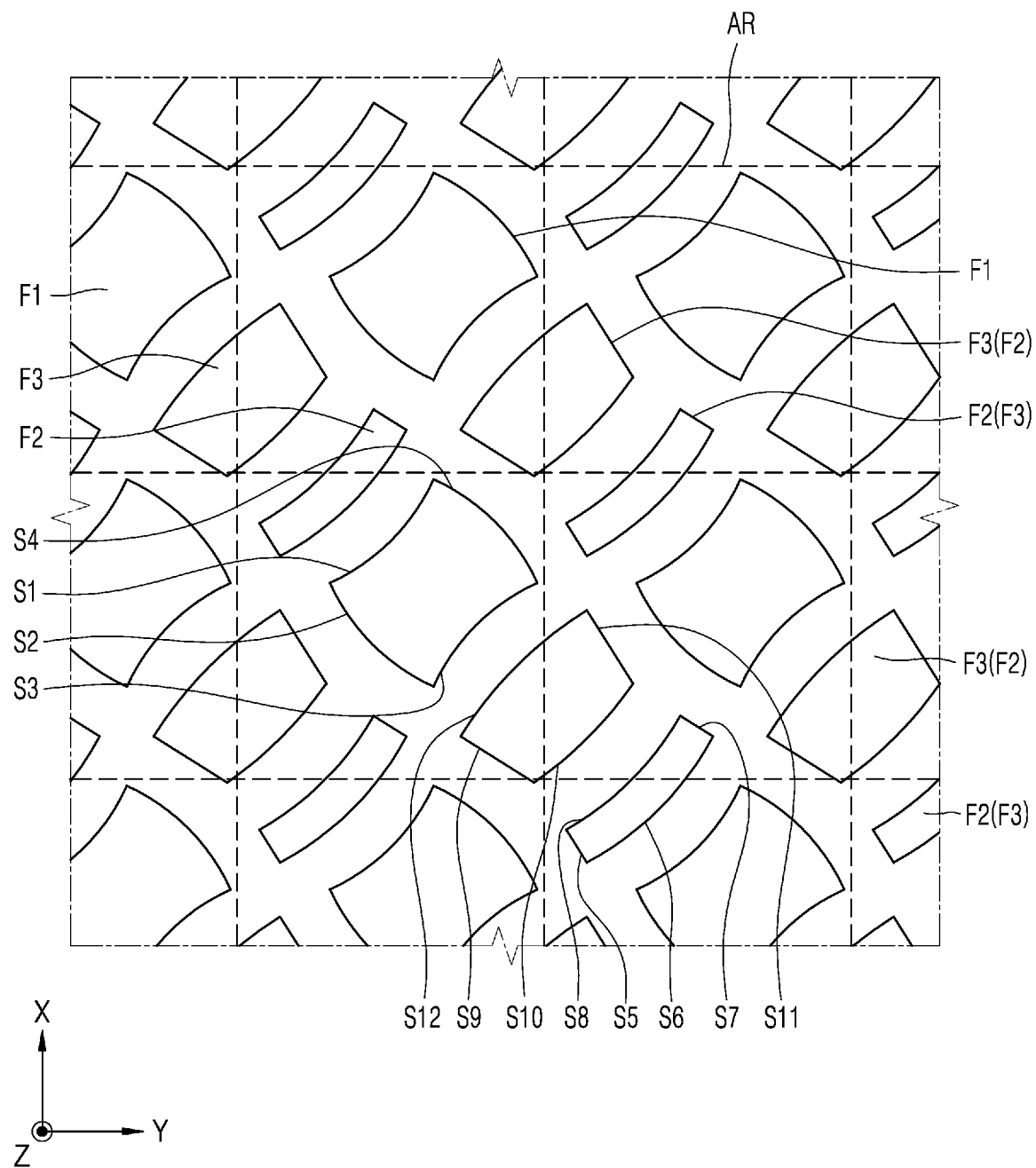
FIG. 32 is a plan view illustrating a first sub-pixel, a second sub-pixel, and a third sub-pixel of a display device according to another embodiment.

FIG. 32 is a plan view illustrating a first sub-pixel, a second sub-pixel, and a third sub-pixel of a display device according to another embodiment.

Referring to FIG. 32, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light.

The first sub-pixel F1 may be the same as that of FIG. 31 described above. The second sub-pixel F2 may be the same (e.g., may have the same or similar shape) as the third sub-pixel F3 of FIG. 30, and the third sub-pixel F3 may be the same (e.g., may have the same or similar shape) as the second sub-pixel F2 of FIG. 30. In another embodiment, the first sub-pixel F1 may be the same as that of FIG. 31 described above. The second sub-pixel F2 of FIG. 32 and the third sub-pixel F3 of FIG. 30 may be the symmetrical, and the third sub-pixel F3 of FIG. 32 and the second sub-pixel F2 of FIG. 30 may be the symmetrical. For example, the tenth side S10 and the twelfth side S12 of the third sub-pixel F3 may each have a convex curved shape, and the ninth side S9 and the eleventh side S11 may each have a linear shape. In addition, the sixth side S6 of the second sub-pixel F2 may have a convex curved shape, the eighth side S8 may have a concave curved shape, and the fifth side S5 and the seventh side S7 may each have a linear shape.

The distance between vertices of the planar shape of the second sub-pixel F2 arranged in the same direction as described above may be less than the distance between vertices of the planar shape of the third sub-pixel F3. Also, the distance between the ends of a long side of the second sub-pixel F2 may be equal to the distance between the ends of a long side of the third sub-pixel F3.

In the above case, spacers may be arranged between each two sub-pixels. In this case, each side of the edge of the planar shape of each of the spacers may have a shape corresponding to the shape of each side (e.g., a side facing the spacer) of the planar shape of a sub-pixel adjacent to the spacer.

Figure 33:
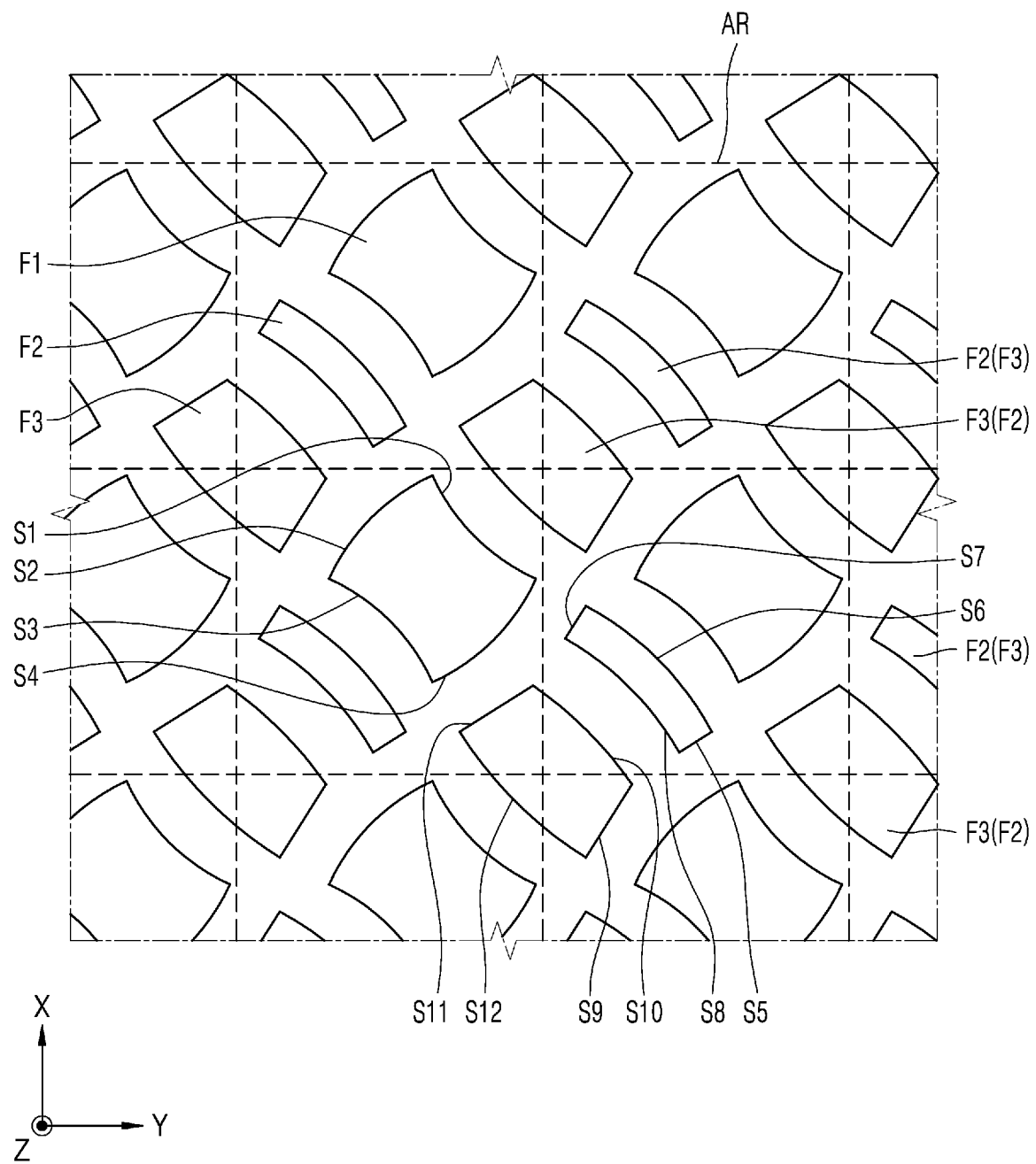
FIG. 33 is a plan view illustrating a first sub-pixel, a second sub-pixel, and a third sub-pixel of a display device according to another embodiment.

FIG. 33 is a plan view illustrating a first sub-pixel, a second sub-pixel, and a third sub-pixel of a display device according to another embodiment.

Referring to FIG. 33, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light.

The first sub-pixel F1 may be the same as that shown in FIG. 29. The third sub-pixel F3 and the second sub-pixel F2 may be arranged adjacent to the first side S1 and the third side S3, respectively. In this case, a long side of the third sub-pixel F3 and a long side of the second sub-pixel F2 may be adjacent to the first side S1 and the third side S3, respectively. Furthermore, a short side of the second sub-pixel F2 and a short side of the third sub-pixel F3 may be adjacent to the second side S2 and the fourth side S4, respectively. For example, one short side of each of the second and third sub-pixels F2 and F3 may be adjacent to the second side S2, and another short side of each of the second and third sub-pixels F2 and F3 may be adjacent to the fourth side S4 (e.g., of another first sub-pixel F1).

In the above case, the sixth side S6 of the second sub-pixel F2, and the tenth side S10 and the twelfth side S12 of the third sub-pixel F3, may each have a convex curved shape. On the other hand, the eighth side S8 of the second sub-pixel F2 may have a concave curved shape. In the above case, the shapes of the sides of sub-pixels adjacent to each other may be formed to correspond to each other.

In the above case, spacers may be arranged between each two sub-pixels. In this case, each side of the edge of the planar shape of each of the spacers may have a shape corresponding to the shape of each side (e.g., a side facing the spacer) of the planar shape of a sub-pixel adjacent to the spacer.

Figure 34:
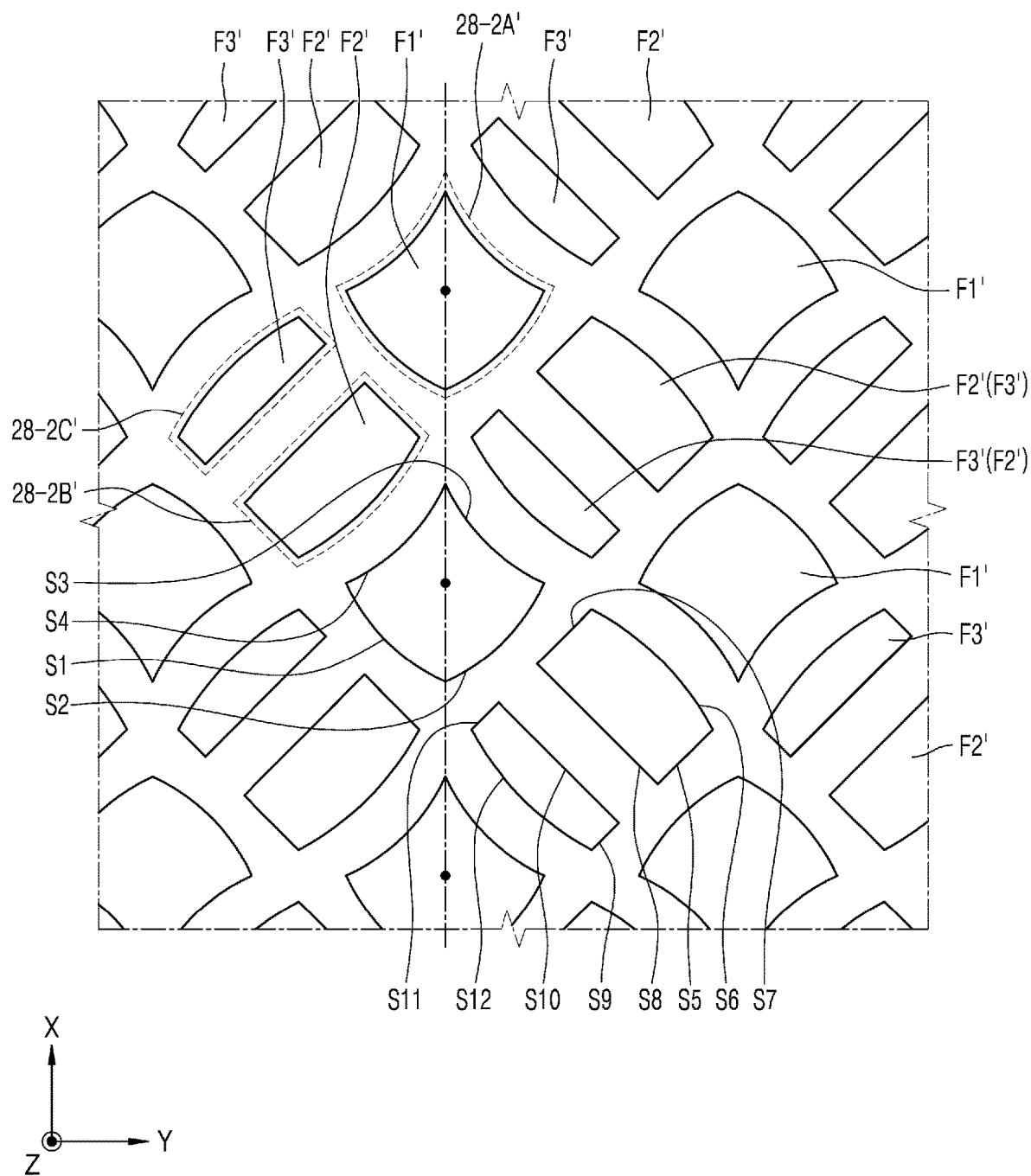
FIG. 34 is a plan view illustrating a first sub-pixel, a second sub-pixel, and a third sub-pixel of a display device according to another embodiment.

FIG. 34 is a plan view illustrating a first sub-pixel, a second sub-pixel, and a third sub-pixel of a display device according to another embodiment.

Referring to FIG. 34, a display device may include a display area and a non-display area defined on a substrate, the non-display area being around the display area. A plurality of sub-pixels including a first sub-pixel F1', a second sub-pixel F2', and a third sub-pixel F3' may be arranged in the display area, and a power line may be arranged in the non-display area. In addition, a pad portion may be arranged in the non-display area. The display device may include a display substrate, an intermediate layer arranged in the display area, an opposite electrode, and a thin-film encapsulation layer.

The first sub-pixel F1', the second sub-pixel F2', and the third sub-pixel F3' may emit light of different colors. For example, one selected from the first sub-pixel F1', the second sub-pixel F2', and the third sub-pixel F3' may emit blue light, another one selected from the first sub-pixel F1', the second sub-pixel F2', and the third sub-pixel F3' may emit red light, and the remaining one selected from the first sub-pixel F1', the second sub-pixel F2', and the third sub-pixel F3' may emit green light.

Hereinafter, for convenience of description, a case where the first sub-pixel F1' is to emit blue light, the second sub-pixel F2' is to emit green light, and the third sub-pixel F3' is to emit red light will be mainly described in more detail.

The first sub-pixel F1' as described above may include a first intermediate layer 28-2A', and the first intermediate layer 28-2A' may correspond to the shape and position of the first sub-pixel F1'. The planar area of the first intermediate layer 28-2A' may be equal to or greater than the planar area of the first sub-pixel F1', and the first sub-pixel F1' may be arranged inside the first intermediate layer 28-2A' (e.g., in the plan view).

The second sub-pixel F2' may include a second intermediate layer 28-2B'. In addition, the second intermediate layer 28-2B' may correspond to the shape and position of the second sub-pixel F2'. The second sub-pixel F2' may be arranged inside the second intermediate layer 28-2B (e.g., in the plan view).

The third sub-pixel F3' may include a third intermediate layer 28-2C'. In addition, the third intermediate layer 28-2C' may correspond to the shape and position of the third sub-pixel F3'. The third sub-pixel F3' may be arranged inside the third intermediate layer 28-2C' (e.g., in the plan view).

The planar area of each of the second sub-pixels F2' and the planar area of each of the third sub-pixels F3' may be different from each other. For example, one selected from the planar area of the second sub-pixel F2' and the planar area of the third sub-pixel F3' may be less than the other one selected from the planar area of the second sub-pixel F2' and the planar area of the third sub-pixel F3'. In an embodiment, the planar area of the second sub-pixel F2' may be less than the planar area of the third sub-pixel F3'. In another embodiment, the planar area of the third sub-pixel F3' may be less than the planar area of the second sub-pixel F2'. Therefore, an aperture ratio of light emitted from each sub-pixel may be adjusted (e.g., adjustable).

As described above, the adjustment of the area of at least one selected from the first sub-pixel F1', the second sub-pixel F2', and the third sub-pixel F3' may be achieved by adjusting an area where a pixel-defining layer exposes a pixel electrode, as described above. In this case, the areas and shapes of the first intermediate layer 28-2A', the second intermediate layer 28-2B', and the third intermediate layer 28-2C' formed by being respectively deposited on the first sub-pixel F1', the second sub-pixel F2', and the third sub-pixel F3' may correspond to the areas and shapes of the first sub-pixel F1', the second sub-pixel F2', and the third sub-pixel F3', respectively, to prevent the sub-pixels from overlapping each other or to reduce the amount of such overlap.

Each of the intermediate layers 28-2A', 28-2B' and 28-2C' as described above may be formed utilizing a mask sheet.

In at least one selected from the first sub-pixel F1', the second sub-pixel F2', and the third sub-pixel F3', at least one side of the edge of the planar shape thereof may have a curved shape. In this case, the first sub-pixel F1' may be the same as that shown in FIG. 20, and the second sub-pixel F2' and the third sub-pixel F3' may be similar to those shown in FIG. 20. In this case, the second sub-pixel F2' may be larger than the third sub-pixel F3', as described above.

In the above, the sides of the planar shapes of sub-pixels facing each other may have shapes corresponding to each other. For example, in FIG. 34, the fourth side S4 may have a concave curved shape, and the sixth side S6 facing the fourth side S4 may have a convex curved shape. Furthermore, the third side S3 may be a concave curve, and the twelfth side S12 facing the third side S3 may be a convex curve. In addition, the eighth side S8 and the tenth side S10 facing each other may be straight.

In addition to the above case, the first side S1 and the second side S2 may be convex curved, while the seventh side S7 and the eleventh side S11 facing the first side S1 or the second side S2 may be straight. In another embodiment, all of the first side S1, the second side S2, the seventh side S7, and the eleventh side S11 may be straight.

In the above case, the shape of each sub-pixel is not limited thereto, and the arrangement of each sub-pixel may have a shape described above with reference to FIGS. 20 to 33. In this case, in at least one selected from the plurality of sub-pixels, one side of the edge of the planar shape thereof may have a protruding curved shape. In this case, because the one side has a protruding curved shape, the areas of some sub-pixels (e.g., the sub-pixels having a protruding curved shape) arranged in the pixel area AR may increase. In addition, when the planar shape of each of the plurality of sub-pixels includes at least one selected from a concave curve and a convex curve, reflection of external light from a pixel-defining layer of each sub-pixel may be reduced.

In the above case, spacers may be arranged between each two of the sub-pixels. In this case, each side of the edge of the planar shape of each of the spacers may have a shape corresponding to the shape of each side (e.g., a side facing the spacer) of the planar shape of a sub-pixel adjacent to the spacer.

Figure 35:
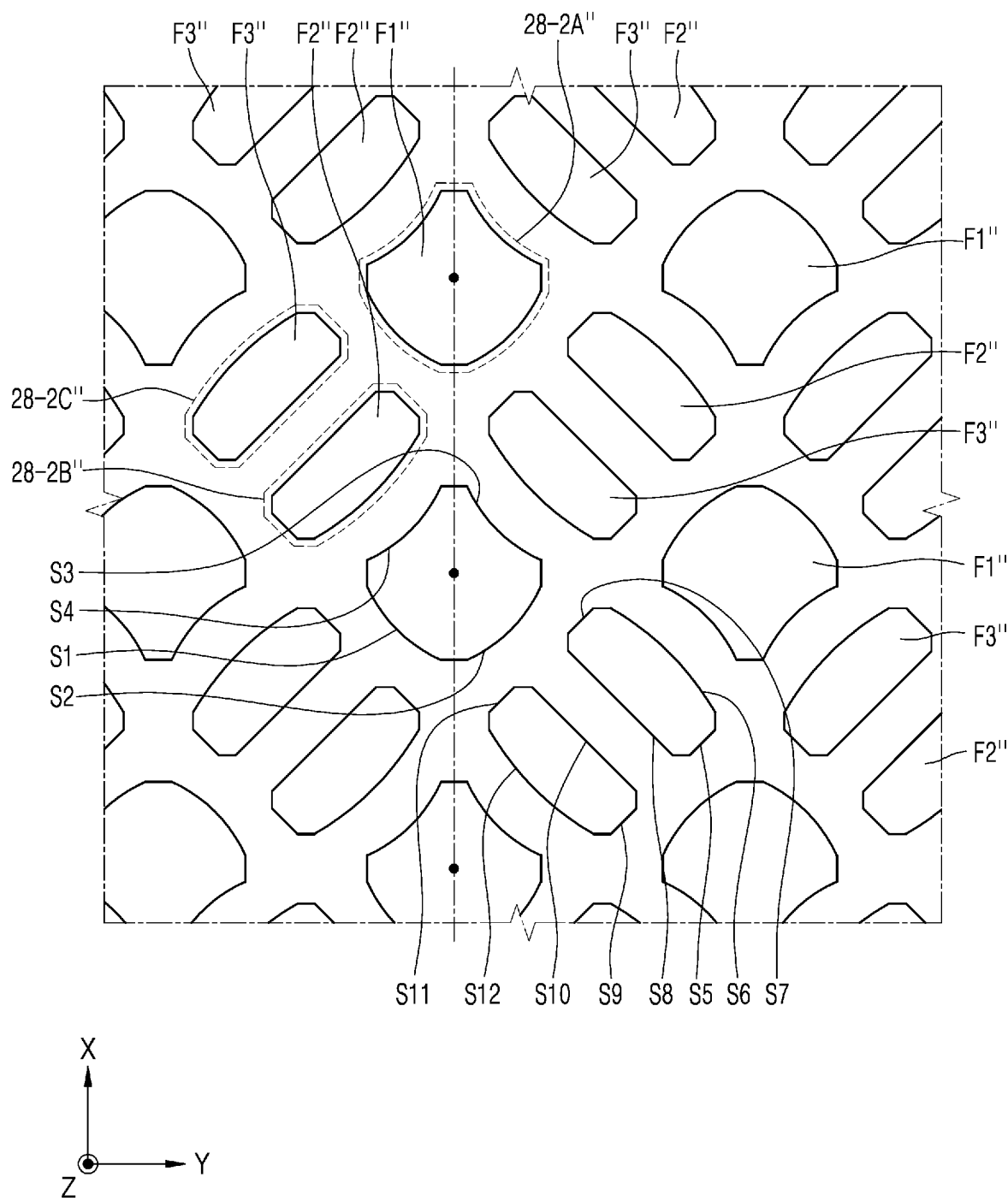
FIG. 35 is a plan view illustrating a first sub-pixel, a second sub-pixel, and a third sub-pixel of a display device according to another embodiment.
Figure 36:
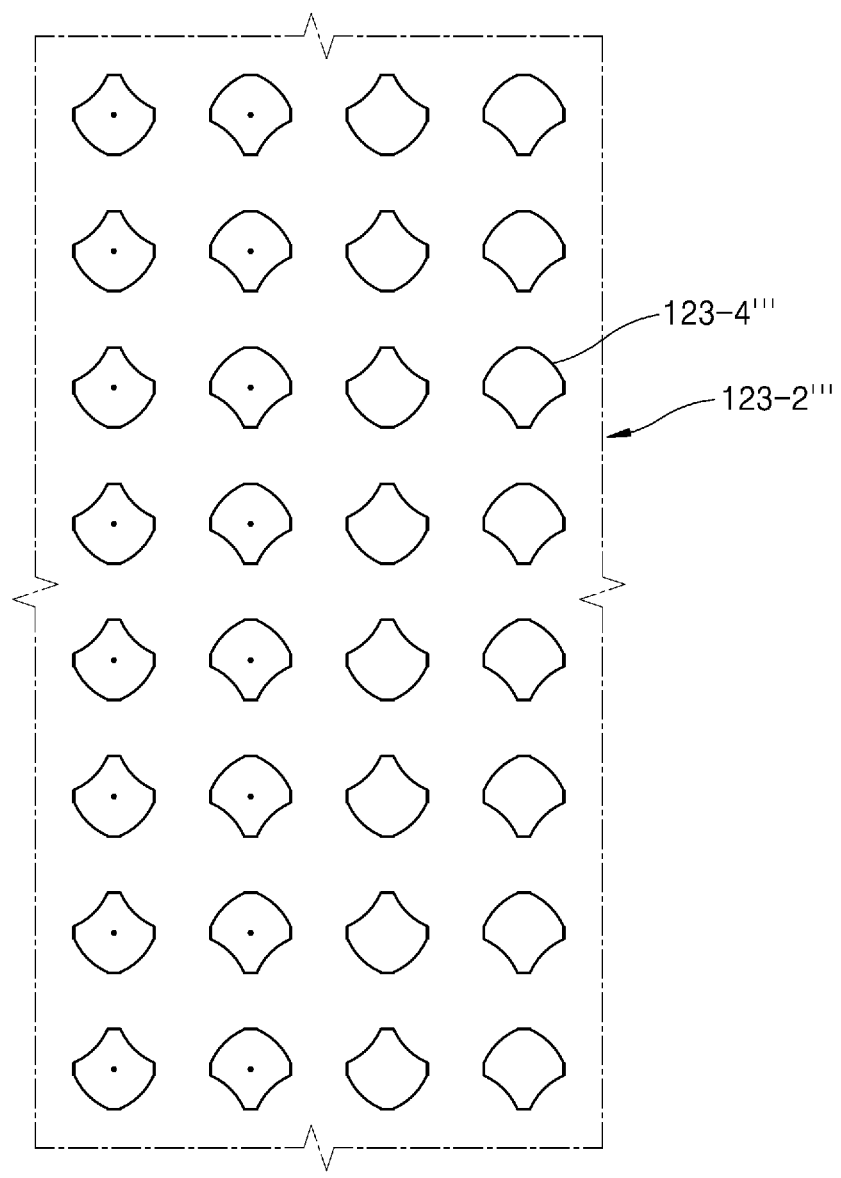
FIG. 36 is a plan view of a portion of a first mask sheet for depositing a first intermediate layer of the first sub-pixel shown in FIG. 35.
Figure 37:
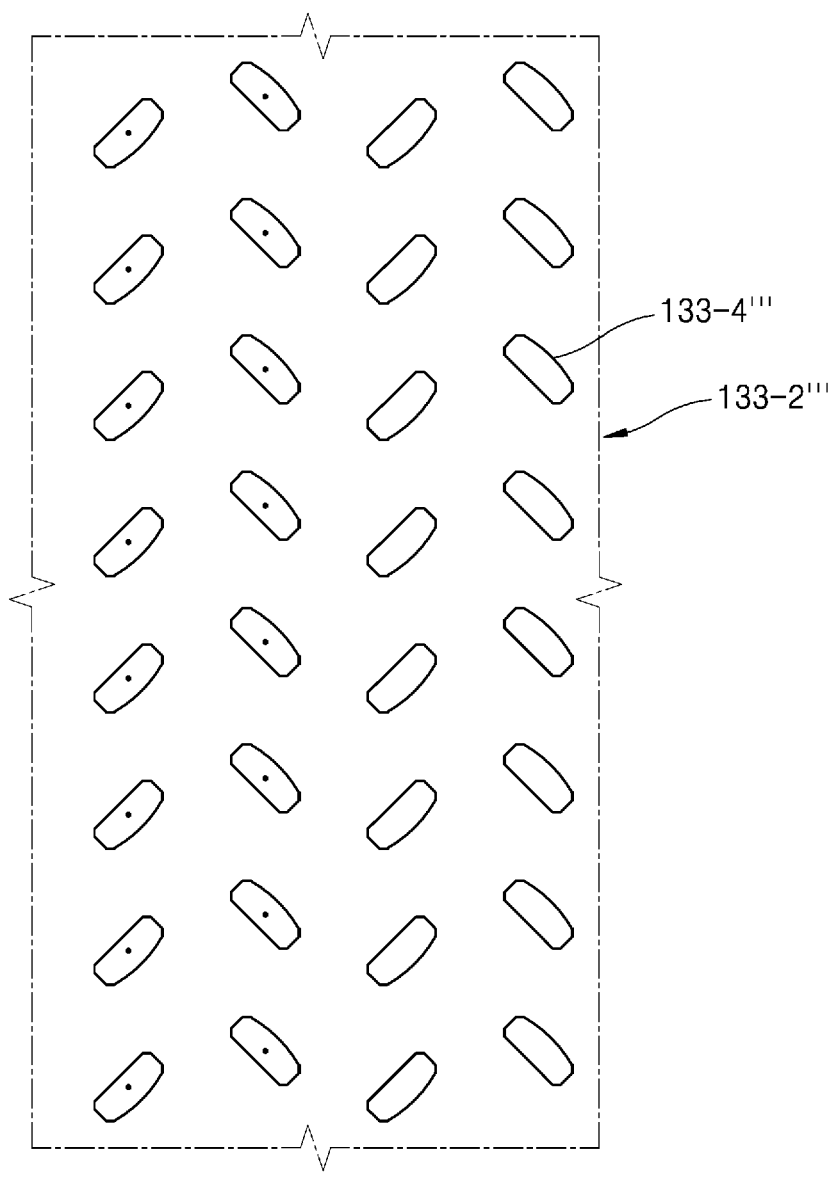
FIG. 37 is a plan view of a portion of a second mask sheet for depositing a second intermediate layer of the second sub-pixel shown in FIG. 35.
Figure 38:
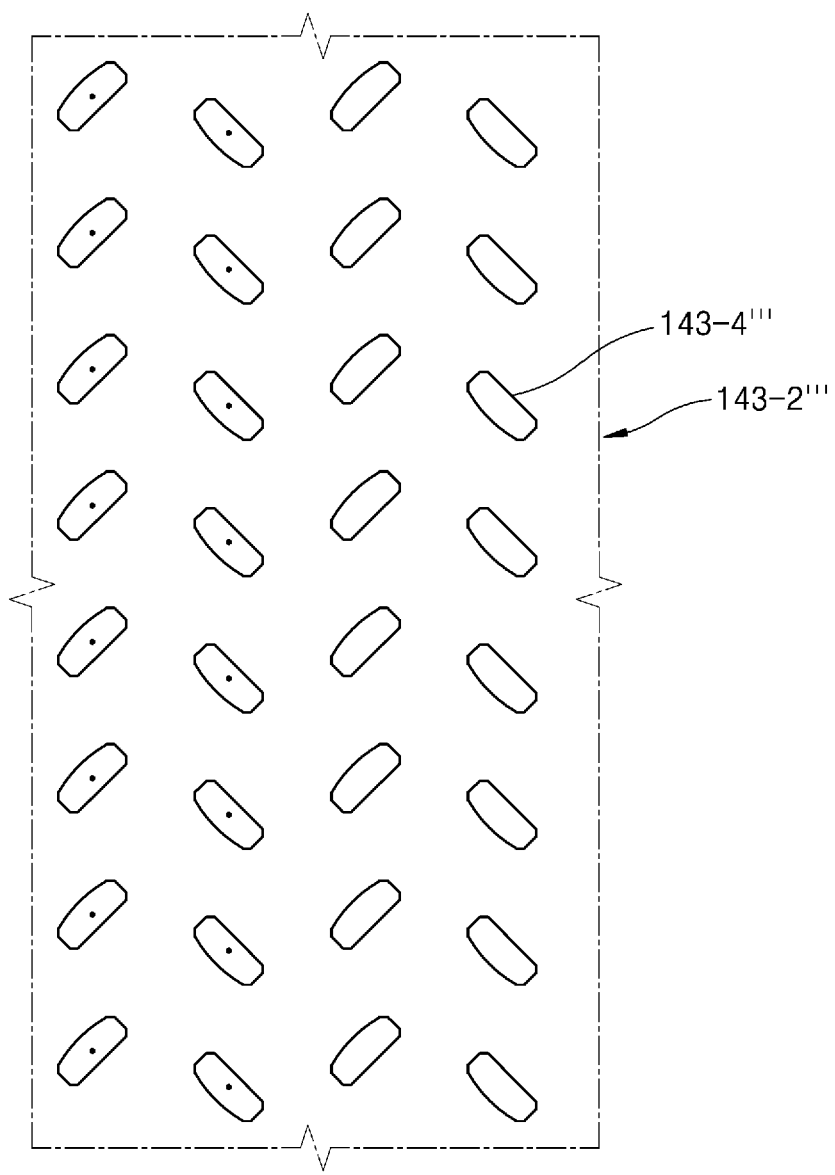
FIG. 38 is a plan view of a portion of a third mask sheet for depositing a third intermediate layer of the third sub-pixel shown in FIG. 35.

FIG. 35 is a plan view illustrating a first sub-pixel, a second sub-pixel, and a third sub-pixel of a display device according to another embodiment. FIG. 36 is a plan view of a portion of a first mask sheet for depositing a first intermediate layer of the first sub-pixel shown in FIG. 35. FIG. 37 is a plan view of a portion of a second mask sheet for depositing a second intermediate layer of the second sub-pixel shown in FIG. 35. FIG. 38 is a plan view of a portion of a third mask sheet for depositing a third intermediate layer of the third sub-pixel shown in FIG. 35.

Referring to FIGS. 35 to 38, a display device may include a display area and a non-display area defined on a substrate, the non-display area being around the display area. A plurality of sub-pixels including a first sub-pixel F1''', a second sub-pixel F1''', and a third sub-pixel F3''' may be arranged in the display area, and a power line may be arranged in the non-display area. In addition, a pad portion may be arranged in the non-display area. The display device may include a display substrate, an intermediate layer arranged in the display area, an opposite electrode, and a thin-film encapsulation layer.

The first sub-pixel F1''', the second sub-pixel F2''', and the third sub-pixel F3''' may emit light of different colors. For example, one selected from the first sub-pixel F1''', the second sub-pixel F2''', and the third sub-pixel F3''' may emit blue light, another one selected from the first sub-pixel F1''', the second sub-pixel F2''', and the third sub-pixel F3''' may emit red light, and the remaining one selected from the first sub-pixel F1''', the second sub-pixel F2''', and the third sub-pixel F3''' may emit green light.

One selected from the first sub-pixel F1''', the second sub-pixel F2''', and the third sub-pixel F3''' may be square, and the other two may be rectangular.

Hereinafter, for convenience of description, a case where the first sub-pixel F1''' is square and is to emit red light, the second sub-pixel F2''' is rectangular and is to emit green light, and the third sub-pixel F3''' is rectangular and is to emit blue light will be mainly described in more detail.

The first sub-pixel F1''' as described above may include a first intermediate layer 28-2A''', and the first intermediate layer 28-2A''' may correspond to the shape and position of the first sub-pixel F1'''. The planar area of the first intermediate layer 28-2A''' may be greater than the planar area of the first sub-pixel F1''', and the first sub-pixel F1''' may be arranged inside the first intermediate layer 28-2A''' (e.g., in the plan view).

The second sub-pixel F2''' may include a second intermediate layer 28-2B'''. In addition, the second intermediate layer 28-2B''' may correspond to the shape and position of the second sub-pixel F2'''. The second sub-pixel F2''' may be arranged inside the second intermediate layer 28-2B'''(e.g., in the plan view).

The third sub-pixel F3''' may include a third intermediate layer 28-2C'''. In addition, the third intermediate layer 28-2C''' may correspond to the shape and position of the third sub-pixel F3'''. The third sub-pixel F3''' may be arranged inside the third intermediate layer 28-2C''' (e.g., in the plan view).

The first subpixel F1''', the second subpixel F2''', and the third subpixel F3''' may have all (e.g., any of) the shapes and arrangements described above. However, hereinafter, for convenience of description, a case where the first sub-pixel F1''', the second sub-pixel F2''', and the third sub-pixel F3''' are arranged in the same arrangement as shown in FIG. 20 will be mainly described in more detail.

At least one selected from the first sub-pixel F1''', the second sub-pixel F2''', and the third sub-pixel F3''' may have a chamfered edge. For example, in an embodiment, one selected from a vertex of the first sub-pixel F1''', a vertex of the second sub-pixel F2''', and a vertex of the third sub-pixel F3''' may be chamfered, and the remaining two of them may not be chamfered. In another embodiment, two selected from the vertex of the first sub-pixel F1''', the vertex of the second sub-pixel F2''', and the vertex of the third sub-pixel F3''' may be chamfered, and the remaining one of them may not be chamfered. In another embodiment, all of the vertex of the first sub-pixel F1''', the vertex of the second sub-pixel F2''', and the vertex of the third sub-pixel F3''' may be chamfered. Hereinafter, for convenience of description, a case where all of the vertex of the first sub-pixel F1''', the vertex of the second sub-pixel F2''', and the vertex of the third sub-pixel F3''' are chamfered will be mainly described in more detail.

In order to form the vertex of the first sub-pixel F1''', the vertex of the second sub-pixel F2''', and the vertex of the third sub-pixel F3''' that are chamfered as described above, a vertex (or corner) of a first opening 123-4''' of a first mask sheet 123-2''', a vertex (or corner) of a second opening 133-4''' of a second mask sheet 133-2''', and a vertex (or corner) of a third opening 143-4''' of a third mask sheet 143-2''' may be chamfered. In this case, each of the first opening 123-4, the second opening 133-4''', and the third opening 143-4''' may be the same as or similar to an octagonal shape. For example, chamfered portions in the first opening 123-4''', the second opening 133-4''', and the third opening 143-4''' may be rounded, and may be formed in a linear shape, as shown in FIGS. 36 to 38.

When the vertex of the first opening 123-4''', the vertex of the second opening 133-4''', and the vertex of the third opening 143-4''' are chamfered as described above, stress may not be concentrated on the vertex of the first opening 123-4''', the vertex of the second opening 133-4''', and the vertex of the third opening 143-4''' when the first mask sheet 123-2''', the second mask sheet 133-2''', and the third mask sheet 143-2''' are respectively under tension. Therefore, when the first mask sheet 123-2''', the second mask sheet 133-2''', and the third mask sheet 143-2''' are respectively under tension, damage to the first mask sheet 123-2''', the second mask sheet 133-2''', and the third mask sheet 143-2''' may be prevented or reduced. In addition, because a first deposition material, a second deposition material, and a third deposition material are not deposited, and do not clog, at the vertex of the first opening 123-4''', the vertex of the second opening 133-4''', and the vertex of the third opening 143-4''', the first intermediate layer 28-2A''', the second intermediate layer 28-2B''', and the third intermediate layer 28-2C''' having correct shapes may be formed.

The display device may be manufactured through a display device manufacturing apparatus of the same or similar type (e.g., kind) as the display device manufacturing apparatus shown in FIGS. 4 and 5 described above.

In this case, a first deposition unit may supply a first deposition material to the display substrate to form the first intermediate layer 28-2A''', a second deposition unit may supply a second deposition material to the display substrate to form the second intermediate layer 28-2B''', and a third deposition unit may supply a third deposition material to the display substrate to form the third intermediate layer 28-2C'''.

In this case, the first mask sheet 123-2''' utilized in the first deposition unit may include the first opening 123-4''' formed to correspond to the shape of the first sub-pixel F1'''. In this case, the planar area of the first opening 123-4''' may be equal to or greater than the planar area of a corresponding first sub-pixel F1'''. Also, the planar area of the first opening 123-4''' may be similar to the planar area of the first intermediate layer 28-2A''' formed by depositing the first deposition material having passed through the first opening 123-4''' on the display substrate. A shape of the first opening 123-4''', a shape of the first intermediate layer 28-2A''', and a shape of the first sub-pixel F1''', which correspond to each other, may be the same and be square (e.g., square with chamfered vertices).

A second opening 133-4''' of a second mask sheet 133-2''' utilized in the second deposition unit may be formed to correspond to the shape of the second sub-pixel F2'''. The second openings 133-4''' may be arranged in the same manner as the arrangement of the second sub-pixels F2'''. In this case, the planar area of the second opening 133-4''' may be similar to the planar area of the second sub-pixel F2''', and may be equal to or greater than the planar area of the second intermediate layer 28-2B''' formed by depositing the second deposition material on the display substrate.

A third opening 143-4''' of a third mask sheet 143-2''' utilized in the third deposition unit is also formed to correspond to the shape of the third sub-pixel F3''', and the planar area of the third opening 143-4''' may be equal to or greater than the planar area of the third sub-pixel F3'''. Furthermore, the planar area of the third opening 143-4''' may be similar to the planar area of the third intermediate layer 28-2C'''.

The planar shape of each opening corresponding to each intermediate layer as described above may be the same as the planar shape of each sub-pixel corresponding to each intermediate layer. In this case, in some embodiments, the size of the planar shape of each opening may be greater than the size of the planar shape of a respective sub-pixel.

In this case, the first sub-pixel F1''', the second sub-pixel F2''' and the third sub-pixel F3''' may be similar to those described with reference to FIG. 20. A relationship among and/or between the first intermediate layer 28-2A''', the second intermediate layer 28-2B''', and the third intermediate layer 28-2C''' may be the same as the relationship among and/or between the first sub-pixel F1''', the second sub-pixel F2''', and the third sub-pixel F3'''.

For example, the centers of some of a plurality of second sub-pixels F2''' may be arranged with each other on a straight line in one direction, and the centers of the other ones of the plurality of second sub-pixels F2''' may be arranged with each other in a serpentine (or zigzag) shape in another direction. Furthermore, the centers of a portion of a plurality of third sub-pixels F3''' may be arranged with each other on a straight line, and the centers of another portion of the plurality of third sub-pixels F3''' may be arranged with each other in a serpentine (or zigzag) shape in another direction. The centers of a plurality of first sub-pixels F1''' may be on (e.g., arranged with each other on) a straight line in a direction different from the one direction. In some embodiments, the centers of a plurality of first sub-pixels F1''' may be arranged with each other on a straight line in the one direction.

In addition, the second sub-pixel F2''' and the third sub-pixel F3''' facing the same first sub-pixel F1''' (e.g., the second sub-pixel F2''' facing one side of the first sub-pixel F1''' and the third sub-pixel F3''' facing another side of the first sub-pixel F1''') may be tilted in opposite directions with respect to a tensile direction of the second mask sheet 133-2''' and a tensile direction of the third mask sheet 143-2'''. For example, the second sub-pixels F2''' adjacent (e.g., adjacent in a direction perpendicular to the tensile direction) to each other may form an angle of 45 degrees with respect to the tensile direction of the second mask sheet 133-2''' in opposite directions, respectively. Also, the second openings 133-4''' formed in the second mask sheet 133-2''' and adjacent (e.g., adjacent in a direction perpendicular to the tensile direction) to each other may form an angle of 45 degrees with respect to the tensile direction of the second mask sheet 133-2'''. The third sub-pixels F3''' adjacent (e.g., adjacent in a direction perpendicular to the tensile direction) to each other may form an angle of 45 degrees with respect to the tensile direction of the third mask sheet 143-2''' in opposite directions, respectively. Also, the third openings 143-4''' formed in the third mask sheet 143-2''' and adjacent (e.g., adjacent in a direction perpendicular to the tensile direction) to each other may form an angle of 45 degrees with respect to the tensile direction of the third mask sheet 143-2'''. The second intermediate layer 28-2B''' and the third intermediate layer 28-2C''' may be arranged on the display substrate at positions corresponding to the second opening 133-4''' and the third opening 143-4''', respectively.

In the above case, spacers may be arranged between each two sub-pixels. In this case, each side of the edge of the planar shape of each of the spacers may have a shape corresponding to the shape of each side (e.g., a side facing the spacer) of the planar shape of a sub-pixel adjacent to the spacer.

The display device may be fixed to a device or the like for moving a user, such as a vehicle. The display device may be fixed to the device to form a certain angle different from 0 degrees between a user's viewing direction and the first direction and/or the second direction. For example, the display device may be arranged such that the user's viewing direction of the display device and the first direction or the second direction form an angle of 90 degrees.

In the above case, when a user looks at the display device, an inclined portion of the pixel-defining layer is not perpendicular to the user's viewing direction. Accordingly, external light may be prevented from being reflected through (e.g., from) the inclined portion of the pixel-defining layer and being incident on the user's eyes, or the amount of external light reflected through the inclined portion of the pixel-defining layer may be reduced.

Further, the display device may implement a precise image through each sub-pixel.

According to the display device manufacturing apparatus and the display device manufacturing method, it is possible to manufacture the display device having an accurate deposition pattern.

Furthermore, according to the display device manufacturing apparatus and the display device manufacturing method, it is possible to reduce an error between a design pattern and an actual deposition pattern that may occur during manufacturing.

Figure 39:
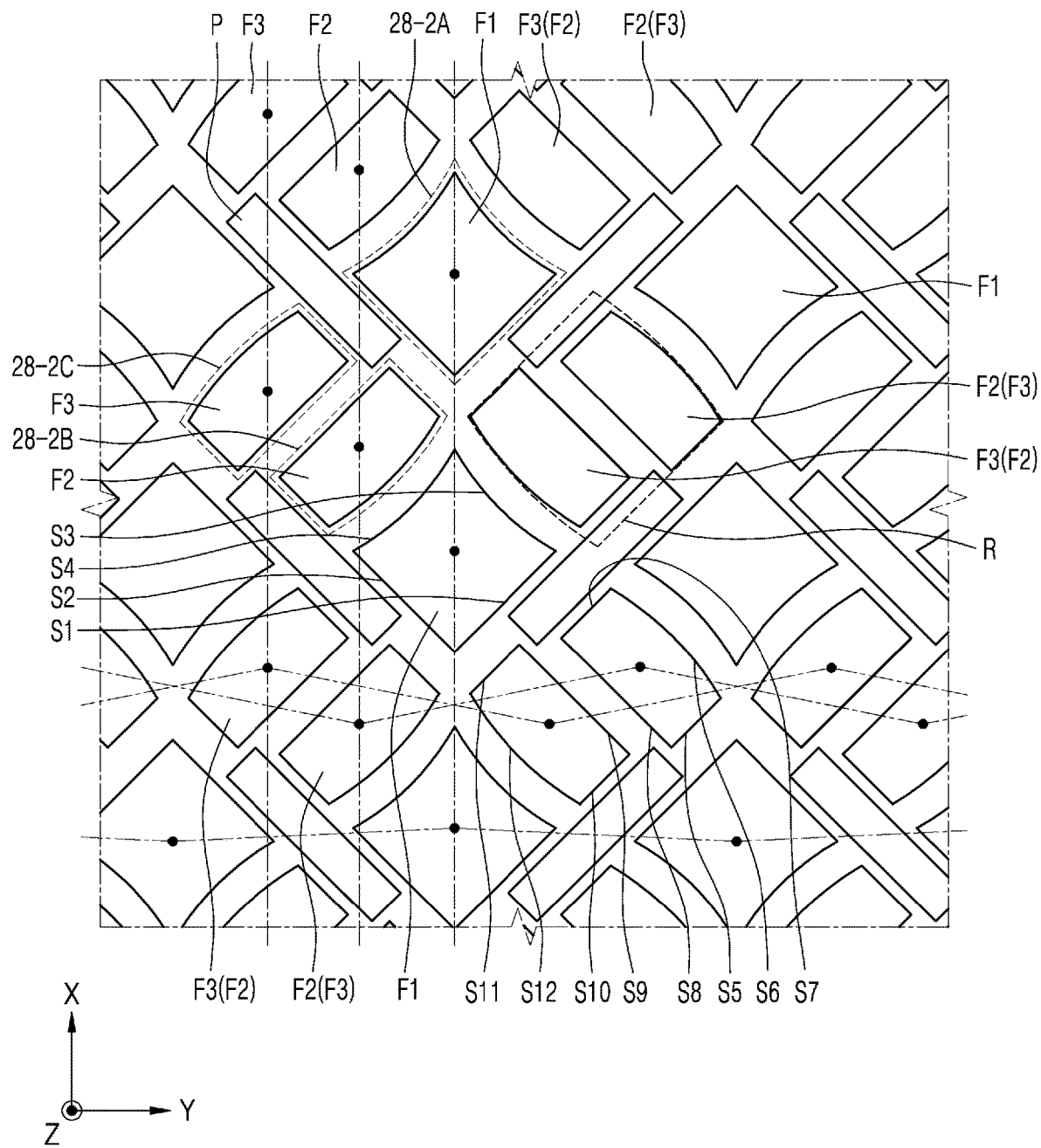
FIG. 39 is a plan view illustrating a first sub-pixel, a second sub-pixel, and a third sub-pixel of a display device according to another embodiment.

FIG. 39 is a plan view illustrating a first sub-pixel, a second sub-pixel, and a third sub-pixel of a display device according to another embodiment.

Referring to FIG. 39, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light. In this case, the plurality of sub-pixels may be arranged in the same manner as or similar to those shown in FIG. 2.

A spacer P may be arranged between the plurality of sub-pixels as described above. In this case, the position of the spacer P is not limited to that shown in FIG. 39 and may be arranged between sub-pixels adjacent to each other in any suitable manner. The edge of the planar shape of the spacer P may be determined according to (e.g., may correspond to) one side of the planar shape of a sub-pixel adjacent to the spacer P.

In the above case, in at least one selected from the first sub-pixel F1, the second sub-pixel F2, and the third sub-pixel F3, at least one side of the edge of the planar shape thereof may have a curved shape. In this case, in the at least one selected from the first sub-pixel F1, the second sub-pixel F2, and the third sub-pixel F3, at least one side of the edge of the planar shape thereof may have a concave shape or a convex shape.

In the above case, the first side S1 and the second side S2 of the first sub-pixel F1 may each have a linear shape, and the third side S3 and the fourth side S4 may each have a concave curved shape. Furthermore, the sixth side S6 of the second sub-pixel F2 may each be convex curved, and the fifth side S5, the seventh side S7, and the eighth side S8 may each be straight. The twelfth side S12 of the third sub-pixel F3 may have a convex curved shape, and the ninth side S9, the tenth side S10, and the eleventh side S11 may each have a linear shape. The planar shape of each sub-pixel as described above is not limited thereto, and may include all cases (e.g., any suitable planar shape) in which at least one side of the planar shape of the sub-pixel is formed in a curved shape.

When each sub-pixel is arranged as described above, a sub-pixel including a protruding curve from among the sub-pixels may have an increased area in the pixel area AR compared to a sub-pixel in which the edge of the planar shape thereof is straight. In this case, the life of the sub-pixel having an increased area may increase. In addition, the sub-pixel including a curve may disperse external light, and thus may reduce glare (e.g., glare seen by a user) due to external light.

In the above case, the planar shape of the first intermediate layer 28-2A, the planar shape of the second intermediate layer 28-2B, and the planar shape of the third intermediate layer 28-2C may correspond to the planar shape of the first sub-pixel F1, the planar shape of the second sub-pixel F2, and the planar shape of the third sub-pixel F3, respectively.

Figure 40:
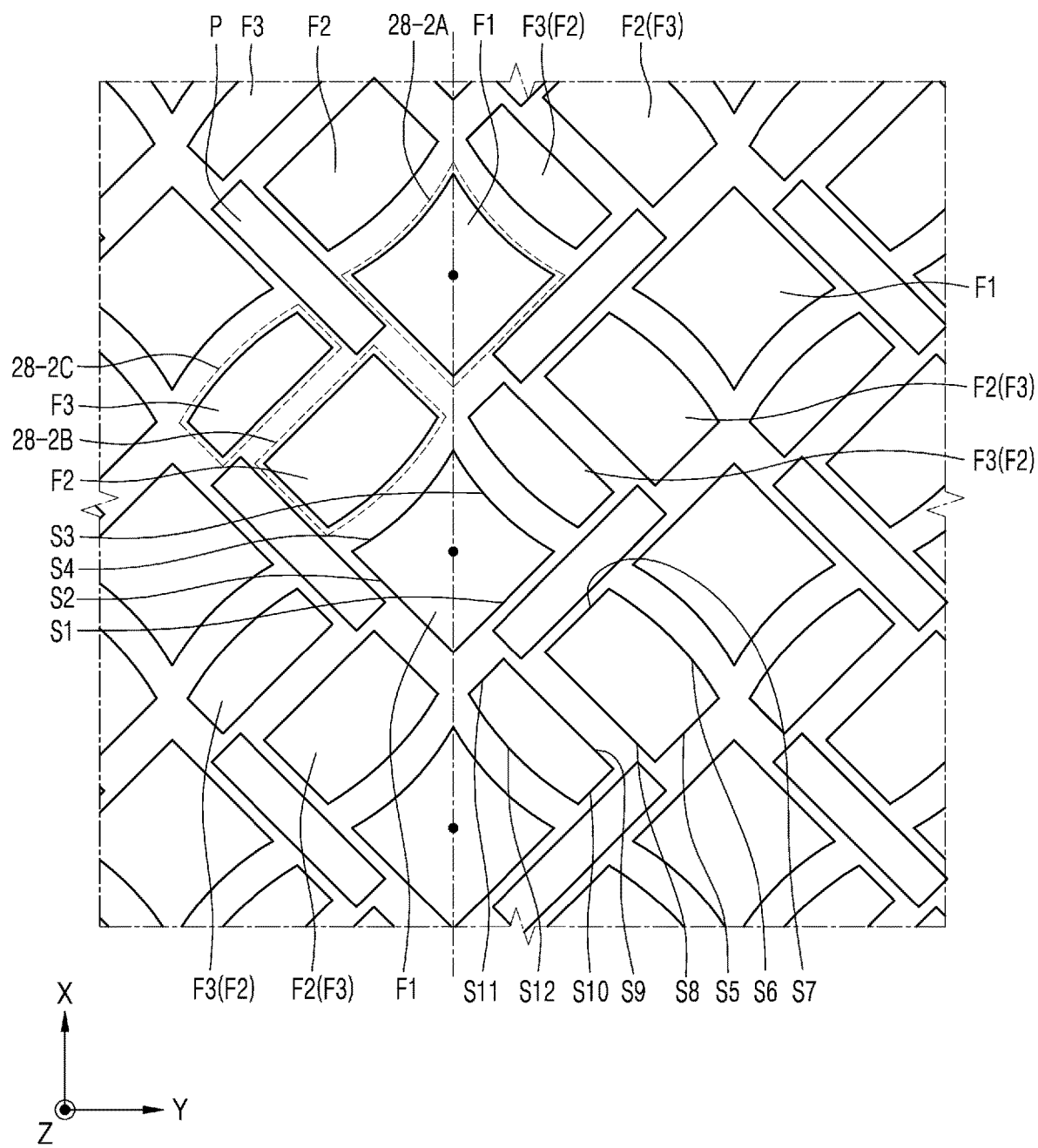
FIG. 40 is a plan view illustrating a first sub-pixel, a second sub-pixel, and a third sub-pixel of a display device according to another embodiment.

FIG. 40 is a plan view illustrating a first sub-pixel, a second sub-pixel, and a third sub-pixel of a display device according to another embodiment.

Referring to FIG. 40, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light. In this case, the plurality of sub-pixels may be arranged in the same manner as or similar to those shown in FIG. 10.

A spacer P may be arranged between the plurality of sub-pixels as described above. In this case, the position of the spacer P is not limited to that shown in FIG. 40 and may be arranged in any suitable manner between sub-pixels adjacent to each other. The edge of the planar shape of the spacer P may be determined according to (e.g., may correspond to) one side (e.g., a side facing the spacer P) of the planar shape of a sub-pixel adjacent to the spacer P.

In the above case, in at least one selected from the first sub-pixel F1, the second sub-pixel F2, and the third sub-pixel F3, at least one side of the edge of the planar shape thereof may have a curved shape. In this case, in the at least one selected from the first sub-pixel F1, the second sub-pixel F2, and the third sub-pixel F3, at least one side of the edge of the planar shape thereof may have a concave shape or a convex shape.

In the above case, the first side S1 and the second side S2 of the first sub-pixel F1 may each have a linear shape, and the third side S3 and the fourth side S4 may each have a concave curved shape. Furthermore, the sixth side S6 of the second sub-pixel F2 may be convex curved, and the fifth side S5, the seventh side S7, and the eighth side S8 may each be straight. The twelfth side S12 of the third sub-pixel F3 may have a convex curved shape, and the ninth side S9, the tenth side S10, and the eleventh side S11 may each have a linear shape. The planar shape of each sub-pixel as described above is not limited thereto, and may include all cases (e.g., any suitable planar shape) in which at least one side of the planar shape of each sub-pixel is formed in a curved shape.

When each sub-pixel is arranged as described above, a sub-pixel having a protruding curve from among the sub-pixels may have an increased area in the pixel area AR compared to a sub-pixel in which the edge of the planar shape thereof is straight. In this case, the life of the sub-pixel having an increased area may increase. In addition, the sub-pixel having a curve may disperse external light, and thus may reduce glare due to external light.

In the above case, the planar shape of the first intermediate layer 28-2A, the planar shape of the second intermediate layer 28-2B, and the planar shape of the third intermediate layer 28-2C may correspond to the planar shape of the first sub-pixel F1, the planar shape of the second sub-pixel F2, and the planar shape of the third sub-pixel F3, respectively.

Figure 41:
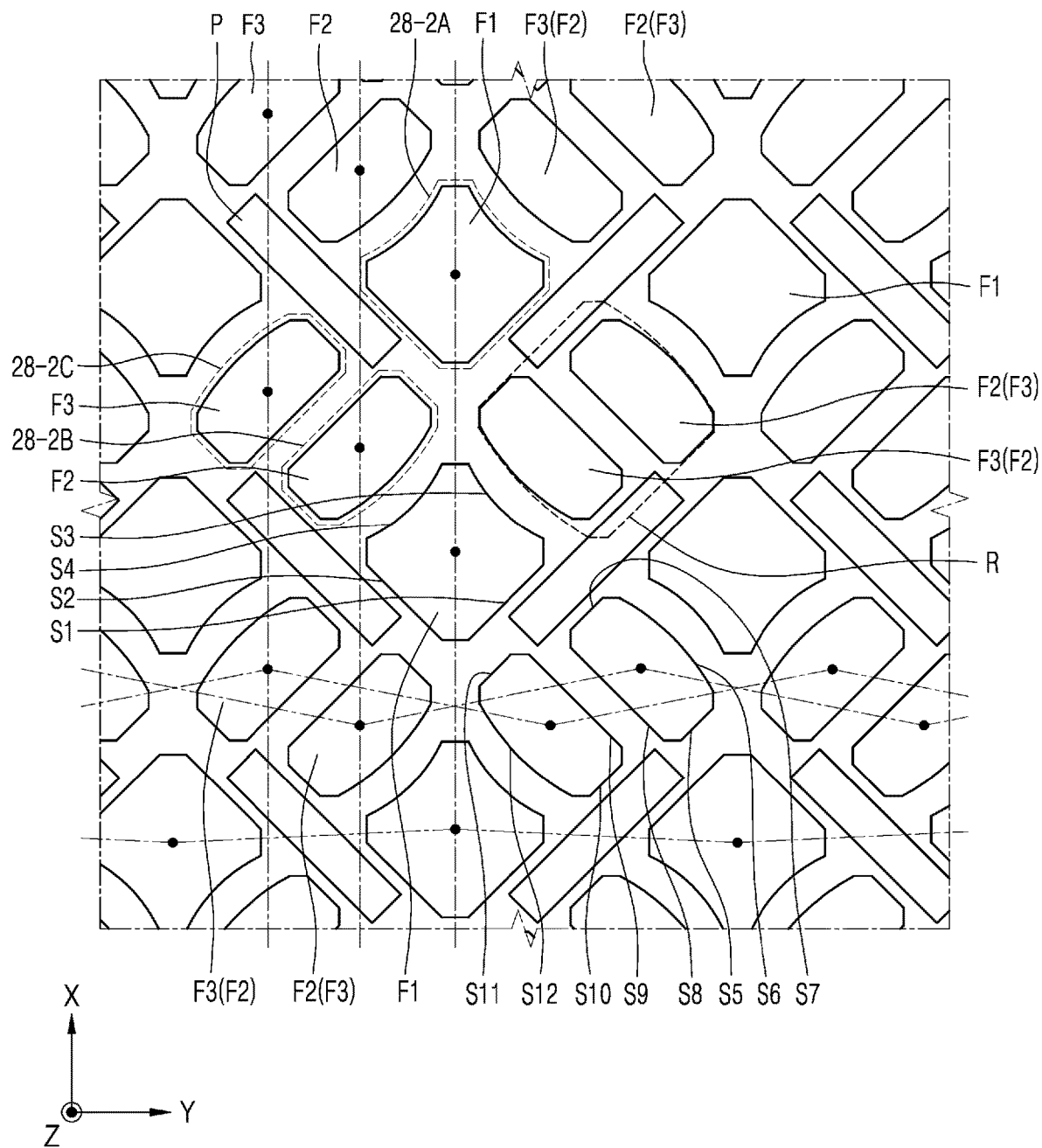
FIG. 41 is a plan view illustrating a first sub-pixel, a second sub-pixel, and a third sub-pixel of a display device according to another embodiment.

FIG. 41 is a plan view illustrating a first sub-pixel, a second sub-pixel, and a third sub-pixel of a display device according to another embodiment.

Referring to FIG. 41, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light. In this case, the plurality of sub-pixels may be arranged in the same manner as or similar to those shown in FIG. 39. However, in FIG. 41, a chamfered portion of a corner portion of each sub-pixel may be different from that in FIG. 39.

A spacer P may be arranged between the plurality of sub-pixels as described above. In this case, the position of the spacer P is not limited to that shown in FIG. 41 and may be arranged in any suitable manner between sub-pixels adjacent to each other. The edge of the planar shape of the spacer P may be determined according to (e.g., may correspond to) one side (e.g., a side facing the spacer) of the planar shape of a sub-pixel adjacent to the spacer P.

In the above case, in at least one selected from the first sub-pixel F1, the second sub-pixel F2, and the third sub-pixel F3, at least one side of the edge of the planar shape thereof may have a curved shape. In this case, in the at least one selected from the first sub-pixel F1, the second sub-pixel F2, and the third sub-pixel F3, at least one side of the edge of the planar shape thereof may have a concave shape or a convex shape.

In the above case, the first side S1 and the second side S2 of the first sub-pixel F1 may each have a linear shape, and the third side S3 and the fourth side S4 may each have a concave curved shape. Furthermore, the sixth side S6 of the second sub-pixel F2 may be convex curved, and the fifth side S5, the seventh side S7, and the eighth side S8 may each be straight. The twelfth side S12 of the third sub-pixel F3 may have a convex curved shape, and the ninth side S9, the tenth side S10, and the eleventh side S11 may each have a linear shape. The planar shape of each sub-pixel as described above is not limited thereto, and may include all cases (e.g., any suitable planar shape) in which at least one side of the planar shape of the sub-pixel is formed in a curved shape.

When each sub-pixel is arranged as described above, a sub-pixel including a protruding curve from among the sub-pixels may have an increased area in the pixel area AR compared to a sub-pixel in which the edge of the planar shape thereof is straight. In this case, the life of the sub-pixel having an increased area may increase. In addition, the sub-pixel including a curve may disperse external light, and thus may reduce glare due to external light.

In the above case, the planar shape of the first intermediate layer 28-2A, the planar shape of the second intermediate layer 28-2B, and the planar shape of the third intermediate layer 28-2C may correspond to the planar shape of the first sub-pixel F1, the planar shape of the second sub-pixel F2, and the planar shape of the third sub-pixel F3, respectively.

Figure 42:
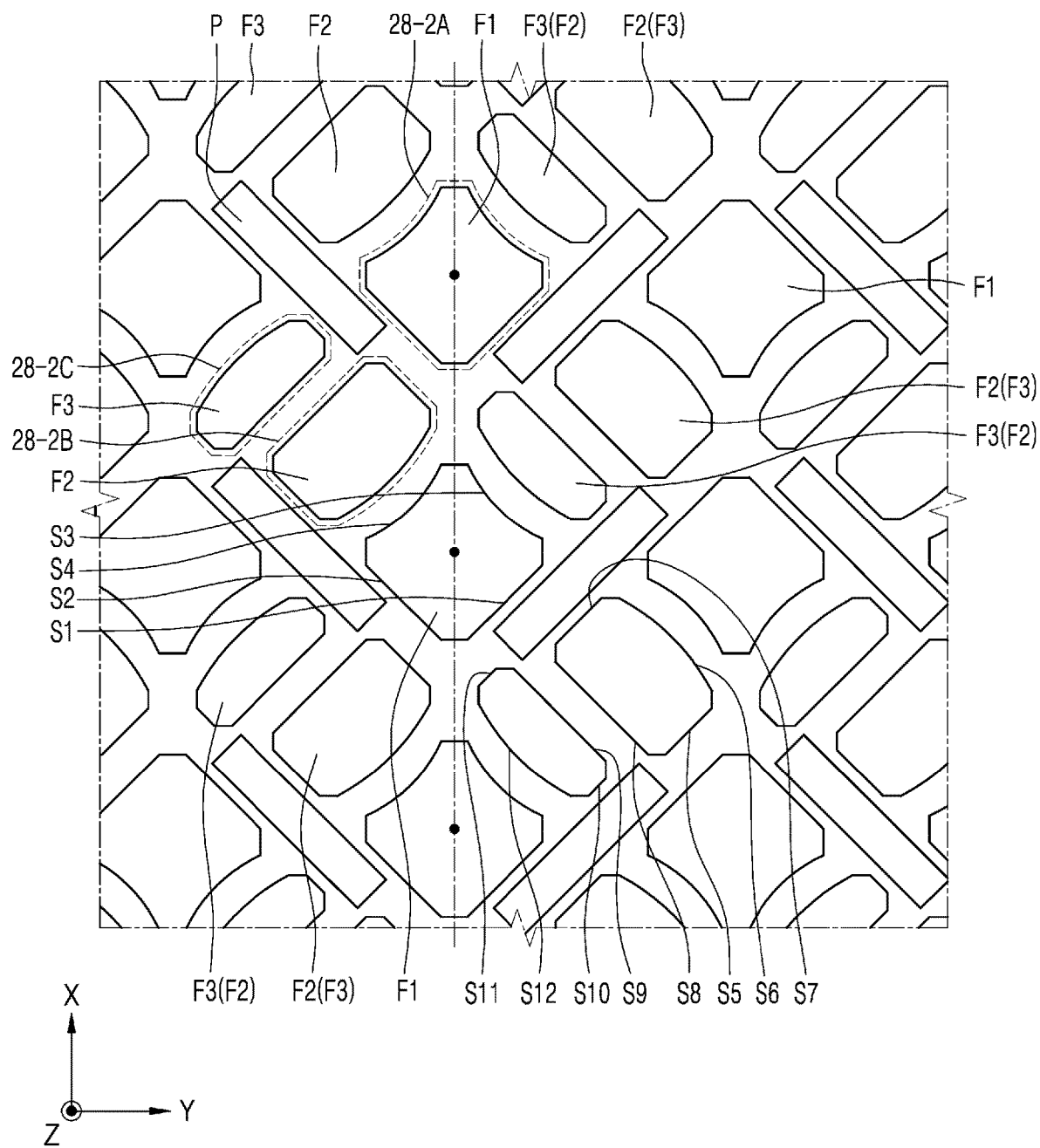
FIG. 42 is a plan view illustrating a first sub-pixel, a second sub-pixel, and a third sub-pixel of a display device according to another embodiment.

FIG. 42 is a plan view illustrating a first sub-pixel, a second sub-pixel, and a third sub-pixel of a display device according to another embodiment.

Referring to FIG. 42, a plurality of sub-pixels may be arranged to be spaced apart from each other in a display area of the display device. In this case, the plurality of sub-pixels may include a first sub-pixel F1, a second sub-pixel F2, and a third sub-pixel F3. One selected from the first sub-pixel F1, the second sub-pixel F2, and the third sub-pixel F3 may emit one selected from blue light, red light, and green light, and another one selected from the first sub-pixel F1, the second sub-pixel F2, and the third sub-pixel F3 may emit another one selected from blue light, red light, and green light. The remaining one selected from the first sub-pixel F1, the second sub-pixel F2, and the third sub-pixel F3 may emit the remaining one selected from blue light, red light, and green light. In this case, the plurality of sub-pixels may be arranged in the same manner as or similar to those shown in FIG. 40. However, each sub-pixel shown in FIG. 42 may have a shape obtained by chamfering a corner portion of the sub-pixel shown in FIG. 40.

A spacer P may be arranged between the plurality of sub-pixels as described above. In this case, the position of the spacer P is not limited to that shown in FIG. 42 and may be arranged in any suitable manner between sub-pixels adjacent to each other. The edge of the planar shape of the spacer P may be determined according to (e.g., may correspond to) one side (e.g., a side facing the spacer P) of the planar shape of a sub-pixel adjacent to the spacer P.

In the above case, in at least one selected from the first sub-pixel F1, the second sub-pixel F2, and the third sub-pixel F3, at least one side of the edge of the planar shape thereof may have a curved shape. In this case, in the at least one selected from the first sub-pixel F1, the second sub-pixel F2, and the third sub-pixel F3, at least one side of the edge of the planar shape thereof may have a concave shape or a convex shape.

In the above case, the first side S1 and the second side S2 of the first sub-pixel F1 may each have a linear shape, and the third side S3 and the fourth side S4 may each have a concave curved shape. Furthermore, the sixth side S6 of the second sub-pixel F2 may be convex curved, and the fifth side S5, the seventh side S7, and the eighth side S8 may each be straight. The twelfth side S12 of the third sub-pixel F3 may have a convex curved shape, and the ninth side S9, the tenth side S10, and the eleventh side S11 may each have a linear shape. The planar shape of each sub-pixel as described above is not limited thereto, and may include all cases (e.g., any suitable planar shape) in which at least one side of the planar shape of each sub-pixel is formed in a curved shape.

When each sub-pixel is arranged as described above, a sub-pixel including a protruding curve from among the sub-pixels may have an increased area in the pixel area AR compared to a sub-pixel in which the edge of the planar shape thereof is straight. In this case, the life of the sub-pixel having an increased area may increase. In addition, the sub-pixel including a curve may disperse external light, and thus may reduce glare due to external light.

In the above case, the planar shape of the first intermediate layer 28-2A, the planar shape of the second intermediate layer 28-2B, and the planar shape of the third intermediate layer 28-2C may correspond to the planar shape of the first sub-pixel F1, the planar shape of the second sub-pixel F2, and the planar shape of the third sub-pixel F3, respectively.

In relation to the above, embodiments of the arrangement of each sub-pixel and the edge of the planar shape of each sub-pixel are not limited to the above cases, and may include all forms (e.g., all suitable arrangements and planar shapes) in which, as each sub-pixel has a polygonal shape with corners and a protruding portion with respect to a straight line connecting corners adjacent to each other (e.g., corners at ends of the protruding portion, for example, a protruding side), the planar area of each sub-pixel is further increased as compared to a case where each sub-pixel is formed in a polygonal shape (e.g., a polygonal shape without a protruding portion).

The display device according to embodiments may prevent or reduce glare by reducing external light reflection. The display device manufacturing apparatus according to embodiments may form various suitable layers on a display substrate through chambers arranged in an in-line form.

Furthermore, the mask assembly and the display device manufacturing apparatus according to embodiments may simplify a process and reduce a process time.

It should be understood that embodiments described herein should be considered in a descriptive sense only and not for purposes of limitation. Descriptions of features and/or aspects within each embodiment should typically be considered as available for other similar features and/or aspects in other embodiments. While one or more embodiments have been described with reference to the drawings, it will be understood by those of ordinary skill in the art that various suitable changes in form and details may be made without departing from the spirit and scope as defined by the following claims and equivalents thereof.

What is claimed is:

1. A display device comprising:
 a first sub-pixel having a quadrangular shape;
 a second sub-pixel arranged to face a side of the first sub-pixel, the second sub-pixel having a quadrangular shape; and
 a third sub-pixel arranged to face a side of the first sub-pixel and spaced apart from the second sub-pixel, the third sub-pixel having a quadrangular shape,
 wherein a distance from the second sub-pixel to the side of the first sub-pixel that the second sub-pixel faces and a distance from the third sub-pixel to the side of the first sub-pixel that the third sub-pixel faces are different from each other, and
 wherein:
  a plurality of first sub-pixels, comprising the first sub-pixel, are provided, and centers of a first set of the plurality of first sub-pixels are arranged with each other on a straight line in a first direction and centers of a second set of the plurality of first sub-pixels are arranged with each other in a serpentine shape in a second direction; and/or
  a plurality of first sub-pixels, comprising the first sub-pixel, are provided and arranged with each other in a first direction, and the second sub-pixel facing a first side of the first sub-pixel and another second sub-pixel and/or the third sub-pixel, which face a second side of the first sub-pixel, are arranged to be symmetrical to each other with respect to a straight line connecting centers of the plurality of first sub-pixels arranged with each other in the first direction; and/or
  the display device further comprises a spacer arranged between the first sub-pixel and the second sub-pixel and/or between the first sub-pixel and the third sub-pixel, and a shortest distance from the second sub-pixel to the spacer is equal to a shortest distance from the third sub-pixel to the spacer; and/or a plurality of first sub-pixels, comprising the first sub-pixel, are provided and arranged with each other in a first direction, a long side of the second sub-pixel and/or a long side of the third sub-pixel forms an angle of 45 degrees with respect to a straight line connecting centers of the plurality of first sub-pixels arranged with each other in the first direction.

2. The display device of claim 1, wherein at least one selected from at least a portion of the second sub-pixel and at least a portion of the third sub-pixel is arranged within a length range of a side of the first sub-pixel.

3. The display device of claim 1, wherein a short side of the second sub-pixel is parallel to the side of the first sub-pixel that the second sub-pixel faces.

4. The display device of claim 1, wherein a short side of the third sub-pixel is parallel to the side of the first sub-pixel that the third sub-pixel faces.

5. The display device of claim 1, wherein the plurality of first sub-pixels, comprising the first sub-pixel, are provided, and the centers of the first set of the plurality of first sub-pixels are arranged with each other on the straight line in the first direction and the centers of the second set of the plurality of first sub-pixels are arranged with each other in the serpentine shape in the second direction.

6. The display device of claim 5, wherein each of the plurality of first sub-pixels is to emit green light.

7. The display device of claim 5, wherein the first direction is a direction parallel to a long side of the display device.

8. The display device of claim 1, wherein a plurality of second sub-pixels, comprising the second sub-pixel, are provided, and a plurality of third sub-pixels, comprising the third sub-pixel, are provided, and
wherein centers of some of the plurality of second sub-pixels and/or some of the plurality of third sub-pixels are arranged with each other on a straight line.

9. The display device of claim 1, wherein a plurality of second sub-pixels, comprising the second sub-pixel, are provided, and a plurality of third sub-pixels, comprising the third sub-pixel, are provided, and
wherein centers of some of the plurality of second sub-pixels and/or some of the plurality of third sub-pixels are arranged with each other in a serpentine shape along one direction.

10. The display device of claim 1, wherein the plurality of first sub-pixels, comprising the first sub-pixel, are provided and arranged with each other in the first direction, and
wherein the second sub-pixel facing the first side of the first sub-pixel and the another second sub-pixel and/or the third sub-pixel, which face the second side of the first sub-pixel, are arranged to be symmetrical to each other with respect to the straight line connecting the centers of the plurality of first sub-pixels arranged with each other in the first direction.

11. The display device of claim 1, wherein a length of a long side of the second sub-pixel and a length of a long side of the third sub-pixel are equal to each other.

12. The display device of claim 1, further comprising the spacer arranged between the first sub-pixel and the second sub-pixel and/or between the first sub-pixel and the third sub-pixel.

13. The display device of claim 12, wherein the shortest distance from the second sub-pixel to the spacer is equal to the shortest distance from the third sub-pixel to the spacer.

14. The display device of claim 1, wherein a short side of the second sub-pixel and/or a short side of the third sub-pixel overlaps an extension line of a side of the first sub-pixel and is arranged on a straight line extending from a side of the first sub-pixel.

15. The display device of claim 1, wherein the plurality of first sub-pixels, comprising the first sub-pixel, are provided and arranged with each other in the first direction,
wherein the long side of the second sub-pixel and/or the long side of the third sub-pixel forms the angle of 45 degrees with respect to the straight line connecting the centers of the plurality of first sub-pixels arranged with each other in the first direction.

16. The display device of claim 1, wherein an area of the first sub-pixel is greater than at least one selected from an area of the second sub-pixel and an area of the third sub-pixel.

17. The display device of claim 1, wherein an area of the second sub-pixel and an area of the third sub-pixel are different from each other.

18. The display device of claim 1, wherein an outline connecting a portion of an edge of the second sub-pixel to a portion of an edge of the third sub-pixel is square.

19. The display device of claim 1, wherein a vertex of at least one selected from the first sub-pixel, the second sub-pixel, and the third sub-pixel is chamfered.

20. The display device of claim 1, wherein the first sub-pixel is to emit one selected from blue light, green light, and red light, the second sub-pixel is to emit another one selected from blue light, green light, and red light, and the third sub-pixel is to emit the remaining one selected from blue light, green light, and red light.

21. A display device comprising:
a plurality of first intermediate layers having quadrangular shapes and spaced apart from each other;
a plurality of second intermediate layers having quadrangular shapes and spaced apart from each other, the plurality of second intermediate layers facing the plurality of first intermediate layers, respectively; and
a plurality of third intermediate layers having quadrangular shapes and spaced apart from each other, the plurality of third intermediate layers facing the plurality of first intermediate layers, respectively, and being spaced apart from the plurality of second intermediate layers,
wherein a distance from a side of each of the first intermediate layers to a respective one of the second intermediate layers and a distance from a side of each of the first intermediate layers to a respective one of the third intermediate layers are different from each other, and
wherein:
centers of a first set of the plurality of first intermediate layers are arranged with each other on a straight line in a first direction and centers of a second set of the plurality of first intermediate layers are arranged with each other in a serpentine shape in a second direction; and/or
the plurality of first intermediate layers arranged with each other in a first direction, and the second intermediate layer facing a first side of the first intermediate layer and another second intermediate layer and/or the third intermediate layer, which face a second side of the first intermediate layer, are arranged to be symmetrical to each other with respect to a straight line connecting centers of the plurality of first intermediate layers arranged with each other in the first direction; and/or the display device further comprises a spacer arranged between the first intermediate layer and the second intermediate layer and/or between the first intermediate layer and the third intermediate layer, and a shortest distance from the second intermediate layer to the spacer is equal to a shortest distance from the third intermediate layer to the spacer; and/or the plurality of first intermediate layer are arranged with each other in a first direction, a long side of the second intermediate layer and/or a long side of the third intermediate layer forms an angle of 45 degrees with respect to a straight line connecting centers of the plurality of first intermediate layers arranged with each other in the first direction.

22. The display device of claim 21, wherein each of the first intermediate layers, a respective one of the second intermediate layers, and a respective one of the third intermediate layers comprise materials that are to emit light of different colors when power is applied thereto.

23. The display device of claim 21, wherein each of the second intermediate layers and a respective one of the third intermediate layers are arranged in parallel with each other.

24. The display device of claim 21, wherein at least one selected from centers of some of the plurality of second intermediate layers and centers of some of the plurality of third intermediate layers are arranged with each other on a straight line.

25. The display device of claim 21, wherein a length of a long side of each of the second intermediate layers and a length of a long side of a respective one of the third intermediate layers are equal to each other.

26. The display device of claim 21, further comprising the spacer arranged between each of the first intermediate layers and a respective one of the second intermediate layers and/or between each of the first intermediate layers and a respective one the third intermediate layers.

27. The display device of claim 21, wherein shortest distances between second intermediate layers, which face a same first intermediate layer of the first intermediate layers, from among the plurality of second intermediate layers, and the same first intermediate layer, or shortest distances between third intermediate layers, which face a same first intermediate layer of the first intermediate layers, from among the plurality of third intermediate layers, and the same first intermediate layer are different from each other.

28. A display device comprising:
a first sub-pixel;
a plurality of second sub-pixels comprising a second sub-pixel, the second sub-pixel being arranged to face the first sub-pixel;
a plurality of third sub-pixels comprising a third sub-pixel, the third sub-pixel being arranged to face the first sub-pixel and spaced apart from the second sub-pixel; and
a spacer arranged between the first sub-pixel and the second sub-pixel and/or between the first sub-pixel and the third sub-pixel,
wherein a distance from a side of the first sub-pixel facing the second sub-pixel and the third sub-pixel to the second sub-pixel is different from a distance from the side of the first sub-pixel to the third sub-pixel, and
wherein a plurality of first sub-pixels, comprising the first sub-pixel, are provided and arranged with each other in a first direction, a side of the second sub-pixel and/or a side of the third sub-pixel tilts with respect to a straight line connecting centers of at least three first sub-pixels of the plurality of first sub-pixels, comprising the first sub-pixel, arranged with each other in the first direction and being entirely spaced apart from the plurality of second sub-pixels and the plurality of third sub-pixels.

29. The display device of claim 28, wherein an area of the second sub-pixel is equal to an area of the third sub-pixel.

30. The display device of claim 28, wherein an area of the second sub-pixel is different from an area of the third sub-pixel.

31. The display device of claim 28, wherein the second sub-pixel and the third sub-pixel are each rectangular, and
wherein a length of a long side of the second sub-pixel and a length of a long side of the third sub-pixel are equal to each other.

32. The display device of claim 28, wherein a shortest distance between at least one selected from the second sub-pixel and the third sub-pixel and an edge of the spacer is equal to a shortest distance between the first sub-pixel and an edge of the spacer.

33. The display device of claim 28, wherein the second sub-pixel and the third sub-pixel are each rectangular, and
wherein a distance between the first sub-pixel and a long side of the second sub-pixel facing each other, a distance between a long side of the second sub-pixel and a long side of the third sub-pixel facing each other, and a distance between a long side of the third sub-pixel and a long side of another first sub-pixel facing each other are all equal to one another.

34. A display device comprising:
a first sub-pixel;
a second sub-pixel arranged to face a side of the first sub-pixel; and
a third sub-pixel arranged to face the side of the first sub-pixel and spaced apart from the second sub-pixel,
wherein a side of at least one selected from the first sub-pixel, the second sub-pixel, and the third sub-pixel is convex or concave,
the second sub-pixel and the third sub-pixel are adjacent to each other and are arranged to face the same side of the first sub-pixel,
a plurality of first sub-pixels, comprising the first sub-pixel, are provided, and
a tangent line to a point on one convex or concave side of the first sub-pixel crosses a branch line at an angle in a range of about 20 degrees to about 70 degrees, the branch line passing through or being parallel to a line passing through centers of first sub-pixels arranged with each other in a first direction from among the plurality of first sub-pixels.

35. The display device of claim 34, wherein a side of the second sub-pixel and a side of the third sub-pixel, which face each other, are straight.

36. The display device of claim 34, wherein at least one selected from a side of the second sub-pixel and a side of the third sub-pixel, which face each other, protrudes from a respective center of at least one selected from the second sub-pixel and the third sub-pixel.

37. The display device of claim 34, wherein at least one selected from a distance between one side of the first sub-pixel and one side of the second sub-pixel facing each other, a distance between one side of the second sub-pixel and one side of the third sub-pixel facing each other, and a distance between one side of the first sub-pixel and one side of the third sub-pixel facing each other is constant along a length direction of each side.

38. The display device of claim 34, wherein one side selected from one side of the first sub-pixel, one side of the second sub-pixel, and one side of the third sub-pixel is convex, and wherein another one side selected from the one side of the first sub-pixel, the one side of the second sub-pixel, and the one side of the third sub-pixel is concave, the other one side facing the one side selected from the one side of the first sub-pixel, the one side of the second sub-pixel, and the one side of the third sub-pixel.

39. The display device of claim 34, wherein at least one selected from the second sub-pixel and the third sub-pixel has a long side and a short side, and the long side is convex or concave.

40. The display device of claim 34, wherein a corner of at least one selected from the first sub-pixel, the second sub-pixel, and the third sub-pixel is chamfered.

41. The display device of claim 34, wherein a planar area of one selected from the first sub-pixel, the second sub-pixel, and the third sub-pixel is different from a planar area of another one selected from the first sub-pixel, the second sub-pixel, and the third sub-pixel.

42. The display device of claim 34, wherein a side of at least one selected from the first sub-pixel, the second sub-pixel, and the third sub-pixel is curved.

43. The display device of claim 34, wherein at least one selected from the first sub-pixel, the second sub-pixel, and the third sub-pixel is arranged to be tilted in one direction.

44. The display device of claim 28, wherein a shortest distance from an edge of the spacer to the second sub-pixel and a shortest distance from the edge of the spacer to the third sub-pixel are equal to each other.

45. The display device of claim 28, wherein one of the at least three first sub-pixels is adjacent to each of two others of the at least three sub-pixels from among the sub-pixels of the display device, and wherein the second sub-pixel and the third sub-pixel are each adjacent to the first sub-pixel from among the sub-pixels of the display device.

* * * * *